(12) United States Patent
Chen

(10) Patent No.: US 9,811,630 B2
(45) Date of Patent: Nov. 7, 2017

(54) MULTILEVEL FORCE BALANCED DOWNHOLE DRILLING TOOLS AND METHODS

(71) Applicant: Halliburton Energy Services, Inc., Houston, TX (US)

(72) Inventor: Shilin Chen, Montgomery, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/429,315

(22) Filed: Feb. 10, 2017

(65) Prior Publication Data

US 2017/0154149 A1    Jun. 1, 2017

Related U.S. Application Data

(60) Division of application No. 14/554,836, filed on Nov. 26, 2014, now Pat. No. 9,587,438, which is a
(Continued)

(51) Int. Cl.
*G06F 17/50* (2006.01)
*E21B 10/43* (2006.01)
*E21B 10/55* (2006.01)

(52) U.S. Cl.
CPC .......... *G06F 17/5086* (2013.01); *E21B 10/43* (2013.01); *G06F 17/5009* (2013.01); *E21B 10/55* (2013.01)

(58) Field of Classification Search
CPC .................................. E21B 10/43; E21B 10/55
See application file for complete search history.

(56) References Cited

U.S. PATENT DOCUMENTS 4,815,342 A    3/1989 Brett et al.
5,265,685 A    11/1993 Keith et al.
(Continued)

FOREIGN PATENT DOCUMENTS

WO    WO 2010/068646    6/2010
WO    2013/180702    12/2013

OTHER PUBLICATIONS

Miska, S., "Type Curves for Predicting Directional Tendencies of Simple Bottom-Hole Assemblies," Journal of Energy Resources Technology, vol. 120, © 1998 by ASME. 8 pages, Sep. 1998.
(Continued)

*Primary Examiner* — James G Sayre
(74) *Attorney, Agent, or Firm* — Baker Botts L.L.P.

(57) ABSTRACT

Various downhole drilling tools designed and manufactured at least in part on evaluating respective forces acting on respective groups and sets of cutting elements during simulated engagement with the downhole end of a wellbore and drilling from a first downhole formation into a second downhole formation. Simulating forces acting on each cutting element as the cutting element contacts a downhole formation may be used to force balance downhole drilling tools during transition drilling or non-uniform downhole drilling conditions. Multilevel force balanced downhole drilling tools may be designed using five respective simulations, cutter group level, neighbor cutter group level, cutter set level, group of N (N=3 or N=4) consecutive cutters level and all cutters level. Various cutter layout procedures and algorithms may also be used to design multilevel force balanced downhole drilling tools which may drill faster with higher lateral stability, especially during downhole transiting drilling conditions.

11 Claims, 41 Drawing Sheets

Related U.S. Application Data continuation of application No. 13/133,615, filed as application No. PCT/US2009/067263 on Dec. 9, 2009, now Pat. No. 8,899,357.

(60) Provisional application No. 61/174,769, filed on May 1, 2009, provisional application No. 61/121,723, filed on Dec. 11, 2008.

(56) References Cited

U.S. PATENT DOCUMENTS

| | | | |
|---|---|---|---|
| 5,551,522 | A | 9/1996 | Keith et al. |
| 5,595,252 | A | 1/1997 | O'Hanlon |
| 5,607,024 | A | 3/1997 | Keith et al. |
| 5,607,025 | A | 3/1997 | Mensa-Wilmot et al. |
| 6,609,580 | B2 | 8/2003 | Beaton |
| 6,612,384 | B1 | 9/2003 | Singh et al. |
| 6,879,947 | B1 | 4/2005 | Glass |
| 7,251,590 | B2 | 7/2007 | Huang et al. |
| 7,455,125 | B2 | 11/2008 | Sinor et al. |
| 7,693,695 | B2 | 4/2010 | Huang et al. |
| 7,703,557 | B2 | 4/2010 | Durairajan et al. |
| 7,703,558 | B2 | 4/2010 | Sinor et al. |
| 7,726,415 | B1 | 6/2010 | Tipton et al. |
| 7,861,809 | B2 | 1/2011 | Gavia et al. |
| 8,047,307 | B2 | 11/2011 | Pessier et al. |
| 8,899,357 | B2 | 12/2014 | Chen |
| 2002/0157869 | A1 | 10/2002 | Glass et al. |
| 2004/0254664 | A1 | 12/2004 | Centala et al. |
| 2005/0015230 | A1 | 1/2005 | Centala et al. |
| 2005/0096847 | A1 | 5/2005 | Huang |
| 2005/0269139 | A1 | 12/2005 | Shen et al. |
| 2006/0162968 | A1 | 7/2006 | Durairajan et al. |
| 2006/0167669 | A1 | 7/2006 | Cariveau et al. |
| 2006/0195307 | A1 | 8/2006 | Huang et al. |
| 2007/0106487 | A1 | 5/2007 | Gavia et al. |
| 2008/0179108 | A1 | 7/2008 | McClain et al. |
| 2008/0302575 | A1 | 12/2008 | Durairajan et al. |
| 2009/0145669 | A1 | 6/2009 | Durairajan et al. |
| 2009/0266619 | A1 | 10/2009 | Durairajan et al. |
| 2010/0155151 | A1 | 6/2010 | Drews |
| 2010/0175930 | A1 | 7/2010 | Schwefe |
| 2011/0100724 | A1 | 5/2011 | Azar |
| 2011/0240376 | A1 | 10/2011 | Chen |
| 2012/0234610 | A1 | 9/2012 | Azar et al. |

OTHER PUBLICATIONS

"The FM3000™ Series, The Science Behind the New Generation of PDC Drill Bits," Halliburton, 2 pages, Aug. 2003.

"TransFormation Bits™, Sharper Solutions™," Reed Hycalog, 8 pages, 2004.

Clayton, Robert et al., "New Bit Design, Cutter Technology Extend PDC Applications to Hard Rock Drilling," SPE/IADC Drilling Conference, Amsterdam, The Netherlands, Feb. 23-25, 2005, 6 pages, Feb. 23, 2005.

FM2000i Bit Series, Matrix Body, Diamond Impregnation Backs Up PDS Cutters, Security DBS Drill Bits, Halliburton Drilling and Formation Evaluation, 2 pages, Oct. 2005.

International Search Report and Written Opinion, Application No. PCT/US2009/067362, 24 pages, dated Mar. 10, 2010.

Written Opinion of the International Preliminary Examining Authority, Application No. PCT/US2009/067362, 4 pages, dated Apr. 15, 2011.

Halliburton; "Ring Claw"; Bit Size: 4-3/4"×2.02"; Bit Type: FC3636; Assembly No. 63076; pp. 1, 2003.

Halliburton; "Diamond Impregnated"; Bit Size: 8-3/8"; Bit Type: Ti3105B; Assembly No. 62187; pp. 1, 2003.

Halliburton; "Ring Claw"; Bit Size: 5-5/8"; Bit Type: SE3631; Assembly No. 62807; pp. 1, 2003.

Miska et al.; "Type Curves for Predicting Directional Tendencies of Simple Bottom-Hole Assemblies"; Journal of Energy Resources Technology, vol. 120; pp. 193-200, 1998.

Halliburton; "The Science of Improving Cutter Technology"; www.halliburton.com; pp. 2, 2003.

Transformation Bits, ReedHycalog; Sharp Solutions; pp. 8, 2004.

Clayton et al.; "New Bit Design, Cutter Technology Extend PDC Applications to Hard Rock Drilling"; SPE/IADC Drilling Conference 2004; pp. 6, 2004.

Halliburton; "FM2000i Bit Series: Matrix Body—Diamond Impregnation Backs Up PDC Cutters"; www.halliburton.com; pp. 2, 2005.

International Search Report and Written Opinion; PCT/US2009/067263; pp. 25, dated Mar. 10, 2010.

Written Opinion of the International Preliminary Examining Authority; PCT/US09/67263; pp. 4, dated Apr. 15, 2011.

International Preliminary Report on Patentability; PCT/US09/67263; pp. 5, dated Apr. 5, 2012.

GB Examination Report under Section 18(3); Application No. GB1111776.9; pp. 2, dated Jul. 10, 2013.

GB Examination Report under Section 18(3); Application No. GB1305848.2; pp. 2, dated Jul. 9, 2013.

GB Examination Report under Section 18(3); Application No. GB1305849.0; pp. 2, dated Jul. 9, 2013.

GB Examination Report under Section 18(3); Application No. GB1111776.9; pp. 3, dated Jan. 17, 2013.

International Preliminary Report on Patentability, PCT/US09/67263; 3 pages, dated Dec. 28, 2011.

Canadian Office Action, Application No. 2745812; 6 pages, dated Nov. 13, 2015.

International Search Report and Written Opinion, Application No. PCT/US2013/077742; 19 pgs, dated Sep. 25, 2014.

International Search Report and Written Opinion, Application No. PCT/US2013/077743; 19 pgs, dated Sep. 26, 2014.

G. E. Weaver et al., "A New PDC Cutting Structure Improves Bit Stabilization and Extends Application into Harder Rock Types," SPE/IADC Drilling Conference, Amsterdam, The Netherlands, Feb. 23-25, 1993; 12 pgs, Feb. 23, 1993.

Office Action received for Canadian Application No. 2745812, dated Jul. 25, 2016; 4 pages, Jul. 25, 2016.

International Preliminary Report on Patentability, PCT/US09/67362, 11 pages, dated Nov. 17, 2011.

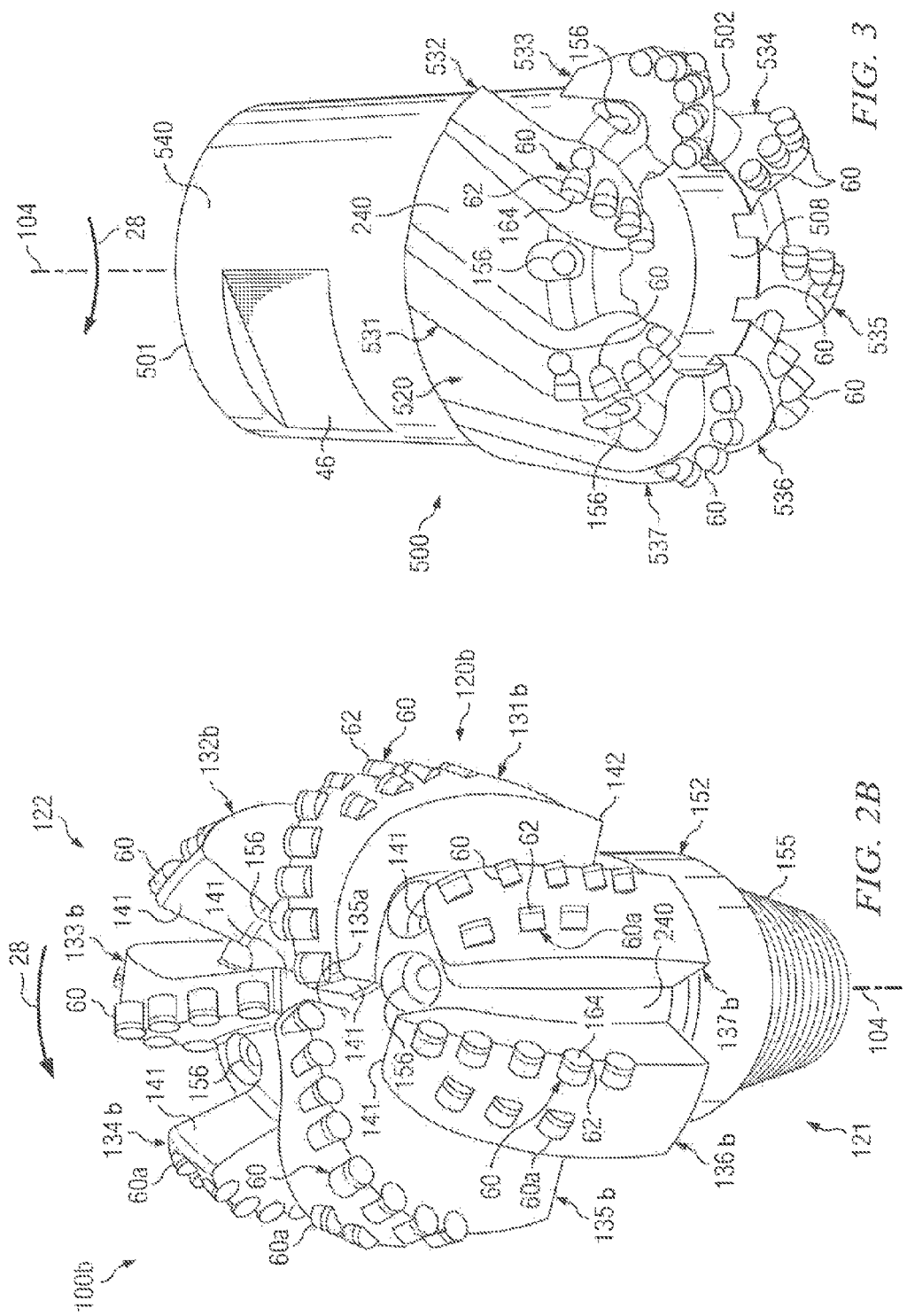

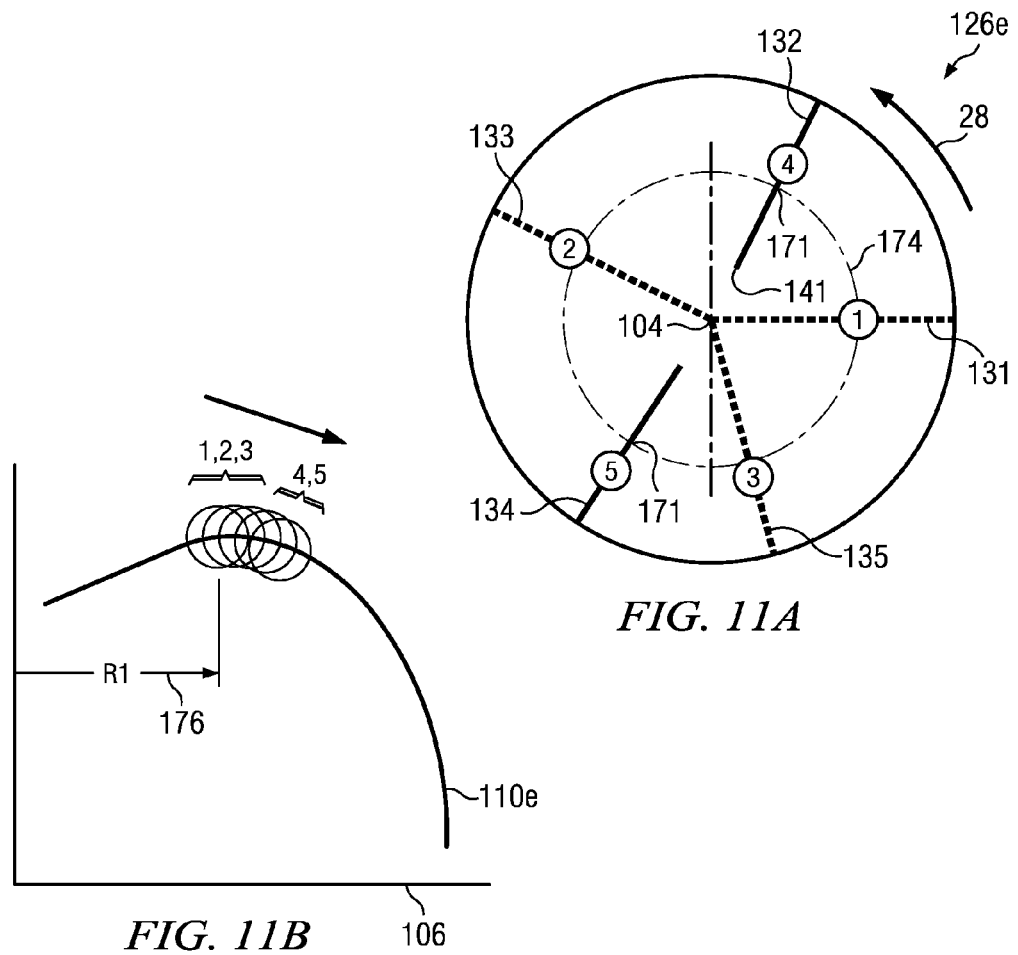
FIG. 11A
FIG. 11B
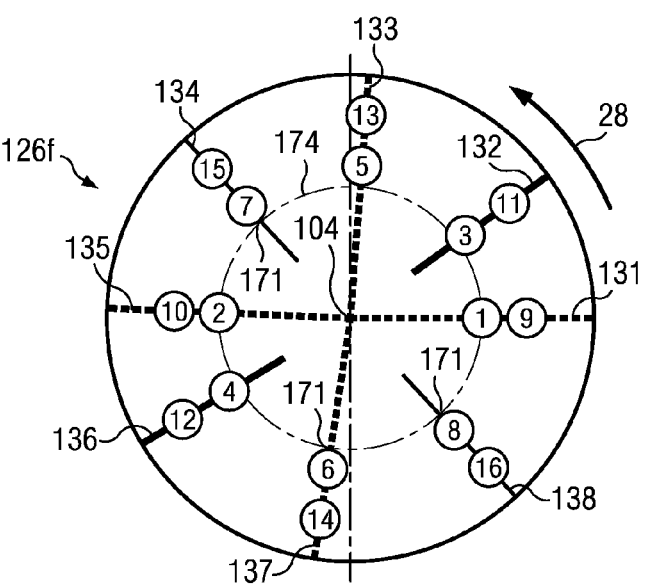
FIG. 12A

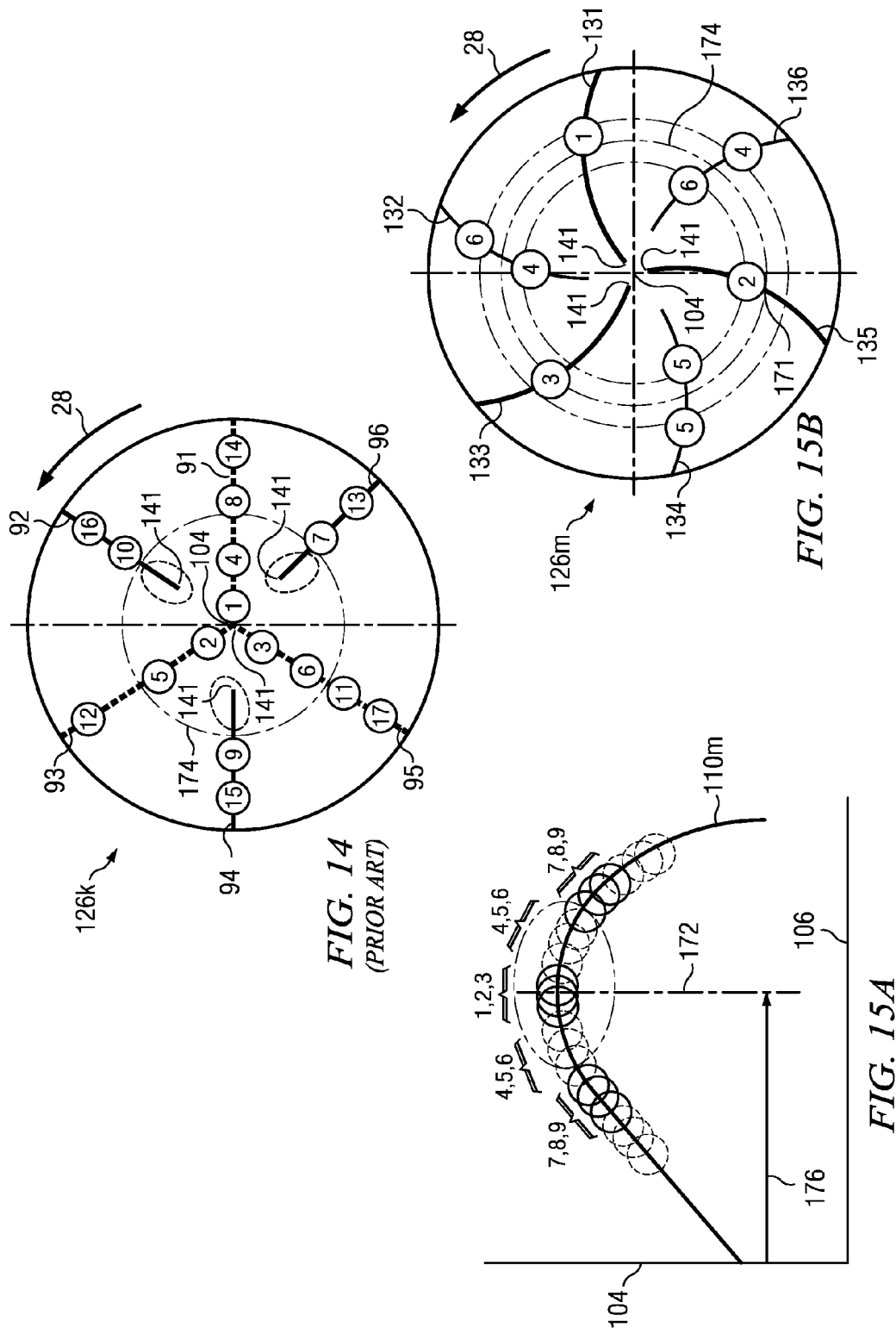

EXAMPLE MATCH OF MAJOR BLADES, ALGORITHMS AND CUTTER SETS

| N. BLD | MAJOR BLADES | ALGORITHM | BLADE GROUPS | CUTTER SET | PREFERRED MATCH |
|---|---|---|---|---|---|
| 4 | 1,3 | TWO GROUP | (1,3), (2,4) | [(1,3), (2,4)] | YES |
| 5 | 1,3,5 | TWO GROUP | (1,3,5), (2,4) | [(1,3,5), (2,4)] | YES |
|  | 1,3,4 | TWO GROUP | (1,3,4), (2,5) | [(1,3,4), (2,5)] |  |
| 6 | 1,3,5 | TWO GROUP | (1,3,5), (2,4,6) | [(1,3,5), (2,4,6)] | YES |
|  | 1,4 | PAIR GROUP | (1,4), (2,5), (3,6) | [(1,4), (3,6), (2,5)] | YES |
| 7 | 1,3,5,7 | TWO GROUP | (1,3,5,7), (2,4,6) | [(1,3,5,7), (2,4,6)] | YES |
|  | 1,3,5 | TWO GROUP | (1,3,5), (2,4,6,7) | [(1,3,5), (2,4,6,7)] | YES |
|  | 1,4,6 | TWO GROUP | (1,4,6), (2,5,3,7) | [(1,4,6), (2,5,3,7)] |  |
|  | 1,4,6 | THREE GROUP | (1,4,6), (2,5), (3,7) | [(1,4,6), (2,5), (3,7)] |  |
| 8 | 1,3,5,7 | TWO GROUP | (1,3,5,7), (2,4,6,8) | [(1,3,5,7), (2,4,6,8)] |  |
|  | 1,3,5,7 | PAIR GROUP | (1,5), (2,6), (3,7), (4,8) | [(1,5), (3,7), (2,6), (4,8)] | YES |
|  | 1,4,7 | THREE GROUP | (1,4,7), (2,6), (3,5,8) | [(1,4,7), (3,5,8), (2,6)] |  |
| 9 | 1,4,7 | THREE GROUP | (1,4,7), (2,5,8), (3,6,9) | [(1,4,7), (2,5,8), (3,6,9)] | YES |
|  | 1,4,7 | FOUR GROUP | (1,4,7), (2,6), (3,8), (5,9) | [(1,4,7), (3,8), (5,9), (2,6)] |  |
| 10 | 1,4,6,9 | PAIR GROUP | (1,6), (2,7), (3,8), (4,9), (5,10) | [(1,6), (4,9), (2,7), (5,10), (3,8)] | YES |
|  | 1,4,6,9 | THREE GROUP | (1,4,6,9), (2,5,8), (3,7,10) | [(1,4,6,9), (3,7,10), (2,5,8)] |  |
|  | 1,4,7 | FOUR GROUP | (1,4,7),(2,6,9), (3,8), (5,10) | [(1,4,7), (3,8), (5,10), (2,6,9)] |  |
| 11 | 1,3,7,9 | THREE GROUP | (1,3,7,9), (2,5,8,11), (4,6,10) | [(1,3,7,9), (2,5,8,11), (4,6,10)] | YES |
|  | 1,5,9 | FOUR GROUP | (1,5,9), (2,8), (3,6,10), (4,7,11) | [(1,5,9), (3,6,10), (4,7,11), (2,8)] |  |
|  | 1,4,7,10 | FIVE GROUP | (1,7), (2,5,9), (3,8), (4,10), (6,11) | [(1,7), (4,10), (6,11), (3,8), (2,5,9)] |  |

EXAMPLE MATCH OF MAJOR BLADES, ALGORITHMS AND CUTTER SETS

| N. BLD | MAJOR BLADES | ALGORITHM | BLADE GROUPS | CUTTER SET | PREFERRED MATCH |
|---|---|---|---|---|---|
| 12 | 1,4,7,10 | PAIR GROUP | (1,7), (2,8), (3,9), (4,10), (5,11), (6,12) | [(1,7), (4,10), (2,8), 5,11), (3,9), (6,12)] | YES |
| | 1,4,7,10 | THREE GROUP | (1,4,7,10), (2,5,8,11), (3,6,9,12) | [(1,4,7,10), (2,5,8,11), (3,6,9,12)] | |
| | 1,5,9 | FOUR GROUP | (1,5,9), (2, 6,10), (3,7,11), (4,8,12), | [(1,5,9), (2, 6,10), (3,7,11), (4,8,12)] | YES |
| | 1,4,7,10 | FIVE GROUP | (1,7), (4,10), (6,12), (2,5,9), (3,8,11) | [(1,7), (4,10), (6,12), (3,8,11), (2,5,9)] | |
| 13 | 1,5,8,11 | FOUR GROUP | (1, 5, 8,11), (2,6,10), (3,7,12), (4, 9,13) | [(1, 5, 8,11), (4, 9,13), (3,7,12), (2,6,10)] | |
| | 1,5,10 | FIVE GROUP | [(1,5,10), (3,9), (6,12), (4,8,13), (2,7,11)] | [(1,5,10), (3,9), (4,8,13), (6,12), (2,7,11)] | YES |
| | 1,5,9 | SIX GROUP | (1,5,9), (2,8), (3,10), (4,11), (6,12), (7,13) | [ (1,5,9), (3,10), (4,11), (6,12), (7,13), (2,8) ] | |
| 14 | 1,5,8,12 | PAIR GROUP | (1, 8), (2,9), (3,10), (4.,11), (5,12), (6,13), (7,14) | [(1,8), (5,12), (3,10), (6,13), (2,9), (7,14), (4.,11)] | YES |
| | 1,5,8,12 | FOUR GROUP | (1,5,8,12), (2,6,9,13), (3,7,11), (4,10,14) | [(1,5,8,12), (3,7,11), (4,10,14), (2,6,9,13)] | |
| | 1,5,10 | FIVE GROUP | (1,5,10), (2,9), (3,7,12), (4,8,13),(6,11,14) | [(1,5,10), (3,7,12), (4,8,13),(6,11,14), (2,9)] | |
| | 1,5,10 | SIX GROUP | (1,5,10), (2,9), (3,8,12), (4,11), (6,13), (7,14) | [(1,5,10), (4,11), (3,8,12), (6,13), (7,14) , (2,9)] | YES |
| 15 | 1,5,9,13 | FOUR GROUP | (1, 5, 9, 13), (2, 6,11), (3,7,10,14), (4, 8,12,15) | [(1, 5, 9, 13), (3,7,10,14), (4, 8,12,15), (2, 6,11)] | |
| | 1,6,11 | FIVE GROUP | (1,6,11), (2,7,12), (3,8,13), (4,9,14), (5,10,15) | [(1,6,11), (2,7,12), (3,8,13), (4,9,14), (5,10,15)] | YES |
| | 1,6,11 | SIX GROUP | (1,6,11), (2,9), (4,12), (3,8,13), (5,10,15), (7,14) | [(1,6,11), (2,9), (4,12), (3,8,13), (5,10,15), (7,14)] | |
| | 3,8,13 | SEVEN GROUP | (1,9), (2,10), (3,8,13), (4,11), (5,12), (6,14), (7,15) | [(3,8,13), (7,15), (5,12), (6,14), (4,11), (1,9), (2,10)] | |

*FIG. 25B*

PREFERRED MATCH OF MAJOR BLADES, ALGORITHMS
AND FOUR-LEVEL FORCE BALANCED CUTTER SETS

| N. BLD | MAJOR BLADES | ALGORITHM | LEVEL FOUR FORCED BALANCED CUTTER SET | CONSECUTIVE CUTTERS IN A CUTTER SET WITH MINIMIZED IMBALANCE FORCE |
|---|---|---|---|---|
| 5 | 1,3,5 | TWO GROUP | [(1,3,5), (2,4)] | 1,2,3; 2,3,4; 3,4,5; |
| 6 | 1,4 | PAIR GROUP | [(1,4),(3,6), (2,5)] | 1,2,3,4; 2,3,4,5; 3,4,5,6; |
| 7 | 1,3,5,7 (OR 1,3,5) | TWO GROUP | [(1,3,5,7), (2,4,6)] | 1,2,3,4; 2,3,4,5; 3,4,5,6; 4,5,6,7; |
| 8 | 1,3,5,7 | PAIR GROUP | [(1,5), (3,7), (2,6), (4,8)] | 1,2,3,4; 2,3,4,5; 3,4,5,6; 4,5,6,7; |
| 9 | 1,4,7 | THREE GROUP | [(1,4,7), (2,5,8), (3,6,9,)] | 1,2,3; 2,3,4; 3,4,5; 4,5,6; 5,6,7; 6,7,8; 7,8,9; |
| 10 | 1,4,6,9 | PAIR GROUP | [(1, 6), (4,9), (2,7), (5,10), (3,8)] | 1,2,3,4; 2,3,4,5; 3,4,5,6; 4,5,6,7; 5,6,7,8; 6,7,8,9; 7,8,9,10; |
| 11 | 1,3,7,9 | THREE GROUP | [(1,3,7,9), (2,5,8,11), (4,6,10)] | 1,2,3,4; 2,3,4,5; 3,4,5,6; 4,5,6,7; 5,6,7,8; 6,7,8,9; 7,8,9,10; 8,9,10,11; |
| 12 | 1,4,7,10 | PAIR GROUP | [(1,7), (4,10), (2,8), (5,11), (3,9), (6,12)] | 1,2,3,4; 2,3,4,5; 3,4,5,6; 4,5,6,7; 5,6,7,8; 6,7,8,9; 7,8,9,10; 8,9,10,11; 9,10,11,12; |
| 12 | 1,5,9 | FOUR GROUP | [(1,5,9), (2, 6,10), (3,7,11), (4,8,12)] | 1,2,3; 2,3,4; 3,4,5; 4,5,6; 5,6,7; 6,7,8; 7,8,9; 8,9,10; 9,10,11; 10,11,12; |
| 13 | 1,5,10 | FIVE GROUP | [(1,5,10), (3,9), (6,12), (4,8,13), (2,7,11)] | 1,2,3,4; 2,3,4,5; 3,4,5,6; 4,5,6,7; 5,6,7,8; 6,7,8,9; 7,8,9,10; 8,9,10,11; 9,10,11,12; 10,11,12,13; |
| 14 | 1,5,8,12 | PAIR GROUP | [(1, 8), (5,12), (3,10), (6,13), (2,9), (7,14), (4.,11)] | 1,2,3,4; 2,3,4,5; 3,4,5,6; 4,5,6,7; 5,6,7,8; 6,7,8,9; 7,8,9,10; 8,9,10,11; 9,10,11,12; 10,11,12,13; 11,12,13,14; |
| 15 | 1,6,11 | FIVE GROUP | [(1,6,11), (2,7,12), (3,8,13), (4,9,14), (5,10,15)] | 1,2,3; 2,3,4; 3,4,5; 4,5,6; 5,6,7; 6,7,8; 7,8,9; 8,9,10; 9,10,11; 10,11,12; 11,12,13; 12,13,14; 13,14,15; |

MULTILEVEL FORCE BALANCED DOWNHOLE DRILLING TOOLS AND METHODS

CROSS REFERENCED TO RELATED APPLICATIONS

This application is a divisional application of U.S. patent application Ser. No. 14/554,836 filed Nov. 26, 2014, which is a continuation application of U.S. patent application Ser. No. 13/133,615 filed Jun. 8, 2011, now U.S. Pat. No. 8,899,357, which is a U.S. National Stage Application of International Application No. PCT/US2009/067263 filed Dec. 9, 2009, which designates the United States and claims the benefit of U.S. Provisional Patent Application Ser. No. 61/121,723 filed Dec. 11, 2008 and U.S. Provisional Application Ser. No. 61/174,769 filed May 1, 2009, which are hereby incorporated by reference in their entirety.

TECHNICAL FIELD

The present disclosure is related to downhole drilling tools including, but not limited to, rotary drill bits, core bits, and reamers and more particularly to design, manufacture and/or selection of such downhole drilling tools based at least in part on balancing forces acting on associated cutting elements during initial contact with the downhole end of a wellbore and/or transition drilling through a first downhole formation and into a second downhole formation.

BACKGROUND OF THE DISCLOSURE

Various types of downhole drilling tools including, but not limited to, rotary drill bits, reamers, core bits, and other downhole tools have been used to form wellbores in associated downhole formations. Examples of such rotary drill bits include, but are not limited to, fixed cutter drill bits, drag bits, PDC drill bits, and matrix drill bits associated with forming oil and gas wells extending through one or more downhole formations. Various techniques and procedures have been used to stabilize such downhole drilling tools and improve their drilling performance. See for example: Brett J. F, Warren T. M. and Behr S. M., "Bit Whirl: A new Theory of PDC bit Failure", SPE 19571, October, 1989; Warren T. M, Brett J. F. and Sinor L. A., "Development of a Whirl-Resistant Bit", SPE Drilling Engineering, 5 (1990) 267-274; Weaver G. E., Clayton R., "A New PDC Cutting Structure Improves Bit Stabilization and Extends Application into Harder Rock Types", SPE/IADC 25734, 1993; Besson A., et al, "On the Cutting Edge", Oilfield Review, Autumn, 2000, p 36-57; and TransFormation Bits, ReedHycalog, 2004.

Prior techniques used to force balance fixed cutter rotary drill bits and other downhole drilling tools often assume that all cutting elements are engaged with a generally uniform downhole formation. Various computer programs and computer models are available to simulate drilling a wellbore based at least in part on this assumption.

SUMMARY OF THE DISCLOSURE

In accordance with teachings of the present disclosure, rotary drill bits and other downhole drilling tools may be designed and manufactured with various characteristics and features including, but not limited to, cutting elements disposed at selected locations to provide substantially uniform force balancing during initial contact with the downhole end of a wellbore and/or transition drilling through a first downhole formation and into an adjacent second downhole formation. Respective forces acting on each cutting element may be evaluated as a function of drilling distance as the respective cutting element engages the end of a wellbore or as each cutting element engages a second downhole formation after drilling through an adjacent first downhole formation. Such drill bits and other downhole drilling tools may sometimes be described as "multilevel force balanced".

Teachings of the present disclosure may be used to optimize the design of various features of a rotary drill bit and other downhole drilling tools including, but not limited to, the number of blades, dimensions and configurations of each blade, configuration and dimensions of cutting elements, the number, location, orientation and type of cutting elements disposed on each blade and any other feature of an associated cutting structure. Such rotary drill bits and other downhole tools may be designed and manufactured in accordance with teachings of the present disclosure with multilevel force balancing during transition drilling.

Multilevel force balanced rotary drill bits and other downhole drilling tools incorporating teachings of the present disclosure may be satisfactorily used to form a wellbore extending through multiple downhole formations in less time and with greater stability as compared with rotary drill bits and other downhole drilling tools designed based, at least in part, on assuming that all associated cutting elements are engaged with a generally uniform downhole formation. Vibration and/or force imbalances associated with initial contact with the downhole end of a wellbore, transition drilling from a first downhole formation layer into a second downhole formation layer or drilling through other types of non-uniform downhole formations may be substantially reduced or eliminated by use of multilevel force balanced downhole drilling tools incorporating teachings of the present disclosure.

Downhole drilling tools including, but not limited to, fixed cutter rotary drill bits, core bits and reamers may be designed and manufactured in accordance with teachings of the present disclosure with associated cutting elements disposed at selected locations to balance forces acting on such downhole drilling tools during initial contact with the downhole end of a wellbore or while drilling from a first downhole formation into a second downhole formation.

Teachings of the present disclosure provide rotary drill bits and other downhole drilling tools which may be force balanced for many non-uniform downhole drilling conditions as compared with prior rotary drill bits and other downhole drilling tools designed based on only one level or one condition of force balancing which assumes that all cutting elements are engaged with a generally uniform downhole formation. Fixed cutter drill bits and other downhole drilling tools which are designed and manufactured based, at least in part, on force balancing techniques which assume that all cutting elements are engaged with the same, generally uniform downhole formation may not be force balanced during many common, non-uniform downhole drilling conditions such as, but not limited to, initial contact with the end of wellbore or drilling from a first downhole formation into a second, harder downhole formation.

For some embodiments fixed cutter rotary drill bits and other downhole drilling tools may be designed and manufactured based on simulations of non-uniform downhole drilling. Such simulations may include assigning associated cutting elements to respective "cutter groups" such as two cutter groups or pair cutter groups, three cutter groups, four cutter groups, five cutter groups, etc. The cutting elements in each cutter group may be force balanced (sometimes referred to as "level one force balancing") in accordance with teachings of the present disclosure.

The cutting elements in each neighbor cutter group may also be forced balanced (sometimes referred to as "level two force balancing") in accordance with teachings of the present disclosure.

Cutting elements disposed on exterior portions of the associated rotary drill bit or other downhole drilling tool may then be divided into respective cutter sets. Each cutter set should include at least two force balanced cutter groups. The cutting elements in each cutter set may also be force balanced (sometimes referred to as "level three force balancing") in accordance with teachings of the present disclosure.

Neighbor cutting elements disposed on an associated bit face profile or cutting face profile may be divided into respective groups of either three or four cutting elements per group. The cutting elements in each neighbor cutter group may be force balanced (sometimes referred to as "level four force balancing") in accordance with teachings of the present disclosure. The final level or "level five force balancing" may include simulating forces acting on all cutting elements when engaged with a generally uniform and/or a generally non-uniform downhole formation (sometimes referred to as "all cutter force level balancing").

Force balancing may be evaluated after each level. One or more downhole drilling tool characteristics may be modified and simulations repeated to optimize downhole drilling tool characteristics such as size, type, number and location of associated cutting elements and other characteristics of fixed cutter rotary drill bits or other downhole drilling tools to substantially reduce or eliminate imbalance forces during transition drilling or non-uniform downhole drilling. Variations in forces acting on each cutting element and resulting imbalance forces versus depth of penetration of an associated downhole drilling tool may be used to design associated cutting elements, cutting structures and other downhole tool characteristics.

Further aspects of the present disclosure may include one or more algorithms or procedures for laying out or selecting locations for installing respective cutting elements on exterior portions of a rotary drill bit or other downhole drilling tool. A multilevel force balanced fixed cutter rotary drill bit, core bit, reamer or other downhole drilling tool may have increased stability and a higher rate of penetration for the same general downhole drilling conditions (weight on bit, rate of rotation, etc.) as compared with more traditional forced balanced drilling tools especially during transition drilling between a first formation layer and a second formation layer.

Many prior fixed cutter rotary drill bits and other downhole drilling tools may be described as force balanced for only one level or one set of downhole drilling conditions. Currently available computer models and design techniques generally use only one level of force balancing to improve bit lateral stability by minimizing lateral imbalance forces including drag lateral imbalance forces and radial lateral forces. Some prior force balancing techniques may also include balancing axial bit bending moments. The one level or one set of downhole drilling conditions typically includes all cutting elements engaged with a generally uniform downhole formation and does not generally consider transient forces during non-uniform downhole drilling conditions. Simulations conducted in accordance with teachings of the present disclosure indicate that one level force balanced conditions may often be violated during transition drilling through downhole formations with non-uniform properties.

Force balanced conditions of traditional one level force balanced PDC bits may be significantly violated during initial engagement with the downhole end of a wellbore and during transit drilling with non-uniform downhole conditions. The maximum transient lateral imbalance force may be over 20% of axial force and the maximum axial bending moment may be over 50% of torque during transit drilling. Simulations have shown substantially increased benefits from using rotary drill bits and other downhole drill tools which have been designed and manufactured based on multilevel force balancing techniques incorporating teachings of the present disclosure as compared to prior fixed cutter rotary drill bits and other downhole drilling tools with only one level of force balancing.

BRIEF DESCRIPTION OF THE DRAWINGS

A more complete and thorough understanding of the various embodiments and advantages thereof may be acquired by referring to the following description taken in conjunction with the accompanying drawings, in which like reference numbers indicate like features, and wherein:

FIG. 2B is a schematic drawing showing an isometric view of a fixed cutter drill bit incorporating teachings of the present disclosure and oriented upwardly in a manner often used to model or design fixed cutter drill bits;

FIG. 3 is a schematic drawing in elevation showing one example of a core bit incorporating teachings of the present disclosure;

FIGS. 11A and 11B are schematic drawings showing various techniques to select or layout locations for installing respective cutting elements in a cutter set used to multilevel force balance a downhole drilling tool in accordance with teachings of the present disclosure;

FIGS. 12A-12D are schematic drawings showing various techniques to select or layout locations for installing respective cutting elements in a cutter set which may be used to multilevel force balance a downhole drilling tool (four respective cutter sets) in accordance with teachings of the present disclosure;

FIG. 14 is a schematic drawing showing one example of prior procedures to select or lay out locations for installing cutting elements on the cutting face of a downhole drilling tool starting from an associated rotational axis;

FIGS. 15A and 15B are schematic drawings showing examples of selecting or laying out locations for installing cutting elements relative to a nose point on an associated composite cutting face profile in accordance with teachings of the present disclosure;

FIGS. 25A and 25B are tables showing examples of matching major blades, cutter groups, blade groups and cutter sets for use in multilevel force balancing of fixed cutter rotary drill bits or other downhole drilling tools in accordance with teachings of the present disclosure; and FIG. 26 is a table showing preferred matches of major blades, cutter groups, blade groups and cutter sets during design of multilevel force balance fixed cutter rotary drill bits or other downhole drilling tools in accordance with teachings of the present disclosure.

DETAILED DESCRIPTION OF THE DISCLOSURE

Figure 1A:
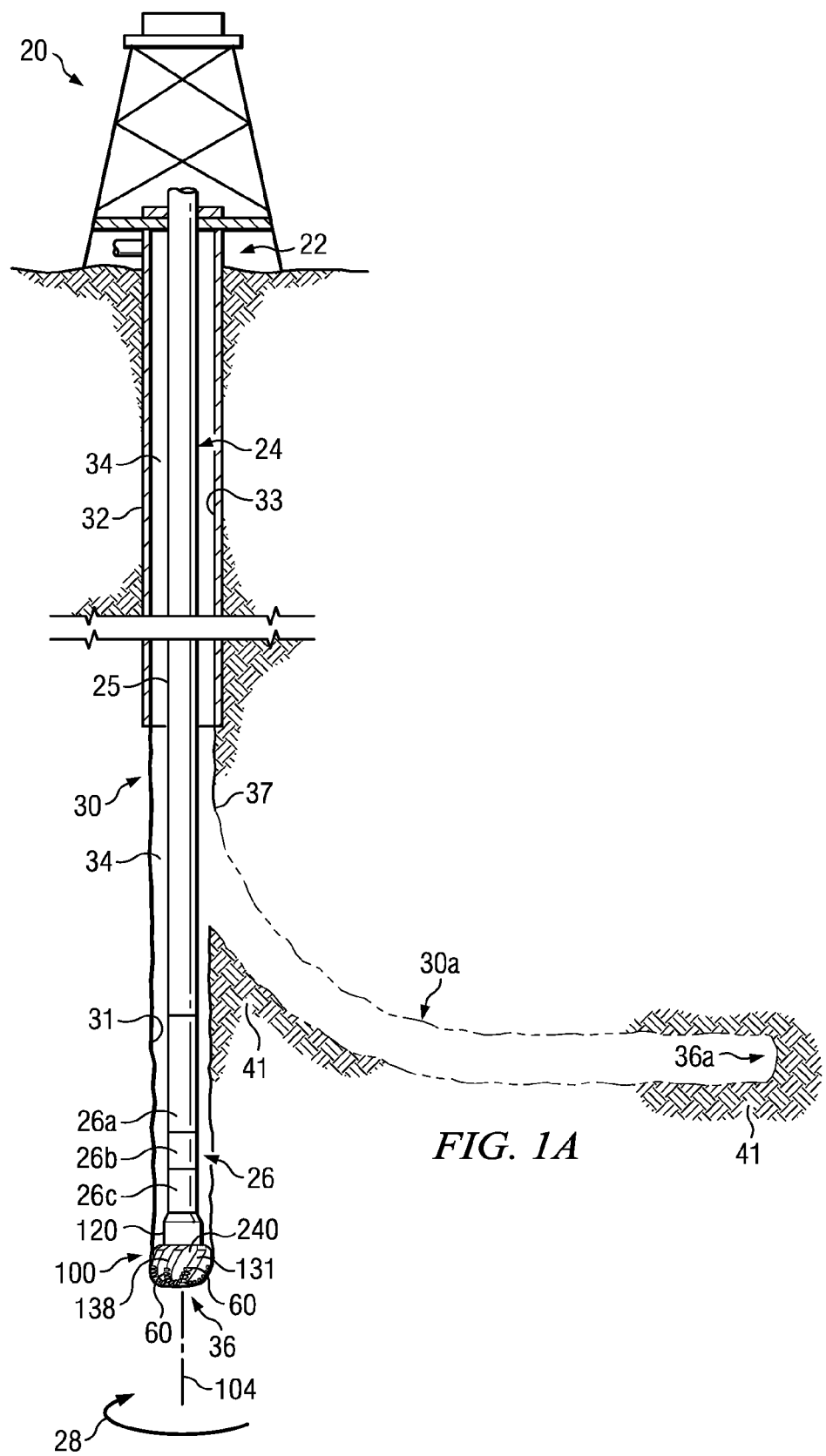
FIG. 1A is a schematic drawing in section and in elevation with portions broken away showing examples of wellbores which may be formed in downhole formations by a rotary drill bit or other downhole drilling tools incorporating teachings of the present disclosure.

Preferred embodiments and various advantages of the disclosure may be understood by reference to FIGS. 1A-26 wherein like numbers refer to same and like parts.

The terms "bottom hole assembly" or "BHA" may be used in this application to describe various components and assemblies disposed proximate one or more downhole drilling tools disposed proximate the downhole end of a drill string. Examples of components and assemblies (not expressly shown) which may be included in various cutting structures such as in a bottom hole assembly or BHA include, but are not limited to, a bent sub, a downhole drilling motor, sleeves, stabilizers and downhole instruments. A bottom hole assembly may also include various types of well logging tools (not expressly shown) and other downhole tools associated with directional drilling of a wellbore. Examples of such logging tools and/or directional drilling tools may include, but are not limited to, acoustic, neutron, gamma ray, density, photoelectric, nuclear magnetic resonance, rotary steering tools and/or any other commercially available well tool.

The terms "cutting element" and "cutting elements" may be used in this application to include, but are not limited to, various types of cutters, compacts, buttons, and inserts satisfactory for use with a wide variety of rotary drill bits and other downhole drilling tools. Impact arrestors, gage cutters, secondary cutters and/or back up cutters may also be included as part of the cutting structure of rotary drill bits and other downhole drilling tools formed in accordance with teachings of the present disclosure. Polycrystalline diamond compacts (PDC) and tungsten carbide inserts are often used to form cutting elements for rotary drill bits, reamers, core bits and other downhole drilling tools. Various types of other hard, abrasive materials may also be satisfactorily used to form cutting elements for rotary drill bits.

The terms "cutting face", "cutting face profile" and "composite cutting face profile" describe various components, segments or portions of a downhole drilling tool operable to engage and remove formation materials to form an associated wellbore. The cutting face of a downhole drilling tool may include various cutting structures such as one or more blades with respective cutting elements disposed on exterior portions of each blade. A cutting face may also include impact arrestors, back up cutters, gage cutters and/or an associated gage pad. The cutting face of a fixed cutter rotary drill bit may also be referred to as a "bit face".

The terms "cutting face profile" and "composite cutting face profile" may also describe various cutting structures including blades and associated cutting elements projected onto a radial plane extending generally parallel with an associated rotational axis. The cutting face profile of a fixed cutter rotary drill bit and/or a core bit may also be referred to as a "bit face profile" or "composite bit face profile".

The term "cutting structure" may be used in this application to include various combinations and arrangements of cutting elements, impact arrestors, backup cutters and/or gage cutters formed on exterior portions of a rotary drill bit or other downhole drill tools. Some rotary drill bits and other downhole drilling tools may include one or more blades extending from an associated bit body with respective cutting elements disposed of each blade. Such blades may sometimes be referred to as "cutter blades".

The terms "downhole drilling tool" or "downhole drilling tools" may include rotary drill bits, matrix drill bits, drag bits, reamers, near bit reamers, hole openers, core bits and other downhole tools having cutting elements and/or cutting structures operable to remove downhole formation materials while drilling a wellbore.

The terms "downhole" and "uphole" may be used in this application to describe the location of various components of a downhole drilling tool relative to portions of the downhole drilling tool which engage the bottom or end of a wellbore to remove adjacent formation materials. For example an "uphole" component may be located closer to an associated drill string or bottom hole assembly as compared to a "downhole" component which may be located closer to the bottom or end of an associated wellbore.

The terms "force balanced" and "force balancing" may be used in this application to describe various methods, procedures and techniques associated with designing rotary drill bits and other downhole drilling tools. Fixed cutter rotary drill bits have often been designed to be force balanced based in part on computer models or programs which assume that all associated cutting elements are engaged with a generally uniform downhole formation while forming a wellbore. This traditional type of force balancing generally provides only one level of force balancing. As a result rotary drills and other downhole drilling tools may experience large imbalance forces during transition drilling when all associated cutting elements are not engaged with a generally uniform downhole formation.

Prior force balancing techniques which use only one level of force balancing (such as all cutting elements engaged with a generally uniform downhole formation) may not adequately describe forces acting on a rotary drill bit or other downhole drilling tools during initial contact with the downhole end of a wellbore, during transition drilling between a first downhole formation and a second downhole formation and any other downhole drilling conditions which do not include all cutting elements engaged with a generally uniform downhole formation. Rotary drill bits designed at least in part based on this assumption may experience significant imbalance forces during non-uniform downhole drilling conditions.

The term "gage pad" as used in this application may include a gage, gage segment, gage portion or any other portion of a rotary drill bit. Gage pads may be used to help define or establish a nominal inside diameter of a wellbore formed by an associated rotary drill bit. The layout of locations for installing cutting elements on exterior portions of a blade may terminate proximate an associated gage pad.

The terms "multilevel force balanced" and "multilevel force balancing" may include, but are not limited to, various methods, techniques and procedures to simulate or evaluate imbalance forces acting on downhole drilling tools while forming a wellbore with non-uniform downhole drilling conditions. Multilevel force balancing generally includes the use of respective cutter groups and cutter sets and is not limited to a single set of all cutting elements of a downhole drilling tool engaged with a generally uniform downhole formation. Multilevel force balancing may also include evaluating bit imbalance forces as a function of drilling depth.

A rotary drill bit or other downhole drilling tool may be designed based at least in part on simulations using multilevel force balancing techniques to limit:

(a) maximum transient lateral imbalance force to less than approximately 8% (and often preferably less than approximately 6%) of associated transient axial force;

(b) lateral imbalance force, when all cutters are engaged with a general uniform downhole formation, to less than approximately 4% of bit actual force;

(c) maximum transient radial lateral imbalance forces to less than approximately 6% (preferably less than approximately 4%) of associated transient axial force;

(d) radial lateral imbalance force, when all cutters are engaged with a generally uniform downhole formation, to less than approximately 2.5% of associated bit axial force;

(e) maximum transient drag lateral imbalance force to less than approximately 6% (and often preferably less than approximately 4%) of associated transient axial force;

(f) drag lateral imbalance force while all cutters are engaged with a general uniform downhole formation to less than approximately 2.5% of associated bit axial force;

(g) maximum axial movement to less than approximately 15% of associated transient torque; and (h) axial moment, when all cutters are engaged with a general uniform downhole formation, to less than approximately 4% of associated bit torque.

Traditional, prior art force balancing techniques which use only one level such as all cutting elements engaged with a generally uniform downhole formation often only meet a limited number of the above conditions such as items (b), (d), (f) and (h).

The terms "multilevel force balance" and "multilevel force balancing" may also include, but are not limited to, various levels of force balancing such as level one through level five.

First level or level one may include balancing forces acting on all cutting elements in each respective cutter group in accordance with teachings of the present disclosure. Each cutter group may have 2, 3, 4 or 5 cutters. See FIGS. 10A-10H. When performing level one force balancing, the cutters in each cutter group may be in a uniform formation. For some applications multilevel force balancing may be conducted with respective groups of more than five neighbor cutters.

Second level or level two force balancing may include balancing forces acting on each cutting element in any two neighbor cutter groups on an associated composite cutting face profile. When performing level two force balancing, the cutters in the two groups may be in a uniform formation. Imbalance forces resulting from any two neighbor cutter groups on an associated composite cutting face profile may be substantially minimized or eliminated (balanced). See FIGS. 11A, 11B and 12A-12D.

Third level or level three force balancing may include balancing forces acting on all cutting elements in each cutter set. The number of cutters within each cutter set may equal the number of blades on an associated downhole drilling tool. A cutter set may include at least two force balanced neighbor cutter groups. When performing level three force balancing, the cutters in the set may be in a uniform formation. Imbalance forces resulting from all cutters in each cutter set are minimized or eliminated (balanced). See FIGS. 12A-12D, 16A-16D, 17, and 18. Depending on the number of primary blades and the starts of secondary blades, one or more cutter sets may be incomplete due to minor blades. For example, the first cutter set listed in FIG. 22I has only two cutters (1,2) on blades (3,7), respectively.

Fourth level or level four force balancing may include balancing forces acting on any group of N (N=3 or N=4) consecutive cutters on an associated composite cutting face profile. When performing level four force balancing, the cutters may be in a uniform formation. Respective imbalance forces resulting from each group of N (N=3 or N=4) neighbor cutters may be substantially minimized or eliminated (e.g., balanced). See FIGS. 22J-1 and 22J-2. The number of N (N=3 or N=4) depends on the number of blades and the cutter set used to layout the cutters. See FIG. 26.

Fifth level or level five force balancing may include balancing forces acting on all cutting elements of a composite bit face profile based on simulating all cutting elements engaged with a generally uniform and/or a generally non-uniform downhole formation. When a generally uniform formation is drilled, level five force balancing may be similar to prior one level force balancing techniques. Respective imbalance forces resulting from each group of either three or four neighbor cutters may be substantially minimized or eliminated (balanced). See FIG. 22H. The number of cutting elements (3 or 4) in each neighbor cutter group depends on the number of blades and the number of cutter sets.

For some downhole drilling tools, only levels one, two, three and five force balancing may be conducted. However, level four force balancing may be preferred for many downhole drilling tools. Levels one, two, three and five force balancing may be accomplished using cutter layout algorithms as shown in FIGS. 25A, 25B and 26 starting from the nose point of an associated composite cutting face profile.

The term "neighbor cutters" may be used in this application to include cutting elements disposed immediately adjacent to each other (e.g., consecutively numbered) on an associated cutting face profile or bit face profile with less than 100% overlap between respective cutting surfaces of the immediately adjacent cutting elements.

The term "force balanced cutter group" includes, but is not limited to, that the magnitude of the imbalance forces associated with the cutters in the group is smaller than that associated with each individual cutter in the same group.

The term "force balanced two neighbor cutter groups" includes, but is not limited to, that the magnitude of the imbalance forces associated with the two neighbor cutter groups is smaller than that associated with each individual cutter in the same two neighbor cutter groups.

The term "force balanced cutter set" includes, but is not limited to, that the magnitude of the imbalance forces associated with the cutters in the set is smaller than that associated with each individual cutter in the same set.

The term "force balanced N (N=3 or N=4) consecutive neighbor cutters" includes, but is not limited to, that the magnitude of the imbalance forces associated with N consecutive neighbor cutters is smaller than the maximum imbalance forces associated with each cutter of N consecutive cutters.

The term "rotary drill bit" may be used in this application to include various types of fixed cutter drill bits, fixed cutter rotary drill bits, PDC bits, drag bits, matrix drill bits, steel body drill bits and core bits operable to form at least portions of a wellbore in a downhole formation. Rotary drill bits and associated components formed in accordance with teachings of the present disclosure may have many different designs, configurations and/or dimensions.

The terms "reamer" and "reamers" may be used in the application to describe various downhole drilling tools including, but not limited to, near bit reamers, winged reamers and hole openers.

Various computer programs and computer models may be used to design cutting elements, blades, cutting structure and/or associated downhole drilling tools in accordance with teachings of the present disclosure. Examples of such programs and models which may be used to design and evaluate performance of downhole drilling tools incorporating teachings of the present disclosure are shown in copending U.S. patent applications entitled "Methods and Systems for Designing and/or Selecting Drilling Equipment Using Predictions of Rotary Drill Bit Walk," application Ser. No. 11/462,898, filing date Aug. 7, 2006 (now U.S. Pat. No. 7,778,777); copending U.S. patent application entitled "Methods and Systems of Rotary Drill Bit Steerability Prediction, Rotary Drill Bit Design and Operation," application Ser. No. 11/462,918, filed Aug. 7, 2006 (now U.S. Pat. No. 7,729,895) and copending U. S. patent application entitled "Methods and Systems for Design and/or Selection of Drilling Equipment Based on Wellbore Simulations," application Ser. No. 11/462,929, filing date Aug. 7, 2006 (now U.S. Pat. No. 7,827,014).

Various aspects of the present disclosure may be described with respect to downhole drilling tools such as shown in FIGS. 1A-26. Examples of such downhole drilling tools may include, but are not limited to, rotary drill bits 100, 100a, 100b and 100c, core bit 500 and reamer 600. Rotary drill bit 90 and associated cutting structure is one example of prior rotary drill bits and other downhole drilling tools which have not been force balanced in accordance with teachings of the present disclosure.

Rotary drill bits 100, 100a, 100b and 100c, core bit 500 and reamer 600 may include three or more blades with respective cutting elements disposed at selected locations on associated blades in accordance with teachings of the present disclosure. The teachings of the present disclosure are not limited to rotary drill bits 500 and/or 100a, 100b and 100c, core bit 500 or reamer 600.

FIG. 1A shows examples of wellbores or bore holes which may be formed by downhole drilling tools incorporating teachings of the present disclosure. Rotary drill bit 100 may be designed and manufactured using multilevel force balancing techniques in accordance with teachings of the present disclosure to substantially reduce and/or minimize imbalance forces which may result from contact between rotary drill bit 100 and downhole end 36 of wellbore 30 or downhole end 36a of wellbore 30a.

Various aspects of the present disclosure may be described with respect to drilling rig 20, drill string 24 and attached rotary drill bit 100. Cutting elements may be disposed at selected locations on exterior portions of blades 131-136 to substantially reduce and/or eliminate imbalance forces acting on rotary drill bit 100 during non-uniform downhole drilling conditions or transition drilling conditions.

Bit imbalance forces associated with non-uniform downhole drilling conditions are discussed in more detail with respect to rotary drill bit 90 in FIGS. 7, 8A-8D and rotary drill bit 90a in FIGS. 19A-20G. Bit imbalance forces may cause vibration of drill string 24 when rotary drill bit 100 initially contacts end 36 of wellbore 30 or end 36a of horizontal wellbore 30a. See FIG. 1A. Such vibration may extend from rotary drill bit 100 throughout the length of drill string 24. See FIG. 1C. Imbalance forces acting on a downhole drilling tool may also result during transition drilling from a first generally soft formation layer into a second, generally harder downhole formation layer. See, for example, FIGS. 1B and 7. Imbalance forces acting on a downhole drilling tool may also result from drilling from a first downhole formation into a second downhole formation where the second downhole formation may be tilted at an angle other than normal to a wellbore formed by a downhole drilling tool. See, for example, FIGS. 9A, 9B and 9C.

Figure 1B:
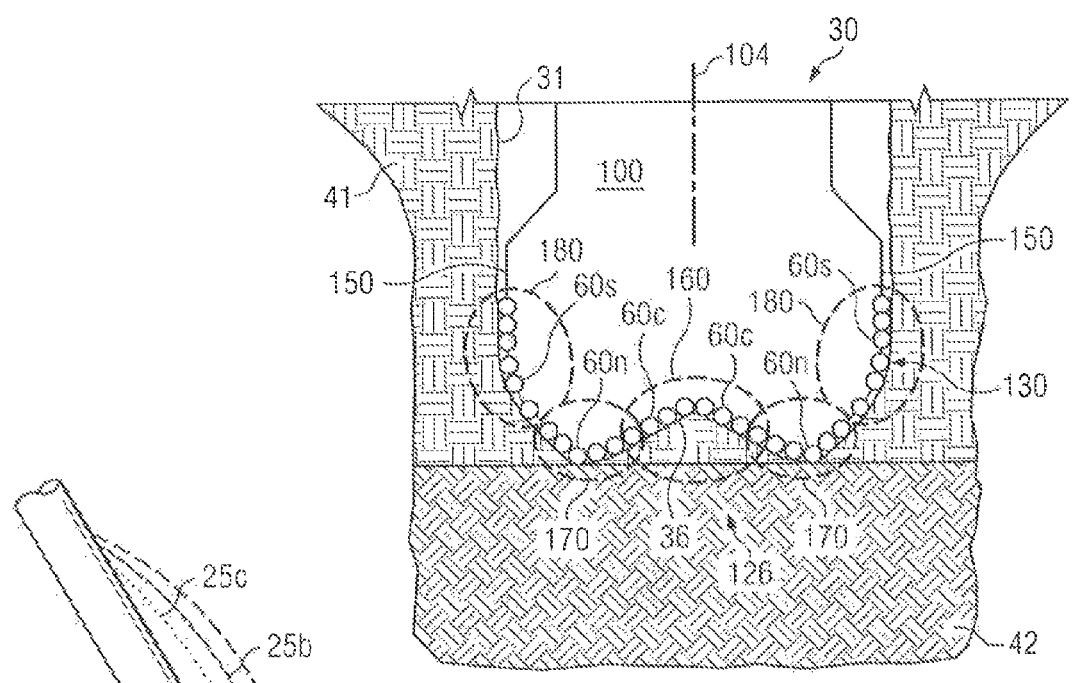
FIG. 1B is a schematic drawing in section and in elevation with portions broken away showing the rotary drill bit of FIG. 1A drilling a wellbore through a first downhole formation and into an adjacent second downhole formation.

Wellbores 30 and/or 30a may often extend through one or more different types of downhole formation materials or formation layers. As shown in FIG. 1B, rotary drill bit 100 may be used to extend wellbore 30 through first formation layer 41 and into second formation layer 42. For some applications, first formation layer 41 may have a compressive strength or hardness less than the compressive strength or hardness of second formation layer 42.

During transition drilling between first layer 41 and second harder layer 42, significant imbalance forces may be applied to a downhole drill tool resulting in undesired vibration of an associated downhole drill string. Vibration and/or imbalance forces associated with initial contact with a downhole formation at the end of a wellbore, transition drilling from a first formation layer into a second formation layer and other non-uniform downhole drilling conditions will be discussed in more detail.

Various types of drilling equipment such as a rotary table, mud pumps and mud tanks (not expressly shown) may be located at well surface or well site 22. Drilling rig may have various characteristics and features associated with a "land drilling rig". However, downhole drilling tools incorporating teachings of the present disclosure may be satisfactorily used with drilling equipment located on offshore platforms, drill ships, semi-submersibles and drilling barges (not expressly shown).

Bottom hole assembly 26 may be formed from a wide variety of components. For example, components 26a, 26b and 26c may be selected from the group consisting of, but not limited to, drill collars, rotary steering tools, directional drilling tools and/or downhole drilling motors. The number of components such as drill collars and different types of components included in a bottom hole assembly will depend upon anticipated downhole drilling conditions and the type of wellbore which will be formed by drill string 24 and rotary drill bit 100.

Drill string 24 and rotary drill bit 100 may be used to form a wide variety of wellbores and/or bore holes such as generally vertical wellbore 30 and/or generally horizontal wellbore 30a as shown in FIG. 1A. Various directional drilling techniques and associated components of bottomhole assembly 26 may be used to form horizontal wellbore 30a. For example, lateral forces may be applied to rotary drill bit 100 proximate kickoff location 37 to form horizontal wellbore 30a extending from generally vertical wellbore 30.

Excessive amounts of vibration or imbalance forces applied to a drill string while forming a directional wellbore may cause significant problems with steering drill string and/or damage one or more downhole components. Such vibration may be particularly undesirable during formation of directional wellbore 30a. Designing and manufacturing rotary drill bit 100 and/or other downhole drilling tools using multilevel force balancing techniques incorporating teachings of the present disclosure may substantially enhance stability and steerability of rotary drill bit 100 and other downhole drilling tools.

Wellbore 30 defined in part by casing string 32 may extend from well surface 22 to a selected downhole location. Portions of wellbore 30 as shown in FIG. 1A which do not include casing 32 may be described as "open hole". Various types of drilling fluid may be pumped from well surface 22 through drill string 24 to attached rotary drill bit 100. Such drilling fluids may be directed to flow from drill string 24 to respective nozzles 156 provided in rotary drill bit 100. See for example nozzles 156 in FIGS. 2A and 2B. The drilling fluid may be circulated back to well surface 22 through annulus 34 defined in part by outside diameter 25 of drill string 24 and inside diameter 31 of wellbore 30. Inside diameter 31 may also be referred to as the "sidewall" of wellbore 30. Annulus 34 may also be defined by outside diameter 25 of drill string 24 and inside diameter 33 of casing string 32.

Rate of penetration (ROP) of a rotary drill bit is often a function of both weight on bit (WOB) and revolutions per minute (RPM). Drill string 24 may apply weight on drill bit 100 and also rotate drill bit 100 to form wellbore 30. For some applications a downhole motor (not expressly shown) may be provided as part of bottom hole assembly 26 to also rotate rotary drill bit 100.

FIG. 1B shows rotary drill bit 100 forming wellbore 30 through first formation layer 41 into second formation layer 42. Formation layer 41 may be described as "softer" or "less hard" when compared with downhole formation layer 42. Various details associated with designing and manufacturing rotary drill bit 100 using multilevel force balancing techniques incorporating teachings of the present disclosure will be further discussed with respect to FIGS. 21A, 21B and 22A-22J.

Exterior portions of rotary drill bit 100 which contact adjacent portions of a downhole formation may be described as a "bit face". Bit face 126 of rotary drill bit 100 may include generally cone shaped segment or inner zone 160, nose segment or nose zone 170 and shoulder or outer segment 180 defined in part by respective portions of associated blades 131-138.

A plurality of cone cutters 60c may be disposed on cone or inner segment 160. A plurality of nose cutters 60n may be disposed on nose segment 170. A plurality of shoulder cutters 60s may be disposed on shoulder or outer segment 180 in accordance with teachings of the present disclosure. See FIGS. 21A and 21B for additional details. Cone cutters 60c may also be described as "inner cutters". Shoulder cutter 60s may also be described as "outer cutters".

Generally convex or outwardly curved nose segment or nose zone 170 may be formed on exterior portions of each blade 131-138 adjacent to and extending from cone shaped segment 160. Respective shoulder segments 180 may be formed on exterior portions of each blade 131-138 extending from respective nose segments 170. Each shoulder segment 180 may terminate proximate a respective gage cutter or gage pad on each blade 131-138 such as gage cutters 60g in FIG. 2A and gage pad 150 in FIGS. 1B and 1C. Exterior portions of blades 131-138 and cutting elements 60 may be projected onto a radial plane to form a bit face profile or a composite bit face profile. Composite bit face profile 110 associated with rotary drill bit 100 are shown in FIGS. 5A, 5C, 9A-9C and 21B.

Cutting elements or nose cutters 60n may be disposed at selected locations on nose segments 170 of respective blades 131-138 in accordance with teachings of the present disclosure to initially contact a downhole formation and avoid creating undesired imbalance force acting on drill bit 100. In some embodiments, two or more cutting elements may be optimally located on respective blades to make approximately simultaneous contact with the downhole end of a wellbore and substantially reduce and/or eliminate imbalance forces and/or vibrations acting on an associated drill bit and drill string.

Various features of the present disclosure may be defined with respect to rotary drill bits 90 and a 100. The size, configuration and other design parameters associated with rotary drill bits 90 and 100 may be the same except for locations selected or laid out for installing respective cutting elements on exterior portions of associated blades. Blades 131-138 of rotary drill bit 100 may have the same configuration and dimensions as blades 91-98 of rotary drill bit 90.

Rotary drill bit 90 may be described as a prior art drill bit because locations selected to install cutting elements on blades 91-98 are based on:

only one level of force balancing assuming all cutters are engaged with a generally uniform downhole formation; and cutter layout starts from a first portion on a primary blade closely adjacent to an associated bit rotational axis.

Figure 1C:
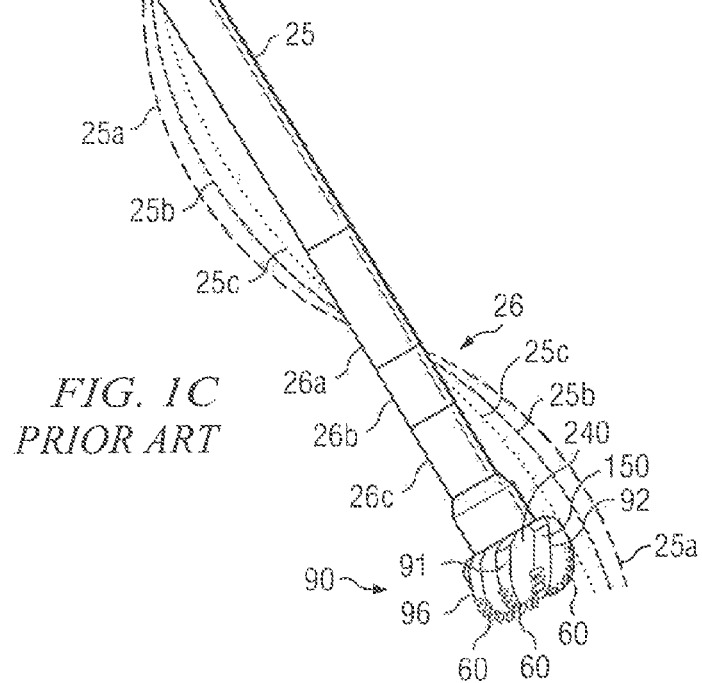
FIG. 1C is a schematic drawing in elevation with portions broken away showing one example of possible effects from bit imbalance forces applied to a rotary drill bit which has not been multilevel force balanced in accordance with teachings of the present disclosure.

As shown in FIG. 1C, vibration and/or bit imbalance forces may be transmitted from rotary drill bit to drill string 24. Undesirable changes in inside diameter 31 of wellbore 30 and/or excessive wear on rotary drill bit 90 and/or components of drill string 24 may occur. Such vibration may even damage equipment located at well surface 22. Dotted lines 25a, 25b and 25c show examples of vibration which may occur based in part on the magnitude of imbalance forces applied to rotary drill bit 90. See FIGS. 7 and 8A-8D.

Figure 1D:
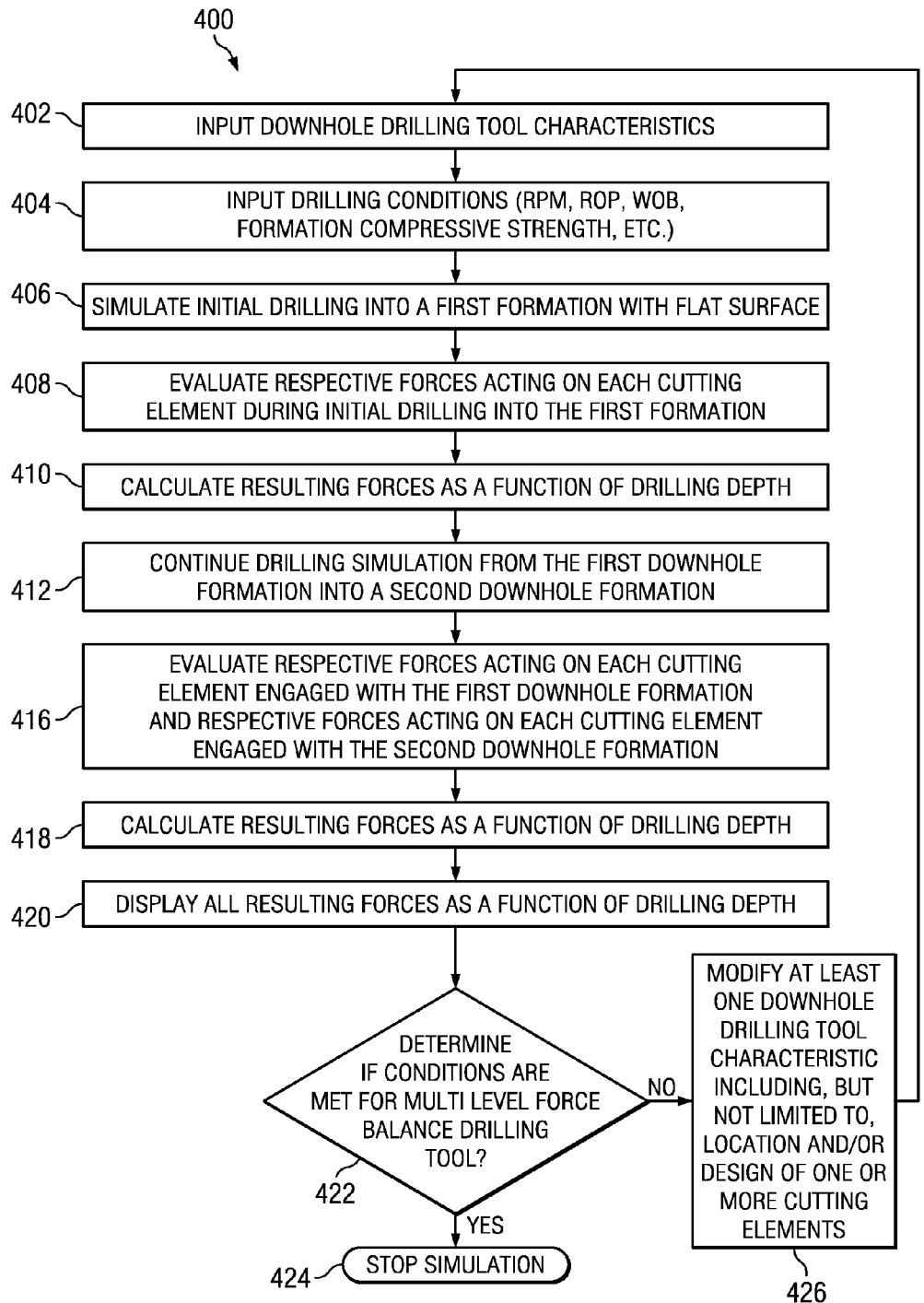
FIG. 1D is a process diagram showing one example of techniques or procedures which may be used to design various downhole drilling tools in accordance with teachings of the present disclosure.
Figure 23A:
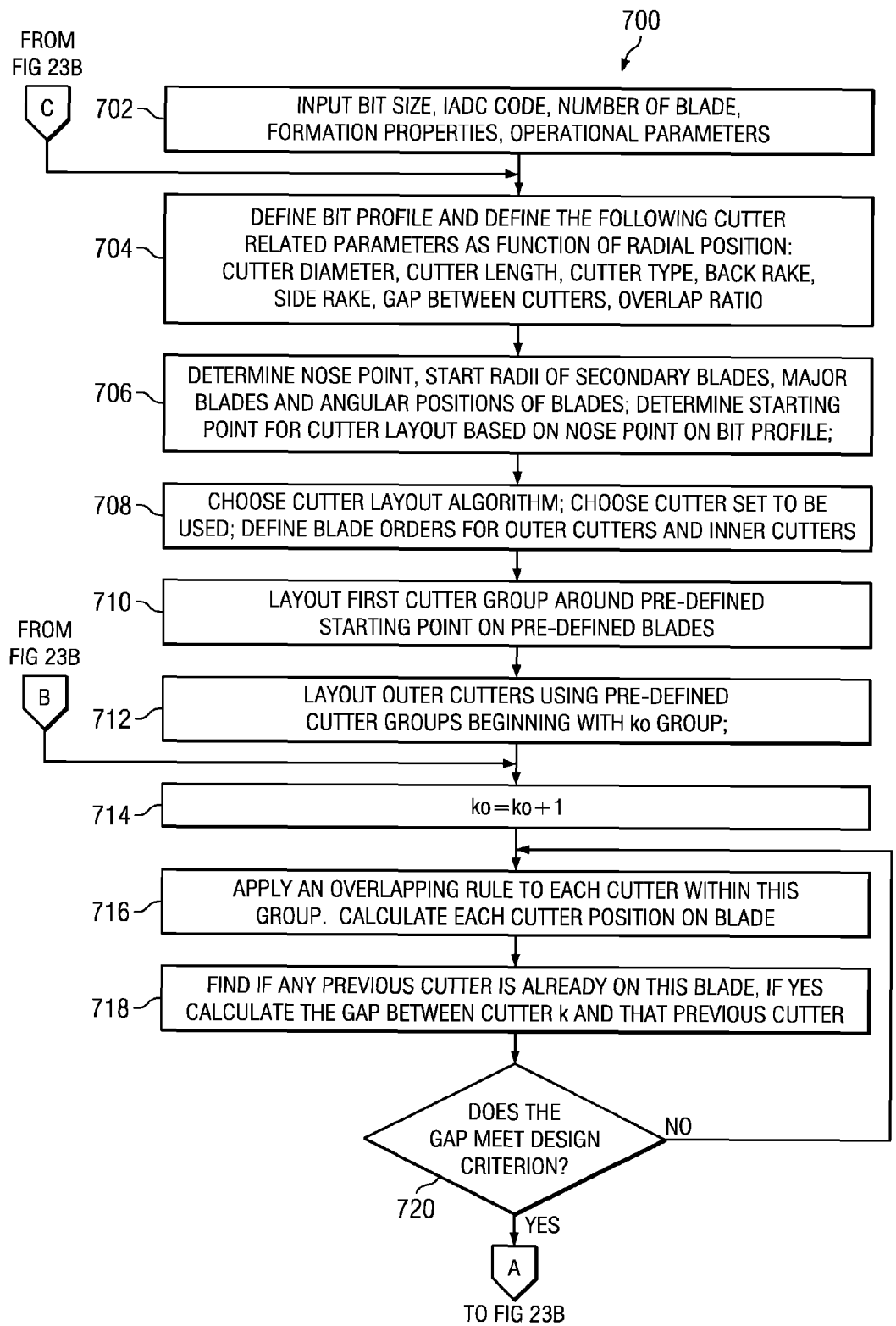
FIGS. 23A and 23B are process diagrams showing one example of methods of techniques which may be used to force balance a downhole drilling tool and to install cutting elements on exterior portions of the downhole drilling tool in accordance with teachings of the present disclosure.
Figure 23B:
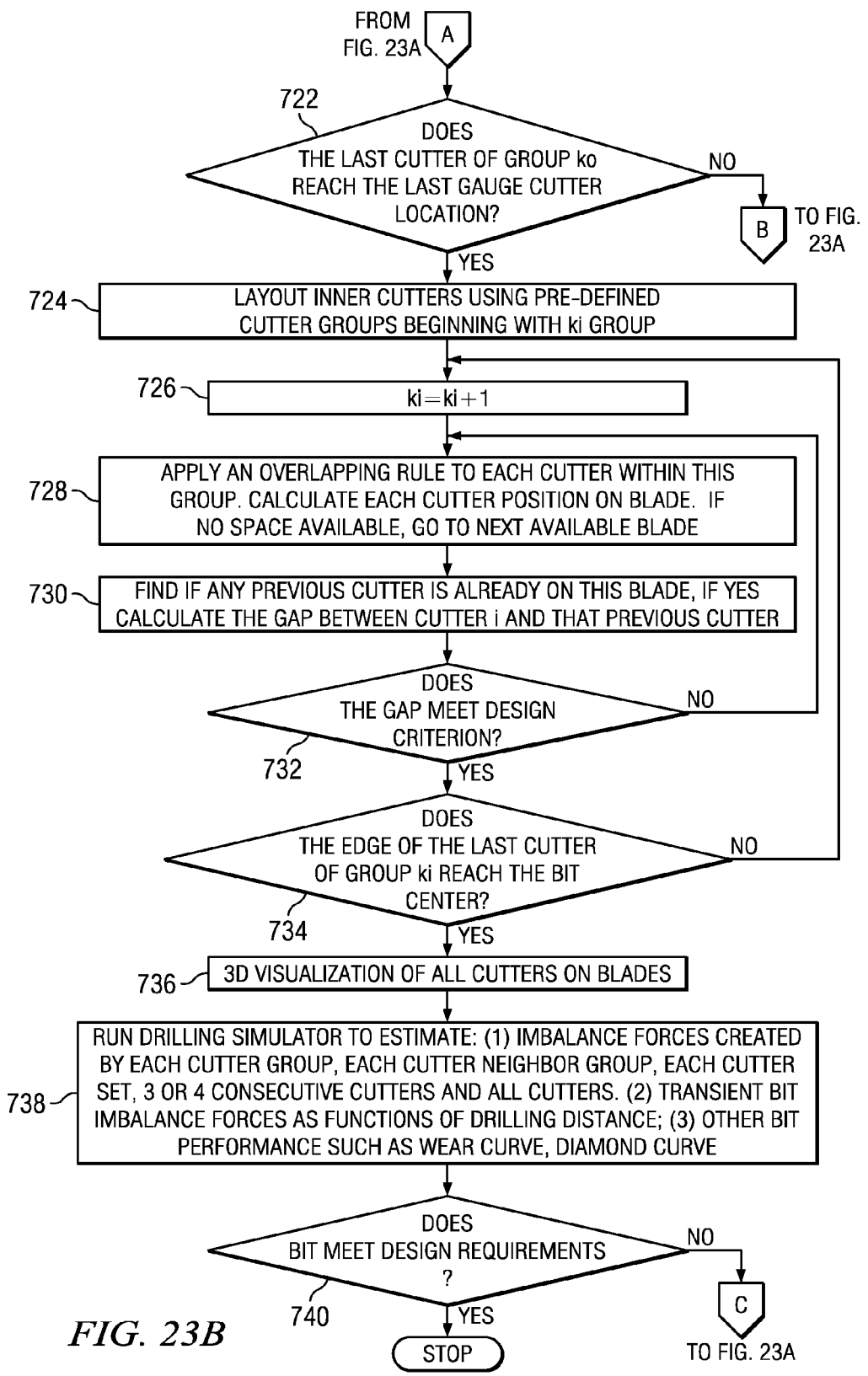

Since rotary drill bit 90 and bottom hole assembly are generally disposed in a wellbore that limits lateral movement, the potential for damage to rotary drill bit 90 and/or components of bottomhole assembly 26 may significantly increase as imbalance forces applied to rotary drill bit 90 increase. Fixed cutter rotary drill bit 90 may remain generally force balanced during drilling conditions such as all cutting elements 60 engaged with generally uniform downhole formation layer 42. Various methods and techniques of the present disclosure such as shown in FIGS. 1D and 23A-23B may be used to evaluate transient imbalance forces acting on a downhole drilling tool.

Simulations of rotary drill bits 90 and 100 or other downhole drilling tools such as core bit 500 or reamer 600 forming wellbores may use six parameters to define or describe downhole drilling motion. These parameters include rotational speed in revolutions per minutes (RPM) and rate of penetration (ROP) relative to an associated rotational axis. Tilt rate relative to an x axis and a y axis extending from the associated rotational axis may be used during simulation of directional drilling. See wellbore 30a in FIG. 1A. The rate of lateral penetration along a x axis and the rate of lateral penetration along a y axis may also be used to simulate forming a wellbore in accordance with teachings of the present disclosure. See FIGS. 1D, 23A and 23B. The x axis and y axis may extend perpendicular from each other and from an associated bit rotational axis.

For simulation purposes, rate of penetration may remain constant and weight on bit (WOB) may vary. During actual drilling of a wellbore at a field location, weight on bit will often be maintained relatively constant and rate of penetration may vary accordingly depending upon various characteristics of associated downhole formations.

Fixed cutter rotary drill bits and other downhole drilling tools may be designed and manufactured at least in part based on simulations using multilevel balancing techniques. Such simulations may include assigning cutting elements to respective cutter groups and cutter sets evaluating forces acting on the cutting elements in each cutter group and cutter set, and evaluating resulting imbalance forces acting on associated rotary drill bit or other downhole drilling tool. Design features of cutting elements in each cutter group and cutter set and/or locations for installing the cutting elements may be modified using iterative processes such as shown in FIGS. 1D and 23A-23B to reduce or eliminate resulting bit imbalance forces.

FIG. 1D shows one example of techniques or procedures which may be used to design fixed cutter rotary drill bits and other downhole drilling tools based at least in part on multilevel force balancing to substantially reduce and/or eliminate imbalance forces acting on a rotary drill bit and other downhole drilling tools. Method 400 may begin at step 402 by inputting into a general purpose computer or special purpose computer (not expressly shown) various characteristics of a downhole drilling tool such as rotary drill bits 100, core bit 500 and/or reamer 600. Examples of such downhole drilling tool characteristics are shown in Appendix A at the end of this Written Description.

At step 404 various downhole drilling conditions may be inputted into the general purpose computer or special purpose computer. Examples of such downhole drilling conditions are shown in Appendix A. At step 406 a drilling simulation may start with initial engagement between one or more cutters of a fixed cutter drill bit or other downhole drilling tool and a generally flat surface of a first downhole formation layer at the downhole end of a wellbore. A standard set of drilling conditions may include one hundred twenty (120) revolutions per minute (RPM), rate of penetration (ROP), thirty (30) feet per hour, first formation strength 5,000 psi and second formation strength 18,000 psi. See for example rotary drill bit 90 and portions of wellbore 30 in FIG. 7.

Respective forces acting on cutting elements disposed on the fixed cutter drill bit or other downhole drilling tool may be evaluated during initial contact between each cutting element and the first downhole formation. Respective forces acting on each cutting element may be evaluated versus depth of penetration of the rotary drill bit or other downhole drilling tool into the first downhole formation. The resulting forces acting on the associated rotary drill bit or other downhole drilling tool may then be calculated as a function of drilling depth at step 410. See for example FIGS. 7, 8A-8D, 20A-20G and 22A-22J.

The drilling simulation may continue to step 412 corresponding with forming the wellbore through the first downhole formation and into a second downhole formation. See FIG. 7. Respective forces acting on each cutting element engaged with the first downhole formation and respective forces acting on each cutting element engaged with the second downhole formation may then be evaluated at step 416. Resulting forces acting on the fixed cutter rotary drill bit or other downhole drilling tool may then be evaluated as a function of drilling depth in step 418. See for example FIGS. 7 and 8A-8D, 20A-20G and 22A-22J. At step 420, resulting forces acting on the fixed cutter rotary drill bit or other downhole drilling tool may be displayed as a function of drilling depth. See FIGS. 7 and 8A-8D, 20A-20G and 22A-22J.

If the resulting forces acting on the fixed cutter rotary drill bit or other downhole drilling tool meet design requirements for a multilevel force balanced drilling tool at step 422, the simulation may stop. The downhole drill tool characteristics may then be used to design and manufacture the fixed cutter rotary drill bit or other downhole drilling tool in accordance with teachings of the present disclosure.

If the resulting forces acting on the fixed rotary cutter drill bit or other downhole drilling tool do not meet design requirements for a multilevel forced balance drilling tool at step 422, the simulation may proceed to step 426 and at least one downhole drilling tool characteristic may be modified. For example, the location, orientation and/or size of one or more cutting elements may be modified. The configuration, dimensions and/or orientation of one or more blades disposed on exterior portions of the downhole drilling tool may be modified.

The simulation may then return to step 402 and method 400 may be repeated. If the simulation based on the modified downhole drilling tool characteristics are satisfactory at step 422, the simulation may stop. If the conditions for a multilevel force balanced drilling tool are not satisfied at step 422, further modifications may be made to at least one downhole drilling tool characteristic at step 426 and the simulation continued starting at step 402 and method 400 repeated until the conditions for a multilevel forced balanced downhole drilling tool are met at step 422.

Figure 2A:
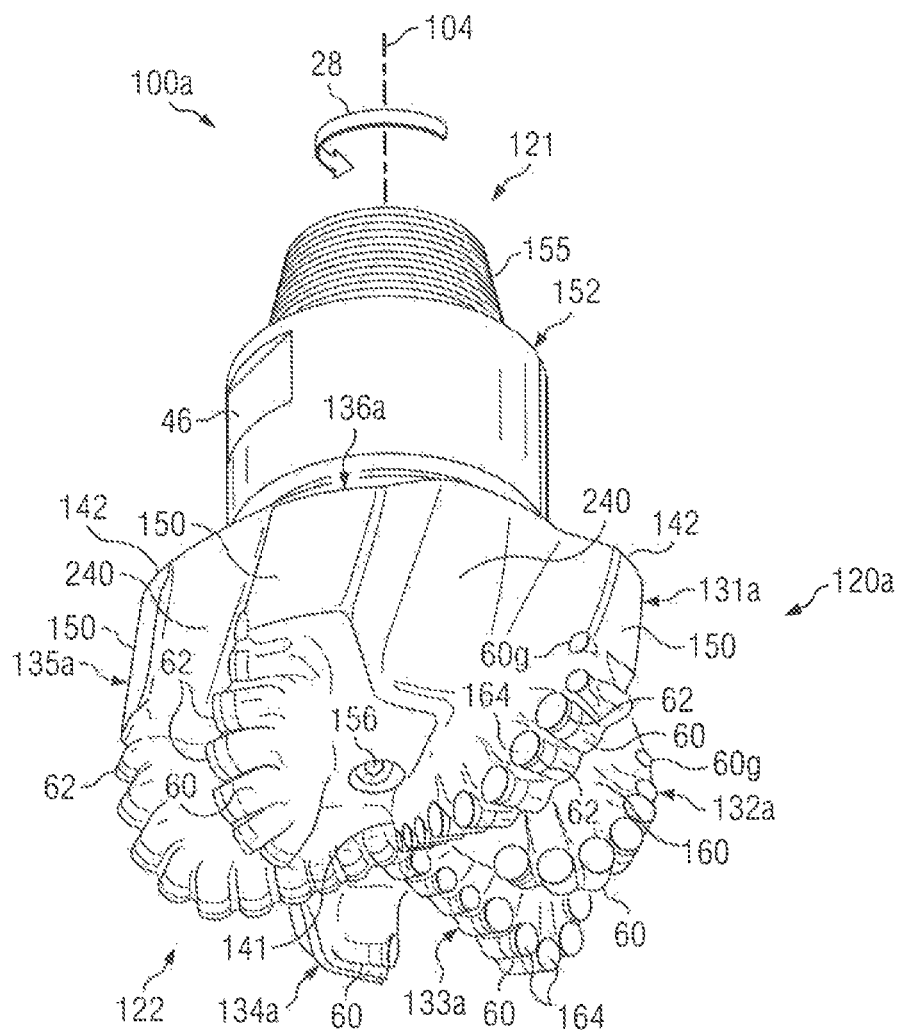
FIG. 2A is a schematic drawing showing an isometric view of a fixed cutter drill bit oriented in a generally downhole direction which may incorporate teachings of the present disclosure.

FIGS. 2A and 2B show rotary drill bits 100a and 100b which may be designed and manufactured using multilevel force balancing techniques in accordance with teachings of the present disclosure. Rotary drill bits 100a and 100b have respective bit bodies 120a and 120b. Respective blades 131a-136a and 131b-136b may be disposed on exterior portions of bit bodies 120a and 120b.

For some applications, bit bodies 120a and 120b may be formed in part from a respective matrix of very hard materials associated with matrix drill bits. For other applications, bit bodies 120a and 120b may be machined from various metal alloys satisfactory for use in drilling wellbores in downhole formations.

First end or uphole end 121 of each bit body 120a and 120b may include shank 152 with American Petroleum Institute (API) drill pipe threads 155 formed thereon. Threads 155 may be used to releasably engage respective rotary drill bit 100a and 100b with bottomhole assembly 26 whereby each rotary drill bit 100a and 100b may be rotated relative to bit rotational axis 104 in response to rotation of drill string 24. Bit breaker slots 46 may be formed on exterior portions of upper portion or shank 152 for use in engaging and disengaging each rotary drill bits 100a and 100b with drill string 24. An enlarged bore or cavity (not expressly shown) may extend from first end 121 through shank 152 and into each bit body 120a and 120b. The enlarged cavity may be used to communicate drilling fluids from drill string 24 to one or more nozzles 156.

Second end or downhole end 122 of each bit body 120a and 120b may include a plurality of blades 131a-136a and 131b-136b with respective junk slots or fluid flow paths 240 disposed therebetween. Exterior portions of blades 131a-136a and 131b-136b and respective cutting elements 60 disposed thereon may define in part bit face disposed on exterior portions of bit body 120a and 120b respective proximate second end 122.

Blades 131a-136a may extend from second end or downhole end 122 towards first end or uphole end 121 of bit body 120a at an angle relative to exterior portions of bit body 120 and associated bit rotational axis 104. Blades 131a-136a may be described as having a spiral or spiraling configuration relative to associated bit rotational axis 104. Blades 131b-136b disposed on exterior portions of bit body 120b may extend from second end or downhole end 122 towards first end or uphole end 121 aligned in a generally parallel configuration with respect to each other and associated bit rotational axis 104. See FIG. 2B.

Respective cutting elements 60 may be disposed on exterior portions of blades 131a-136a and 131b-136b in accordance with teachings of the present disclosure. Rotary drill bit 100b may include a plurality of secondary cutters or backup cutters 60a disposed on exterior portions of associated blades 131b-136b. For some applications each cutting element 60 and backup cutting element 60a may be disposed in a respective socket or pocket (not expressly shown) formed on exterior portions of associated blade 131a-136a or 131b-136b at locations selected in accordance with teachings of the present disclosure. Impact arrestors (not expressly shown) may also be disposed on exterior portions of blades 131a-136a and/or 131b-136b in accordance with teachings of the present disclosure.

Fixed cutter rotary drill bits 100 and 100a may be described as having a "single blade" of cutting elements disposed on the leading edge of each blade. Fixed cutter rotary drill bits 100b may be described as having "dual blades" of cutting elements disposed on exterior portions of each blade. Many of the features of the present disclosure will be described with respect to fixed cutter rotary drill bits and other downhole drilling tools having a "single blade" of cutting elements. However, teachings of the present disclosure may also be used with fixed cutter rotary drill bits and downhole drilling tools such as reamers and hole openers which have "dual blades" of cutting elements disposed on associated blades. See FIGS. 2B and 4.

Cutting elements 60 and 60a may include respective substrates (not expressly shown) with respective layer 62 of hard cutting material disposed on one end of each respective substrate. Layer 62 of hard cutting material may also be referred to as "cutting layer" 62. Cutting surface 164 on each cutting layer 62 may engage adjacent portions of a downhole formation to form wellbore 30. Each substrate may have various configurations and may be formed from tungsten carbide or other materials associated with forming cutting elements for rotary drill bits.

Tungsten carbides include monotungsten carbide (WC), ditungsten carbide ($W_2C$), macrocrystalline tungsten carbide and cemented or sintered tungsten carbide. Some other hard materials which may be used include various metal alloys and cermets such as metal borides, metal carbides, metal oxides and metal nitrides. For some applications, cutting layers 62 and an associated substrate may be formed from substantially the same materials. For some applications, cutting layers 62 and an associated substrate may be formed from different materials. Examples of materials used to form cutting layers 62 may include polycrystalline diamond materials including synthetic polycrystalline diamonds. One or more of cutting element features including, but not limited to, materials used to form cutting elements 60 may be modified based on simulations using method 400.

For some applications respective gage pads 150 may be disposed on exterior portions of each blade 131a-136a and 131b-136b proximate respective second end 142. For some applications gage cutters 60g may also be disposed on each blade 131a-136a. Additional information concerning gage cutters and hard cutting materials may be found in U.S. Pat. Nos. 7,083,010, 6,845,828, and 6,302,224. Additional information concerning impact arrestors may be found in U.S. Pat. Nos. 6,003,623, 5,595,252 and 4,889,017.

Rotary drill bit 100a as shown in FIG. 2A may be generally described as having three primary blades 131a, 133a and 135a and three secondary blades 132a, 134a and 136a. Blades 131a, 133a and 135a may be described as "primary blades" because respective first ends 141 of each blade 131a, 133a and 135a may be disposed closely adjacent to associated bit rotational axis 104. Blades 132a, 134a and 136a may be generally described as "secondary blades" because respective first ends 141 may be disposed on downhole end 122 spaced from associated bit rotational axis 104.

Rotary drill bit 100b as shown in FIG. 2B may be generally described as having three primary blades 131b, 133b and 135b. Rotary drill bit 100b may also include four secondary blades 132b, 134b, 136b and 137b.

Blades 131a-136a and 131b-137b may be generally described as having an arcuate configuration extending radially from associated bit rotational axis 104. The arcuate configuration of the blades 131a-136a and 131b-137b may cooperate with each other to define in part generally cone shaped or recessed portion 160 disposed adjacent to and extending radially outward from associated bit rotational axis 104. Recessed portion 160 may also be described as generally cone shaped. Exterior portions of blades 131-136 associated with rotary drill bit 100 along with associated cutting elements 60 disposed thereon may also be described as forming portions of the bit face or cutting disposed on second or downhole end 122.

Various configurations of blades and cutting elements may be used to form cutting structures for a rotary drill bit or other downhole drilling tool in accordance with teachings of the present disclosure. See, for example, rotary drill bits 100, 100a and 100b, core bit 500 and reamer 600. For some applications, the layout or respective locations for installing each cutting element on an associated blade may start proximate a nose point on one of the primary blades. For example see FIGS. 11A, 11B, 13A-13D, 14A-14C, 15 and 21A-21B.

Core bit 500 may be generally described as having bit body 520 with shank 540 extending therefrom. Core bit 500 may have a generally longitudinal bore or passageway 508 extending from first end 501 through core bit 500 to second end 502. The longitudinal bore 508 may be generally aligned and disposed consistent with associated bit rotational axis 104. Interior portions of longitudinal bore 508 (not expressly shown) may be modified to retain a sample or "core" from a downhole formation therein. A plurality of blades 531-537 may be disposed on exterior portions of bit body 520. A plurality of cutting elements 60 may be disposed on exterior portions of blades 531-537 in accordance with teachings of the present disclosure. Placing cutting elements on exterior portions of respective blades 531-537 using multiforce level balancing techniques may substantially reduce or eliminate bit imbalance forces and excessive vibration of the drill string.

Figure 4:
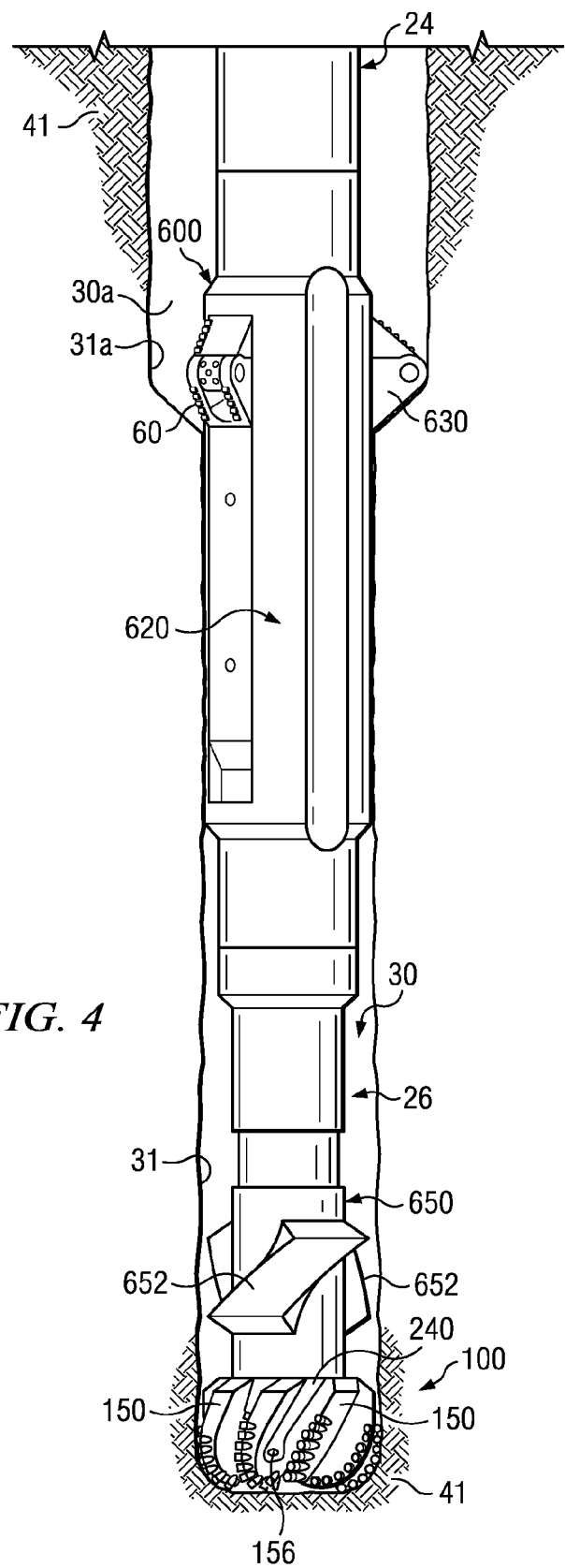
FIG. 4 is a schematic drawing in elevation and in section with portions broken away showing various downhole drilling tools including, but not limited to, a reamer or hole opener and a fixed cutter drill bit incorporating teachings of the present disclosure.

Reamer 600 as shown in FIG. 4 may sometimes be referred to as a "hole opener". Reamer 600 may include generally cylindrical body 620 with a plurality of retractable arms 630 may be disposed on exterior portions thereof. Generally cylindrical body 620 may include a longitudinal bore extending therethrough (not expressly shown) to communicate drilling fluids from drill string to rotary drill bit 100. Cylindrical body 620 may also include a rotational axis (not expressly shown) generally aligned with rotational axis 104 of rotary drill bit 100 while drilling portions of a straight wellbore such as wellbore 30 shown in FIG. 1A. Various mechanisms and techniques may be satisfactorily used to extend and retract retractable arms 630 relative to generally cylindrical body 620.

Respective cutting elements 60 may be disposed on each retractable arm 630 at respective locations based at least in part on multilevel force balancing techniques incorporating teachings of the present disclosure. Retractable arms 630 may extend radially outward so that engagement between cutting elements 60 and adjacent portions of downhole formation may large or increase the diameter of wellbore 30. The increased diameter portion is designated as 31a in FIG. 4.

Various downhole drilling tools including, but not limited, near bit sleeve or near bit stabilizer 650 may be disposed between reamer 600 and rotary drill bit 100. Stabilizer 650 may include a plurality of blades 652 extending radially therefrom. Engagement between exterior portions of blades 652 and adjacent portions of wellbore 30 may be used to maintain desired alignment between rotary drill bit 100 and adjacent portions of bottom hole assembly 26.

Figure 5A:
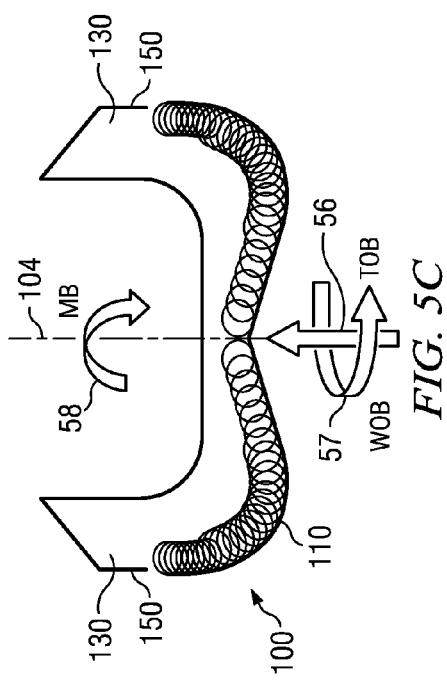
FIGS. 5A and 5B are schematic drawings showing examples of forces which may act on respective cutting elements while forming a wellbore using fixed cutter rotary drill bit.
Figure 5C:
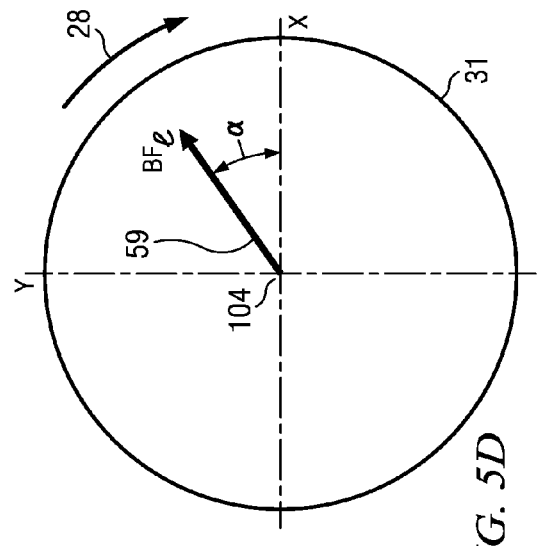
FIGS. 5C and 5D are schematic drawings showing a summation of forces or resulting forces such as bit axial force, torque on bit (TOB), moment on bit (MB) and bit lateral force acting on the rotary drill bit of FIGS. 5A and 5B.
Figure 5B:
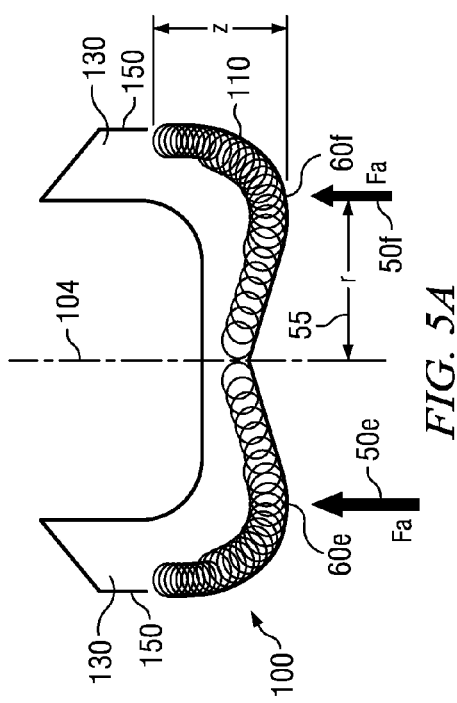
Figure 5D:
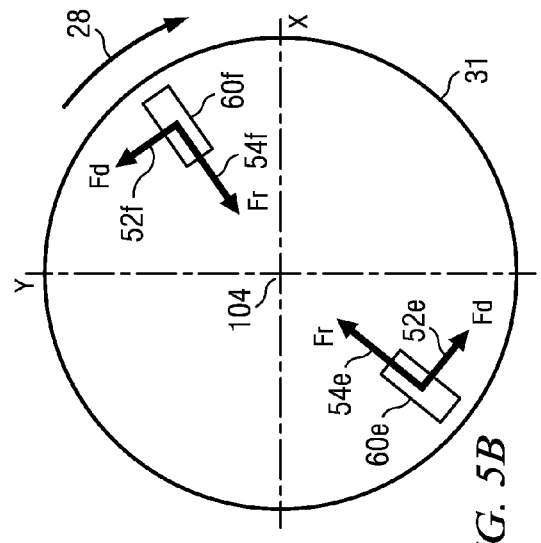

FIGS. 5A and 5B are schematic drawings showing basic forces which act on respective cutting elements 60 disposed on exterior portions of fixed cutter rotary drill bit 100. FIGS. 5C and 5D are schematic drawings showing resulting bit forces or reactive bit forces acting on fixed cutter rotary drill bit 100. FIGS. 5A and 5C show a composite bit face profile 110 associated with fixed cutter rotary drill bit 100. Composite bit face profile 110 may be generally described as a projection of blades 131-136 and associated cutting element 60 onto a radial plane extending generally parallel with bit rotational axis 104 and bisecting bit body 120. Bit rotational axis 104 extends through the middle of composite bit face profile 110 as shown in FIGS. 5A and 5B.

Three basic forces (penetration force or axial force ($F_a$), cutting force or drag force ($F_d$), and side force or radial force ($F_r$)) generally act on each cutting element of a downhole drilling tool engaged with adjacent portions of a downhole formation. For cutting elements 60e and 60f respective penetration forces or axial forces ($F_a$) are represented by arrows, 50e and 50f. See FIG. 5A. Respective cutting forces or drag forces ($F_d$) acting on cutting elements 60e and 60f are represented by arrows 52e and 52f. Respective side forces or radial forces ($F_r$) acting on cutting elements 60e and 60f are represented by arrows 54e and 54f. See FIG. 5B.

Resulting bit forces or reactive bit forces acting on rotary drill bit 100 include bit axial force ($BF_a$) represented by arrow 56. The bit axial force ($BF_a$) may correspond generally with weight on bit (WOB). Resulting forces or reactive forces acting on rotary drill bit 100 also include torque on bit (TOB) represented by arrow 57 and bit moment (MB) represented by arrow 58. See FIG. 5C. Bit lateral force ($BF_l$) represented by arrow 59 in FIG. 5D in the summation of cutting element 60 drag forces and radial forces. Reactive forces acting on bit 100 correspond with the summation of respective forces ($F_a$, $F_d$ and $F_r$) applied to each cutting element 60 disposed on exterior portions of fixed cutter rotary drill bit 100.

Bit lateral force ($BF_l$) represented by arrow 59 in FIG. 5D may be further divided into two component vectors bit lateral drag force ($BF_d$) and bit lateral radial force ($BF_l$). Bit lateral drag force ($BF_d$) represents the sum of all drag forces ($F_d$) acting on all cutting elements 60 and bit lateral radial force ($BL_r$) represents the sum of all radial forces ($F_r$) acting on all cutting elements 60.

Bit moment (MB) may be divided into two vectors: bit axial moment ($MB_a$) corresponding with the sum of axial moments acting on all cutting elements 60 and bit lateral moment ($MB_l$) corresponding with the sum of all lateral moments acting on all cutting elements 60. The respective axial moment associated with each cutting element 60 may be determined by multiplying the radius from each cutting element to bit rotational axis 104 by the respective axial force ($F_a$). For cutting element 60f, the associated cutting element axial moment is equal to radius 55 multiplied by axial force ($F_a$). See FIG. 5A.

The lateral moment for each cutting element 60 is equal to the respective radial force ($F_r$) applied to each cutting element multiplied by a distance from each cutting element 60 to a pre-determined point on bit rotational axis 104.

Forces acting on each cutting element may be a function of respective cutting element geometry, location and orientation relative to associated bit body 120, bit rotational axis 104, respective downhole formation properties and associated downhole drilling conditions. See Appendix A. For some applications each cutting element 60 may be divided into multiple cutlets and the bit forces summarized for each cutlet on the associated cutting element 60. Design and manufacture of fixed cutter rotary drill bit 100 with cutting elements 60 disposed at selected locations to minimize both bit lateral forces and bit moments based at least in part on multilevel force balancing may result in satisfactorily managing associated bit imbalance forces.

Figure 6C:
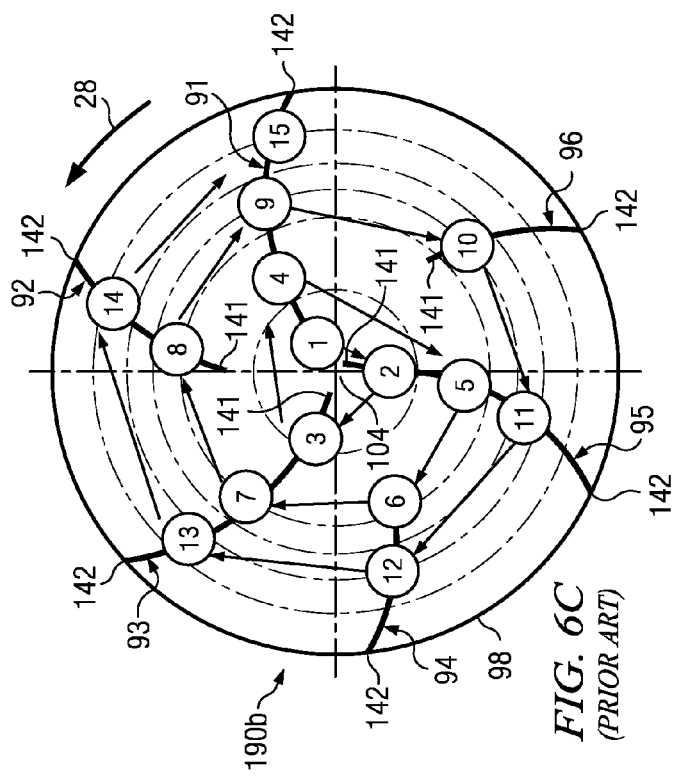
FIGS. 6A-6D are schematic drawings showing the downhole end of a rotary drill bit and examples of prior techniques for placing cutting elements on exterior portions of associated blades.
Figure 6D:
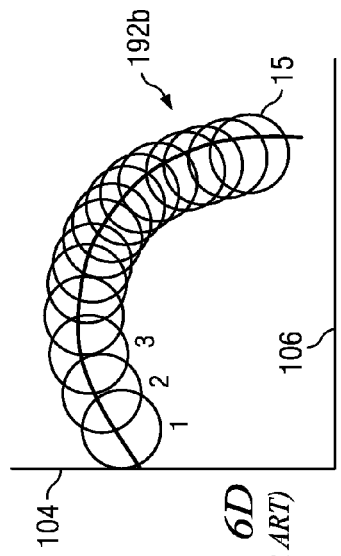
Figure 6A:
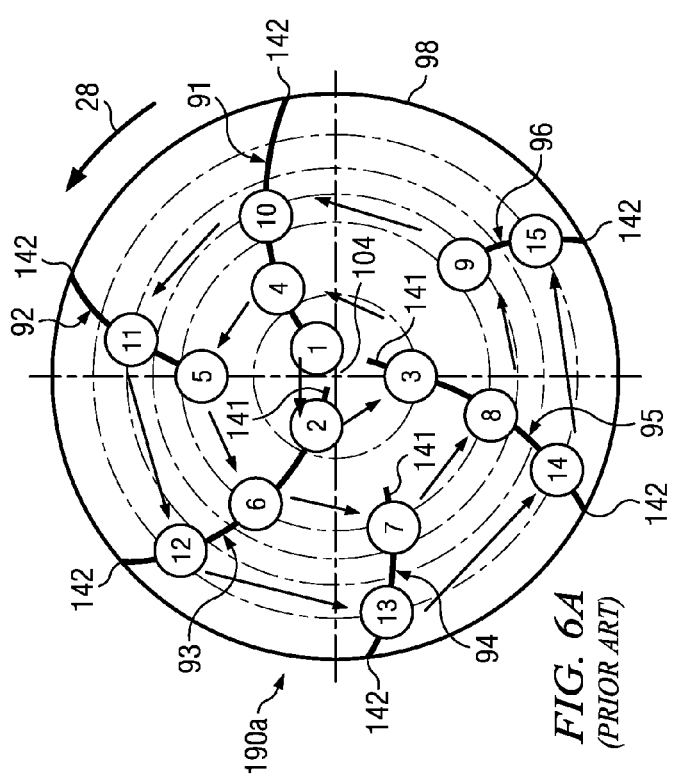
Figure 6B:
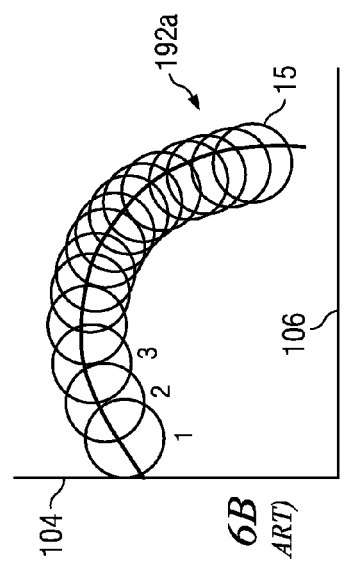

FIGS. 6A-6D show examples of prior layout procedures or techniques used to select locations for placing cutting elements on exterior portions of blades disposed on an associated bit body starting from an associated bit rotational axis and extending radially outward in the direction of bit rotation or in a reverse direction relative to the direction of bit rotation. FIGS. 6A and 6C are schematic drawings showing downhole end or cutting face 190a and 190b. Portions of corresponding composite cutting face profiles 192 are shown in FIGS. 6B and 6D.

Blades 91, 93 and 95 may be described as "primary blades" because respective first end 141 of each blade 91, 93 and 95 is disposed closely adjacent to bit rotational axis 104. Blades 92, 94 and 96 may be described as "secondary blades" because respective first end 141 of each blade 92, 94 and 96 is spaced radially from bit rotational axis 104. Respective second end 142 of each blade 91-96 is radially spaced from bit rotational axis 104 proximate the outside diameter of bit body 98.

For prior fixed cutter rotary drill bits such as represented by cutting face 190a the location for installing the first cutting element was typically selected on the first end of a primary blade closely adjacent to the bit rotational axis. Locations selected for installing additional cutting elements were generally selected in either the direction of bit rotation or in a reverse to bit rotation.

For cutting face 190a in FIG. 6A, the location for installing first cutting element 1 was selected closely adjacent to both bit rotational axis 104 and first end 141 of blade 91. The location for installing second cutting element 2 was selected at a somewhat greater radial distance from bit rotational axis 104 as compared with cutting element 1. Exterior portions of blade 93 provide desired radial spacing from bit rotational axis 104. The difference between the radial spacing of cutting elements 1 and 2 determine the amount of overlap between respective cutting surfaces of cutting elements 1 and 2 on composite cutting face profile 192. See FIG. 6B. The location for installing cutting element 3 was selected at a greater radial distance from bit rotational axis 104 to provide satisfactory overlap with cutting element 2. See FIG. 6B.

For the example represented by cutting face 190a in FIG. 6A, cutting element 3 may be disposed proximate exterior portions of blade 95 spaced from bit rotational axis 104 at a radial distance greater than the radial distance between cutting element 2 and bit rotational axis 104. Again, the difference between the radial spacing from cutting element 3 and bit rotational axis 104 and the radial spacing between element 2 and bit rotational axis 104 determines the amount of overlap between cutting surfaces of cutting elements 2 and 3. See FIG. 6B. The remaining cutting elements 4-15 may be disposed on exterior portions of blades 91-96 continuing in a direction corresponding with the direction of rotation relative to bit rotational axis 104. See arrow 28.

FIGS. 6C and 6D show one example for installing cutting elements 1-15 on exterior portions of associated blades 91-96 in a generally reverse direction relative to the direction of rotation shown by arrow 28. FIGS. 6B and 6D show composite cutting face profiles 192a and 192b with similar cutter locations and overlaps.

Figure 7:
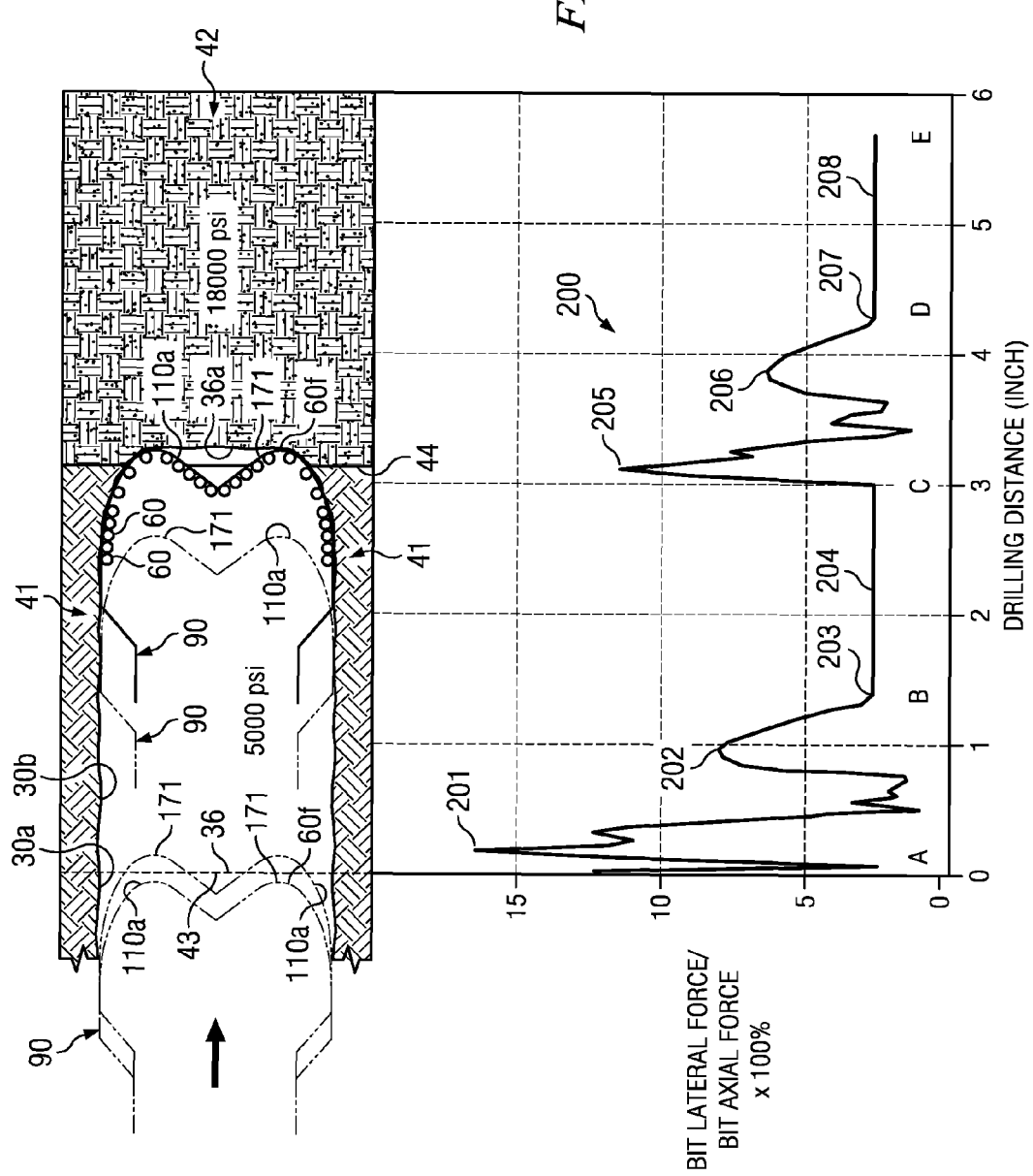
FIG. 7 is a schematic drawing showing one example of a prior art fixed cutter drill bit forming a wellbore and a chart showing imbalance forces versus drilling depth associated with transition drilling or non-uniform downhole drilling conditions.

FIG. 7 is a schematic drawing showing portions of wellbore 30 and various locations of fixed cutter rotary drill bit 90 within wellbore 30. FIG. 7 also includes chart 200 showing initial engagement of drill bit 90 with a first formation layer 41 and imbalance forces associated with drill bit 90 contacting a second downhole formation layer 42 adjacent to first downhole formation layer 41.

Graph 200 demonstrates that prior rotary drill bits with only one level of force balancing, such as all cutting elements engaged with a generally uniform downhole formation, may experience substantial lateral imbalance forces during initial contact with the downhole end of a wellbore and/or during transition drilling from a first downhole formation into a second downhole formation. Transient imbalance forces (bit drag lateral imbalance, bit radial lateral imbalance, bit lateral imbalance and bit axial moment) are typically used with traditional one level force balancing techniques associated with fixed cutter rotary drill bits and other downhole drilling tools. Design criteria used to evaluate traditional force balanced fixed cutter rotary drill bits and other downhole drilling tools may include:

bit drag lateral imbalance force less than 2.5% of total bit axial force;

bit radial lateral imbalance force less than 2.5% of bit axial force;

bit lateral imbalance force less than 4% of bit axial force; and bit axial moment less than 4% of bit torque.

Various computer models and computer programs such as listed in Appendix A are available to evaluate forces acting on each cutting element 60 and any bit imbalance forces.

Chart or graph 200 is also shown adjacent to the schematic drawing of wellbore segments 30a and 30b and downhole formation layers 41 and 42 in FIG. 7. Graph 200 shows substantial imbalance forces that may be applied to a fixed cutter rotary drill bit when a single cutter or a few cutters engage a downhole formation or when the rotary drill bit transits from a first downhole formation into a second downhole formation. See also FIG. 20A.

The portion of wellbore 30 designated as 30a may have been drilled or formed prior to inserting rotary drill bit 90. Simulations were conducted based on inserting rotary drill bit 90 and an associated drill string through previously formed wellbore portion 30a until the extreme downhole end of rotary drill bit 90 contacts surface 43 to drill or form wellbore segment 30b extending through first downhole formation layer 41 and into second downhole formation layer 42. Surface 43 may be described as generally flat and extending substantially normal relative to rotary drill bit 90.

Various techniques may be used to simulate drilling wellbore 30b using rotary drill bit 90 and an attached drill string (not expressly shown) starting with contact between the extreme downhole end of rotary drill bit 90 and surface 43 of first layer 41.

First downhole formation layer 41 may have compressive strength less than the compressive strength of the second downhole formation layer 42. For some simulations, first downhole formation layer 41 may have a compressive strength of approximately 5,000 psi. During the simulation the thickness of the first downhole formation layer 41 may be greater than the length of rotary drill bit 90 such that all cutting elements 60 may be fully engaged with first downhole formation layer 41 prior to the downhole end or rotary drill bit 90 contacting second downhole formation layer 42.

Second downhole formation layer 42 may have a compressive strength greater than the compressive strength of the first downhole formation layer 41. For some simulations second downhole formation layer 42 may have a compressive strength of approximately 18,000 psi. The thickness of the second downhole formation may be greater than the length of rotary drill bit 90 such that all cutting elements may be fully engaged with second downhole formation layer 42.

Some prior fixed cutter drill bits such as rotary drill bit 90 may have only one cutting element 60f disposed on one blade at or near associated nose point 171. If single cutting element 60f is the only point of initial contact between rotary drill bit 90 and generally flat surface 43 at the downhole end of wellbore segment 30a, substantial lateral impact forces may be applied to rotary drill bit 90 and drill string 24. See FIG. 1C.

As drilling depth of rotary drill bit 90 increases into first downhole formation layer 41, substantial imbalance forces may occur as additional cutters 60 engage adjacent portions of first formation layer 41. See peak 201 on graph 200. Peaks 201 and 202 on graph 200 correspond with substantial increases in bit lateral imbalance forces as compared with bit axial force. With increasing depth of drilling or penetration into first formation layer 41, imbalance forces acting on fixed cutter rotary drill bit 90 may gradually reduce. See point 203 on graph 200. A substantially force balanced condition may be met when all cutting elements 60 are engaged with adjacent portions of generally uniform first formation layer 41.

For the example shown in FIG. 7, the ratio of bit lateral imbalance forces relative to total bit axial force applied to rotary drill bit 90 may be relatively constant at a value of approximately 2.5% as represented by generally flat segment 204 of graph 200. Rotary drill bit 90 may be generally be described as force balance for only one level or one condition when all cutting elements are engaged with a generally uniform downhole formation.

Peaks 201, 202, 205 and 206 are representative of the magnitude of transient imbalance forces which may be applied to rotary drill bit 90 during transition drilling through non-uniform downhole drilling conditions represented by first layer 41 and second layer 42 as shown in FIG. 7.

The one level used to force balance rotary drill bit 90 may be violated when downhole end 122 of rotary drill bit 90 initially contacts second downhole formation layer 42. See peak 205 on graph 200. As shown by graph 200, bit lateral imbalance forces may spike or peak if only one cutting element 60 or a relatively small number of cutting elements 60 engage generally harder second formation layer 42 and the other cutting elements 60 remain engaged with relatively softer first downhole formation layer 41.

Simulations show that lateral imbalance force applied to rotary drill bit 90 may occur at peaks 205 and 206 as the depth of drilling increases with additional cutting element 60 engaging harder second downhole formation layer 42. At point 207 on graph 200 all cutting elements 60 disposed on exterior portions of rotary drill bit 90 may be engaged with generally uniform second downhole formation layer 42. Generally horizontal or flat segment 208 of graph 200 represents a generally constant, relatively low amount of bit lateral imbalance force as compared with bit axial force applied to rotary drill bit 90.

Forces on each cutting element 60 engaged with adjacent formation material may be evaluated. Forces acting on various cutter groups selected in accordance which are engaged with the formation material may also be evaluated. Associated bit forces including bit lateral force, bit axial force and bit axial moment may also be calculated and graphed as a function of drilling distance.

The graphs may start from the time the associated rotary drill bit 90 first touches generally flat surface 43 and/or generally flat surface 44. A visual display of all bit forces as a function of drilling distance may then be displayed. See Graph 200 in FIG. 7. Standard default downhole drilling conditions which in step 402 may include RPM equal to 120, rate of penetration equal to 30 ft. per hour, compressive strength of the first downhole formation equal to 5,000 psi and compressive strength of a second formation equal to 18,000 psi.

FIGS. 8A-8D show various imbalance forces acting on fixed cutter rotary drill bit 90 during initial contact with the downhole end of wellbore 30a and imbalance forces associated drilling from first downhole formation layer 41 into harder, second downhole formation layer 42.

Figure 8A:
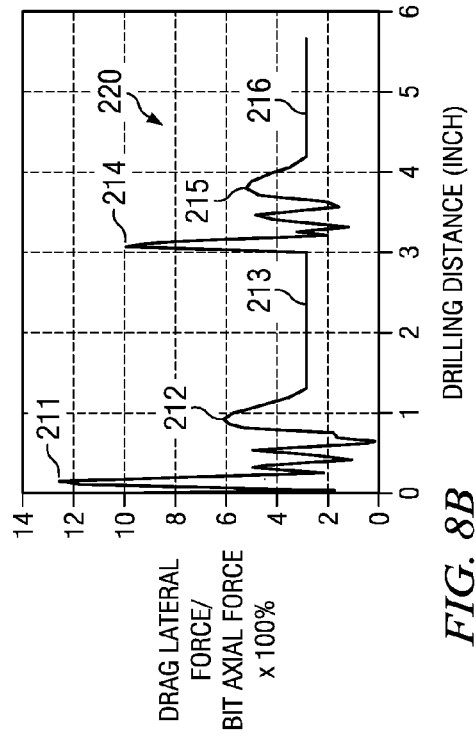
FIGS. 8A-8D are graphical representations of imbalance forces associated with transition drilling such as shown in FIG. 7.

FIG. 8A shows graph 200 of total transient bit lateral imbalance forces as a percentage of transient bit axial force as FIG. 7. The maximum lateral imbalance force represented by peak 201 may be greater than fifteen percent (15%) of total bit axial force.

Figure 8C:
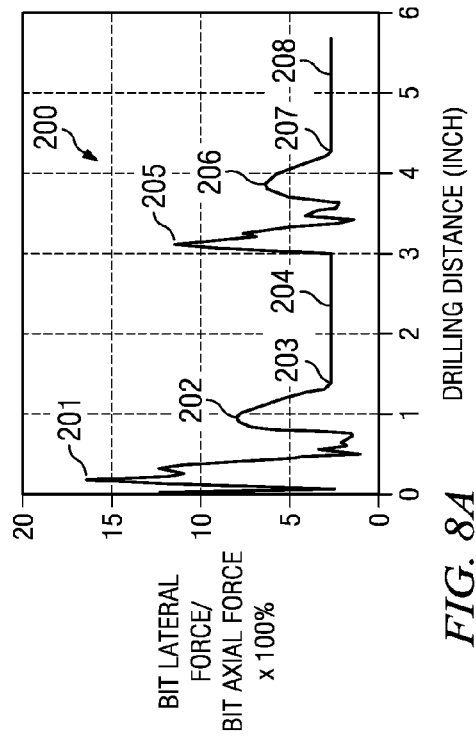
Figure 8B:
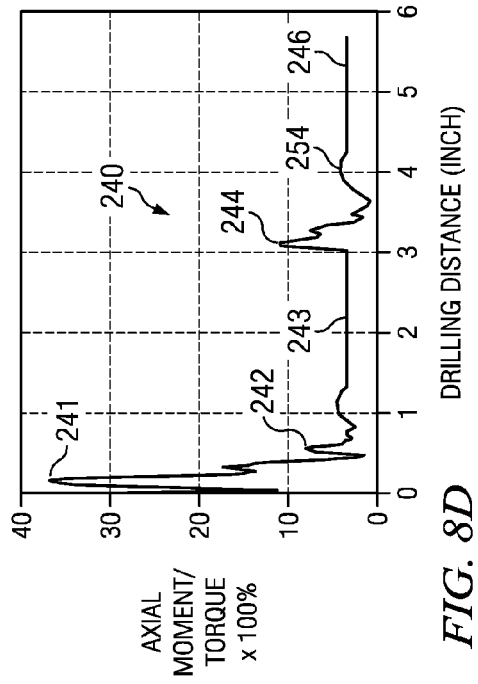

FIG. 8B shows graph 220 of transient bit drag lateral force as a percentage of transient bit axial force versus drilling distance. The maximum drag lateral imbalance force represented by peak 211 may be greater than 12% of total bit axial force. Peaks 212, 214 and 215 correspond generally with similar peaks shown in FIG. 8A.

FIG. 8C shows graph 230 of transient bit radial lateral force as a percentage of transient bit axial force versus drilling distance. Peak 231 indicates that maximum transient radial lateral force may be greater than 8% of total bit axial force. Again, peaks 232, 234 and 235 correspond generally with peaks 202, 205 and 206 in FIG. 8A.

Figure 8D:
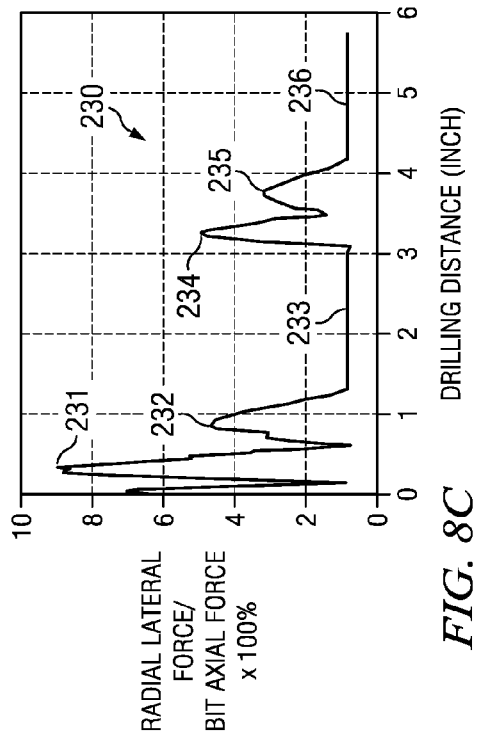

FIG. 8D shows graph 240 of transient bit axial moment as a percentage of transient bit torque versus drilling distance. Peak 241 indicates that the maximum transient axial bending moment may be as high as 35% of bit torque during initial engagement with downhole formation layer 41. Peaks 242 and 244 of graph 240 generally correspond with similar peaks shown in FIG. 8A. Graphs 220, 230 and 240 indicate that fixed cutter rotary drill bit 90 may be described as relatively balanced when all cutting elements are engaged with a generally uniform downhole formation. See for example generally flat segments 213 and 216 in FIG. 8B, generally flat segments 233 and 236 in FIG. 8C and generally flat segments 243 and 246 in FIG. 8D.

Figure 9A:
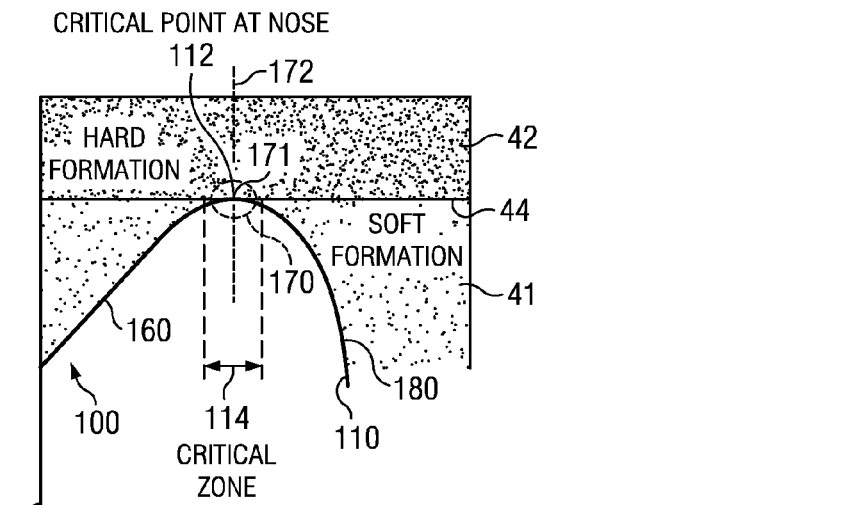
FIGS. 9A, 9B and 9C are schematic drawings showing examples of non-uniform downhole drilling conditions or transition drilling conditions which may effect bit imbalance forces acting on an associated rotary drill bit.
Figure 9B:
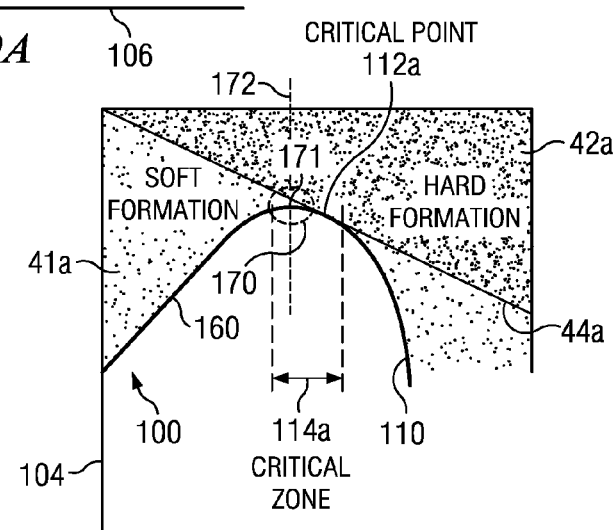
Figure 9C:
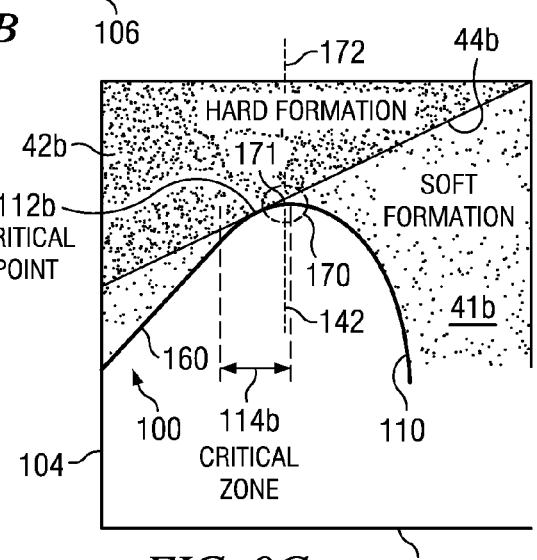

FIGS. 9A, 9B and 9C show examples of a downhole drilling tool engaging a first, softer downhole formation and an adjacent, harder downhole formation. FIGS. 9A, 9B and 9C show examples of the "critical point" or initial point of contact between the downhole drilling tool and downhole formation layers disposed at various angles with respect to each other. Multiforce level balancing techniques may satisfactorily determine selected locations for installing cutting elements on exterior portions of blades on the downhole drilling tool based at lease in part on variations in the hardness of adjacent downhole formations and/or variations in the angle of contacting the two adjacent downhole formations.

The critical point of contact between a downhole drilling tool and respective downhole formations may depend upon orientation of the layers with respect to each other and with respect to the cutting face of a downhole drilling tool during engagement with the respective downhole formations. The critical point may be determined based on dip angle (up dip or down dip) of a transition between a first downhole formation and a second downhole formation relative to the cutting face of the downhole drilling tool.

Simulations of contact between the cutting face of a downhole drilling tool and a first downhole formation layer and a second downhole formation layer may indicate a critical zone with respect to the critical point. See critical zones 114, 114a and 114b in FIGS. 9A, 9B and 9C. The dimensions and location of each critical zone relative to the point of initial contact may depend on various characteristics of the respective downhole formations and characteristics of the cutting face profile on the downhole drilling tool.

Composite bit face profile 110 extending from bit rotational axis 104 may include various segments defined relative to nose point 171 and nose axis 172 extending therethrough. Nose axis 172 may be aligned generally parallel with bit rotational axis 104. Nose point 171 may be defined as the location on bit face profile 110 with maximum elevation as measured bit rotational axis 104 (y axis) from reference line 106 (x axis). Bit face profile 110 may be divided into various segments or zones starting from nose point 171 and/or nose axis 172. Such segments or zones may include, but are not limited to, nose segment 170 represented by a dotted oval in FIGS. 9A, 9B and 9C. Inner segment 160 may extend from bit rotational axis 104 to nose segment 170. Outer segment 180 may extend from nose segment 170 to the end of composite bit face profile 110.

Cutting elements 60 disposed on composite bit face profile 110 between nose segment 170 and bit rotational axis 104 may sometimes be referred to as the "inner cutters" or "cone cutters". Cutting elements 60 disposed on bit face profile 110 between nose segment 170 and the end of bit face profile 110 may be described as "outer cutters" or "shoulder cutters".

In FIG. 9A, first downhole formation layer 41 and second downhole formation layer 42 are shown disposed generally parallel with each other and extending generally perpendicular relative to associated bit rotational axis 104 and nose axis 172. For such downhole drilling actions critical point 112 or the initial point of contact between fixed cutter drill bit 100 and surface 44 on second downhole formation layer 42 may correspond approximately with the location of nose point 171 on composite bit face profile 110. As discussed later, there may be substantial benefits to placing one or more groups of cutting elements within nose segment 170 symmetrically or pseudo-symmetrically aligned with each other relative to nose axis 172.

For downhole drilling conditions represented by FIG. 9B, first downhole formation layer 41a and second downhole formation layer 42a may be inclined relative to each other and with respect to bit rotational axis 104. Surface 44a disposed between first layer 41a and second layer 42a may be generally described as having a "up dip" angle relative to bit rotational axis 104 and an associated wellbore (not expressly shown) formed by rotary drill bit 100.

For downhole drilling conditions such as represented by FIG. 9B, initial point of contact 112a between rotary drill bit 100 and surface 44a may move radially outward from nose point 171 as measured from bit rotational axis 104. The location of critical point 112a may depend in part on the up dip or angle of inclination of surface 44a relative to bit rotational axis 104 and the dimensions and configuration of blades 131-138 and cutting element 60 disposed on rotary drill bit 100.

For downhole drilling conditions such as shown in FIG. 9C, first formation 41b and second formation 42b may be inclined at an angle described as a "down dip" relative to each other and with respect to bit rotational axis 104 and an associated wellbore formed by rotary drill bit 100. As a result, critical point 112*b* may move radially inward as measured from bit rotational axis 104.

FIGS. 10A, 10C, 10E and 10G are schematic drawings showing various components of respective bit faces or cutting faces 126*a*, 126*b*, 126*c* and 126*d* disposed on the downhole end of a fixed cutter rotary drill bit or other downhole drilling tool. FIGS. 10B, 10D, 10F and 10H are schematic drawings showing portions of a composite bit face profile or composite cutting face profile corresponding with the components shown in respective FIGS. 10A, 10C, 10E and 10G. Blades and associated cutting elements discussed with respect to FIGS. 10A-10H may be disposed on exterior portions of fixed cutter rotary drill bit 100, core bit 500 and/or reamer 600. FIGS. 10A-10H show various examples of selecting respective cutter groups for level one multilevel force balancing on associated downhole drilling tool in accordance with teaching of the present disclosure.

Pair Cutter Group

Figure 10C:
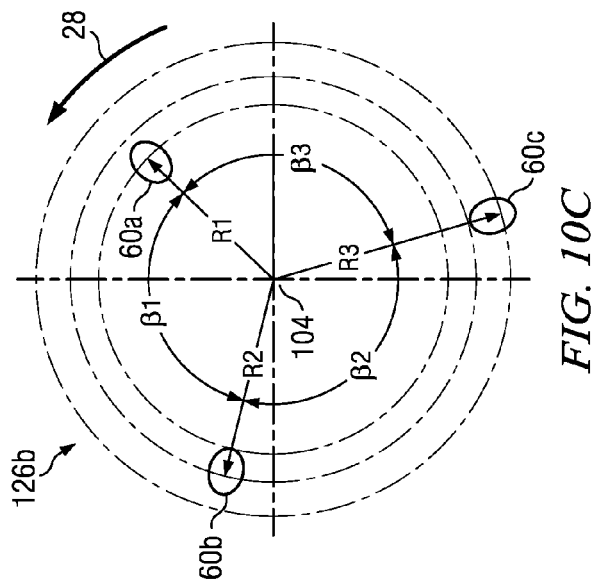
FIGS. 10C and 10D are schematic drawings showing various techniques to select a three cutter group which may be used to multilevel force balance a downhole drilling tool in accordance with teachings of the present disclosure.
Figure 10D:
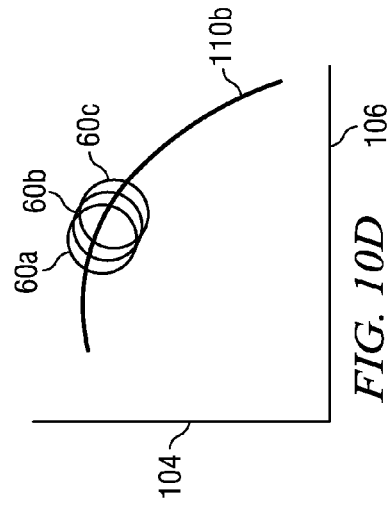
Figure 10A:
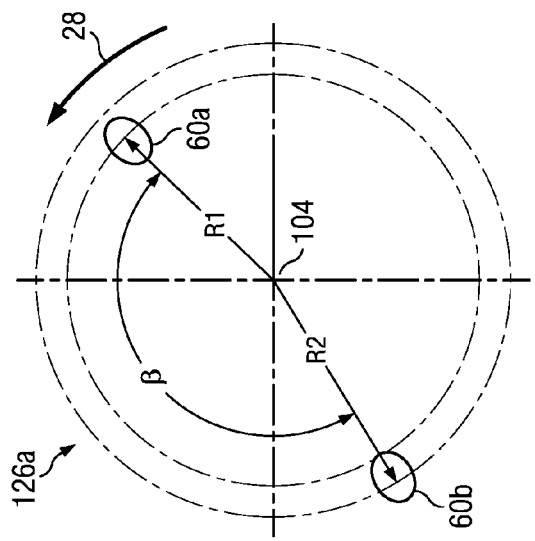
FIGS. 10A and 10B are schematic drawings showing various techniques to select a pair group of cutters which may be used to multilevel force balance a downhole drilling tool in accordance with teachings of the present disclosure.

A pair cutter group such as shown in FIG. 10A may be defined as a pair of cutting elements disposed on exterior portions of an associated cutting face spaced radially between approximately 160° and 200° from each other relative to an associated bit rotational axis. The preferred radial spacing or optimum angle of separation for the first and second cutting elements in a pair cutter group is approximately 180°. The first cutting element and the second cutting element selected for a pair cutter group must be neighbor cutters on an associated composite cutting face profile with less than 100% overlap between associated cutting surfaces. The radius from the second cutting element to the associated bit rotational axis must be greater than the radius from the first cutting element to the associated bit rotational axis.

Figure 10B:
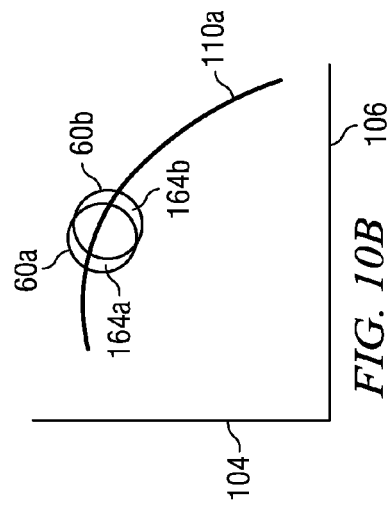

FIGS. 10A and 10B show one example of a "pair cutter group" represented by cutting elements 60*a* and 60*b* which may be disposed on exterior portions of respective blades (not expressly shown). Cutting elements 60*a* and 60*b* represent only one example of a pair cutter group satisfactory for use in level one force balancing an associated downhole drilling tool using multilevel force balancing procedures in accordance with teachings of the present disclosure.

As shown in FIG. 10A, radial distance R2 from bit rotational axis 104 to cutting element 60*b* is greater than the radial distance R1 from bit rotational axis 104 to first cutting element 60*a*. Angle β between cutting element 60*a* and 60*b* relative to rotational axis 104 is approximately 170° which is greater than 160° and less than 200°.

As shown in FIG. 10B, cutting elements 60*a* and 60*b* satisfy the definition of "neighbor cutters" because cutting element 60*a* and cutting element 60*b* are disposed immediately adjacent to each other on cutting face profile 110*a* with less than 100% overlap between respective cutting surfaces 164 and cutting elements 60*a* and 60*b*.

Three Cutter Group

For some embodiments, cutting elements on a bit face or cutting face may be assigned to respective three cutter groups for multilevel force balancing an associated downhole drilling tool in accordance with teachings of the present disclosure. A three cutter group (cutting elements 60*a*, 60*b*, and 60*c*) as shown in FIG. 10C may be defined as three cutting elements disposed on exterior portions of an associated cutting face spaced radially from each other between approximately 100° and 140° relative to an associated bit rotational axis. The preferred radial spacing or optimum angle of separation for the cutting elements in a three cutter group is approximately 120°. The first, second and third cutting elements selected for a three cutter group must be neighbor cutters on an associated composite cutting face profile with less than 100% overlap between associated cutting surfaces. The radius from the third cutting element to the associated bit rotational axis must be greater than the radius from the second cutting element to the associated bit rotational axis. The radius from the second cutting element to the associated bit rotational axis must be greater than the radius from the first cutting element to the associated bit rotational axis.

FIGS. 10C and 10D show one example of a "three cutter group" represented by cutting elements 60*a*, 60*b* and 60*c* which may be disposed on exterior portions of respective blades (not expressly shown). Cutting elements 60*a*, 60*b* and 60*c* represent only one example of a three cutter group satisfactory for use in level one force balancing and associated downhole drilling tools using multilevel force balancing procedures in accordance with teachings of the present disclosure. Angle $\beta_1$ between cutting elements 60*a* and 60*b*, angle $\beta_2$ between cutting elements 60*a* and 60*c* and angle $\beta_3$ between cutting element 60*c* and 60*a* are each greater than 100° and less than 140°. As shown in FIG. 10C radial distance $R_3$ from third cutting element 60*c* and bit rotational axis 104 is greater than radial distance $R_2$ from second cutting element 60*b* and bit rotational axis 104. Radial distance $R_2$ between cutting element 60*c* and bit rotational axis 104 is greater than radial distance $R_1$ between cutting element 60*a* and bit rotational axis 104.

As shown in FIG. 10D, cutting elements 60*a*, 60*b* and 60*c* satisfy the definition of "neighbor cutters" since cutting elements 60*a*, 60*b* and 60*c* are disposed adjacent to each other on composite cutting face profile 110*b* with less than 100% overlap to respective cutting surfaces 164 on the associated composite bit face profile 110.

Four Cutter Group

Figure 10G:
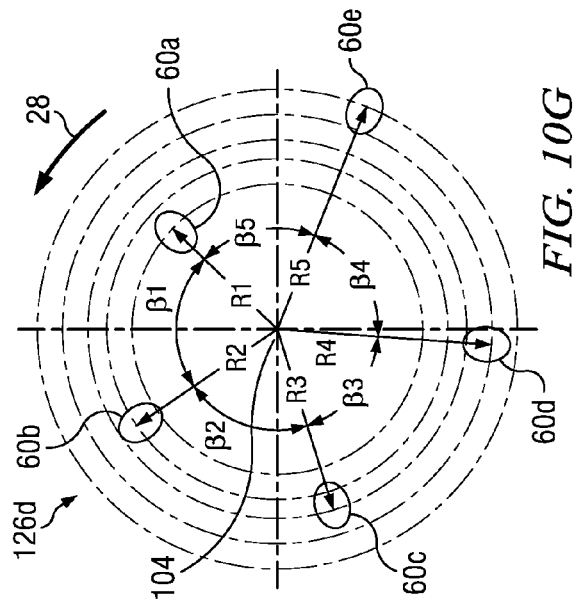
FIGS. 10G and 10H are schematic drawings showing various techniques to select a five cutter group which may be used to multilevel force balance a downhole drilling tool in accordance with teachings of the present disclosure.
Figure 10H:
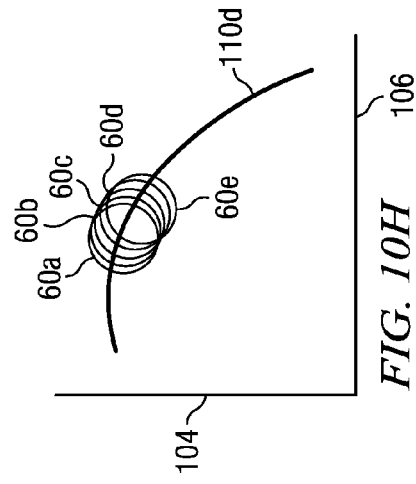
Figure 10E:
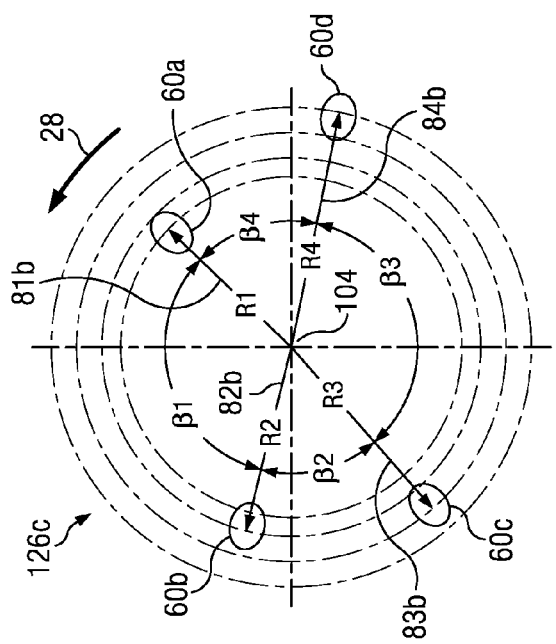
FIGS. 10E and 10F are schematic drawings showing various techniques to select a four cutter group which may be used to multilevel force balance a downhole drilling tool in accordance with teachings of the present disclosure.

For some applications, cutting elements disposed on the cutting face of a downhole drilling tool may be divided into respective four cutter groups. A four cutter group such as shown in FIG. 10E may be defined as four cutting elements disposed on exterior portions have an associated cutting face spaced radially from each other with approximately with the angle of separation between the first and second cutter and approximately equal to the angle of separation between the third and fourth cutting element. The angle of separation between the second and third cutting element should be approximately equal to the angle of separation between the fourth cutting element and the first cutting element.

The first, second, third and fourth cutting elements of a four cutter group should be neighbor cutters on the associated cutting face profile with less than 100% overlap. The fourth cutting element should be spaced at a greater radial distance from the associated bit rotational axis than the third cutting element. The third cutting element should be spaced at a greater radial distance from the associated bit rotational axis than the second cutting element. The second cutting element should be spaced at a greater radial distance from the associated bit rotational axis distance than the first cutting element.

Figure 10F:
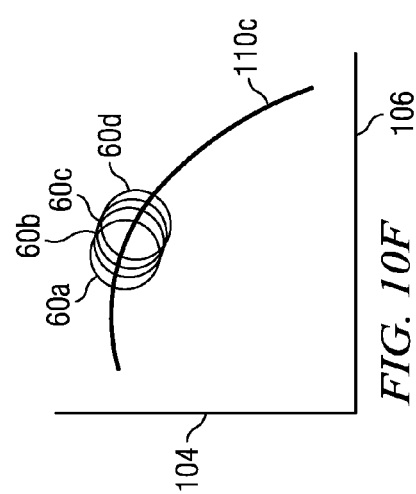

As shown in FIGS. 10E and 10F angle $\beta_1$ between cutting element 60*a* and 60*b* may be approximately equal to angle $\beta_3$ between cutting elements 60*c* and 60*d*. Angle $\beta_2$ between cutting element 60*b* and 60*c* may be approximately equal to angle $\beta_4$ between cutting elements 60*d* and 60*a*. Radius R4 extending between bit rotational axis 104 and cutting element 60*d* is greater than radius R3 extending from bit rotational axis to cutting element 60*c*. Radius R3 associated with cutting element 60*c* is greater than radius R2 from bit rotational axis 104 and cutting element 60*b*. The length of radius R2 between bit rotational axis 104 and cutting element 60b is greater than the length of radius R1 extending between bit rotational axis 104 and cutting element 60a. Cutters 60a-60d on bit face profile 110c as shown in FIG. 10H have less than 100% overlap. Cutting elements 60a, 60b, 60c and 60d are neighbor cutters on the associated bit face profile 110c. See FIG. 10F.

Five Cutter Group

For some applications, the cutting elements disposed on exterior portions of downhole drilling tool may be divided into five cutter groups. The angle of separation (β) between each cutting element and a five cutter group may be approximately 72° plus or minus 20°. The first, second, third, fourth and fifth cutting elements of a five cutter group should be neighbor cutters on an associated cutting face profile with less than 100% overlap. The fifth cutting element should be spaced a greater radial distance from the associated bit rotational axis than the fourth cutting element. The fourth cutting element should be spaced at a greater radial distance from the associated bit rotational axis than the third cutting element. The third cutting element should be spaced at a greater radial distance from the associated bit rotational axis than the second cutting element. The second cutting element should be spaced at a greater radial distance from the associated bit rotational axis than the first cutting element. For the example of a five cutter group as shown in FIGS. 10G and 10H cutting elements 60a-60e satisfy the above rules.

The cutters for each of the previously discussed cutter groups were selected based on respective cutters being laid out in a spiraling direction following the direction of rotation of the downhole drilling tool relative to an associated rotational axis. Similar cutter groups may also be selected for downhole drilling tools with cutters laid out in a spiraling direction reverse from the direction of rotation.

Blade Groups

The number of blades on a downhole drilling tool may be divided into groups depending on the type of cutter groups used for level one force balancing. See table 301 in FIGS. 25A and 25B. The following examples demonstrate dividing blades into blade groups.

EXAMPLE 1

The blades of a five blade downhole drilling tool as shown in FIG. 11A may be divided into two blade groups: (1,3,5) and (2,4), where blades 131, 133 and 135 form the first blade group and blades 132 and 134 form the second blade group. The preferred match for a five blade downhole drilling tool is (1,3,5) (2,4) on table 301 in FIG. 25A. A three cutter group may be laid out on the first blade group (1,3,5). Imbalance forces created by the three cutter group may be balanced or minimized. A pair cutter group may be laid out on the second blade group (2,4). Imbalance forces created by the pair cutter group may be balanced or minimized.

EXAMPLE 2

The blades of an eight blade downhole drilling tool as shown in FIGS. 12A-12D may be divided into four blade groups: (1,5), (2,6), (3,7), (4,8). Four pair cutter groups may be laid out on the four blade groups. Imbalance forces created by each pair cutter group may be balanced or minimized. FIGS. 12A-12D show examples of selecting or laying locations for installing cutting elements of a downhole drilling tool in accordance with teachings of the present disclosure.

Cutter Set

A cutter set includes at least two force balanced neighbor cutter groups. The number of cutters in one cutter set may equal the number of blades on an associated downhole drilling tool. As shown in table 301 of FIG. 25A, a cutter set for a five blade downhole drilling tool may be [(1,3,5) (2,4)] and a cutter set for a eight blade downhole drilling tool may be [(1,5) (2,6) (3,7) (4,8)].

FIGS. 11A and 11B are schematic drawings showing portions of cutting face 126e and composite cutting face profile 110e of a downhole drilling tool with five blades 131-135 disposed thereon. FIGS. 11A and 11B show one example of cutting elements laid out for cutter set [(1,3,5) (2,4)]. Cutting elements 1, 2 and 3 in the first cutter group may be installed on primary blades 131, 133 and 135 and cutting elements 4 and 5 in the second cutter group may be installed on secondary blades 132 and 134.

Cutting elements 1, 2, 3 of the first cutter group are neighbor cutters. Cutting elements 4, 5 in the second cutter group are also neighbor cutters. See composite cutting face profile 110e in FIG. 11B. Imbalance forces created by respective cutting elements in each cutter group may be balanced or minimized by adjusting respective cutter locations, cutter orientations such as back rake, side rake, cutter size and phase angle. See for example arrows 188a and 188b in FIG. 21A.

Level Three and Level Four Force Balanced Cutter Sets

Similar to level four force balanced drilling tools, imbalance forces associated with each cutter set may be balanced at three levels in accordance with teachings of the present disclosure. Level one force balancing of a cutter set balances forces associated with the cutting elements in each cutter group. See, for example, FIGS. 10A-10H. Level two force balancing of a cutter set balances forces associated with the cutting elements in any two neighbor cutter groups in the cutter set. See, for example, FIGS. 11A and 11B. Level three force balancing of a cutter set balances forces associated with all cutting elements in the cutter set.

For example, cutter set [(1,3,5) (2,4)] of a five blade downhole drilling tool shown in FIGS. 11A AND 11B and cutter set [(1,5) (2,6) (3,7) (4,8)] of an eight blade downhole drilling tool shown in FIG. 12A are level three force balanced cutter sets.

Some cutter sets may be level four force balanced cutters sets. Level four force balancing of a cutter set calls for balancing forces associated with an N (N=3 or N=4) consecutive cutting elements in the cutter set. As shown in FIGS. 12A-12D, a downhole drilling tool with eight blades 131-138 has four basic pair blade groups [(1,5), (2,6), (3,7), (4,8)]. Depending on the order of the blade groups in each cutter set, at least six cutter sets may be formed if blade group (1,5) is always kept as the first group:

Cutter Set A: [(1,5) (2,6) (3,7) (4,8)]
Cutter Set B: [(1,5) (2,6) (4,8) (3,7)]
Cutter Set C: [(1,5) (3,7) (4,8) (2,6)]
Cutter Set D: [(1,5) (3,7) (2,6) (4,8)]
Cutter Set E: [(1,5) (4,8) (3,7) (2,6)]
Cutter Set F: [(1,5) (4,8) (2,6) (3,7)]

The following description discusses imbalance forces associated with any four consecutive cutting elements (1,2,3,4), (2,3,4,5), (3,4,5,6), (4,5,6,7), (5,6,7,8).

As shown in FIG. 12A, cutter set A [(1,5) (2,6) (3,7) (4,8)] is used to layout cutters on bit face 126f. Imbalance forces associated with cutters (2,3,4,5) may not be balanced because these four cutters are located on one side of the bit face 126f. Imbalance forces associated with cutters (4,5,6,7)

also may not be balanced for the same reason. Therefore, cutter set A [(1,5) (2,6) (3,7) (4,8)] is not a level four force balanced cutter set.

Figure 12B:
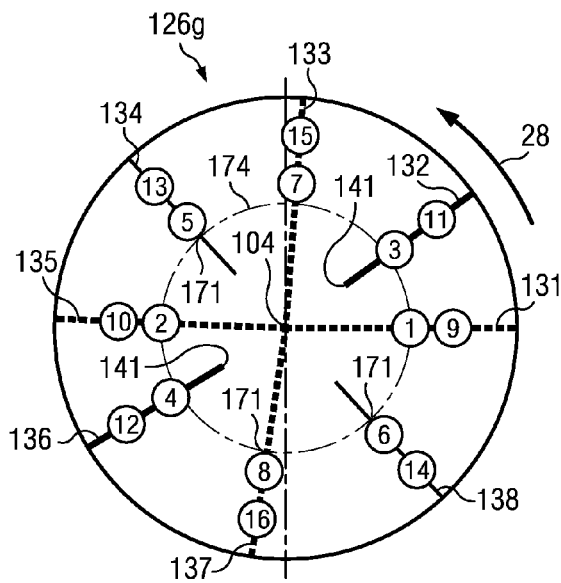

As shown in FIG. 12B, cutter set B [(1,5) (2,6) (4,8) (3,7)] is used to layout cutters on bit face 126g. Imbalance forces associated with cutters (2,3,4,5) and imbalance forces associated with cutters (6,7,8,9) may not be balanced because these cutters are located on one side of bit body, respectively. Therefore, cutter set B [(1,5) (2,6) (4,8) (3,7)] is not a level four force balanced cutter set.

Figure 12C:
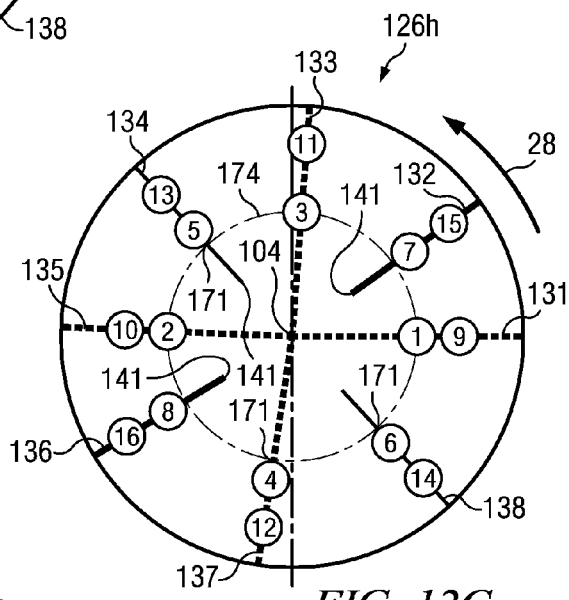

As shown in FIG. 12C, cutter set C [(1,5) (3,7) (4,8) (2,6)] is used to layout cutters on bit face 126h. Imbalance forces associated with cutters (2,3,4,5) and imbalance forces associated with cutters (6,7,8,9) may not be balanced because these cutters are located on the same side of cutting face 126h. Therefore, cutter set C [(1,5) (3,7) (4,8) (2,6)] is not a level four force balanced cutter set.

Figure 12D:
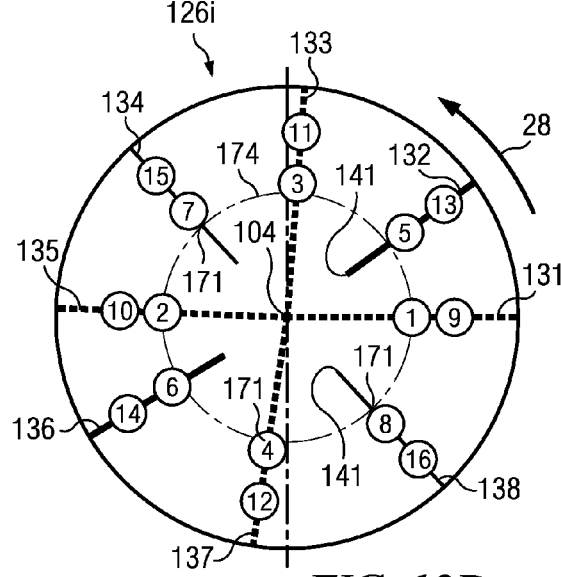

As shown in FIG. 12D, cutter set D [(1,5) (3,7) (2,6) (4,8)] is used to layout cutters on bit face 126i. Imbalance forces associated with neighbor cutter groups (1,2,3,4), (3,4,5,6) and (5,6,7,8) may be well balanced. Respective imbalance forces associated with cutters (2,3,4,5) and (4,5,6,7) may be minimized because the angle between these cutters is over 220 degrees. Therefore, cutter set D [(1,5) (3,7) (2,6) (4,8)] may be a level four force balanced cutter set.

Table 302 in FIG. 26 shows the preferred match for an eight blade downhole drilling tool. Cutter layout using cutter set D for an eight blade downhole drilling tool may lead to more stable balanced drilling than cutter sets A, B and C and therefore is the preferred cutter set.

The cutting faces shown in FIG. 12A-12D demonstrate that the order of neighbor cutter groups within a cutter set may play a significant role in design of multilevel force balanced downhole drilling tools. If several cutter sets exist for a given number of blades, then level four force balanced cutter sets should first be considered for laying out cutter locations. For downhole drilling tools with only three or four blades, level four force balanced cutter sets may not exist. Only level three force balanced cutter sets may be available.

For a given number of blades, Table 301 in FIGS. 25A and 25B lists possible cutter sets. Table 302 in FIG. 26 lists preferred level four force balanced cutter sets for a given number of blades. The number of consecutive cutting elements N (N=3 or N=4) used for level four force balancing depends on the number of blades and cutter sets. For example, for a nine blade drill bit, if cutter set [(1,4,7) (2,5,8) (3,6,9)] is used to layout cutters, then N=3. See FIGS. 17 and 26.

Outer Cutter Set

Figure 13A:
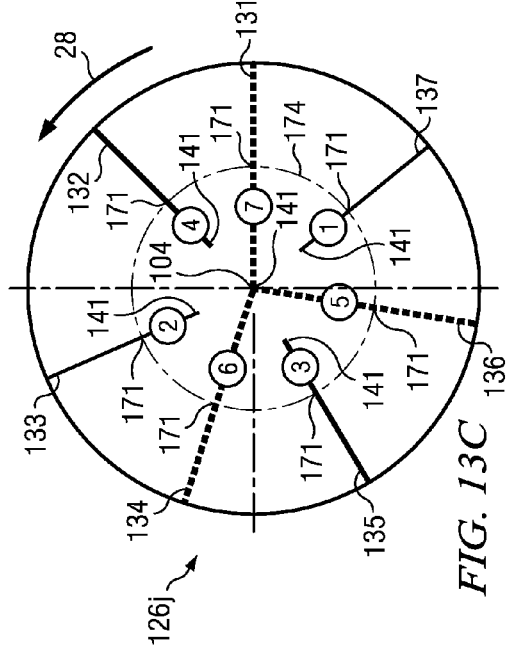
FIGS. 13A and 13B are schematic drawings showing one example of an outer cutter set of multilevel force balanced cutting elements disposed on a fixed cutter rotary drill bit incorporating teachings of the present disclosure.
Figure 13B:
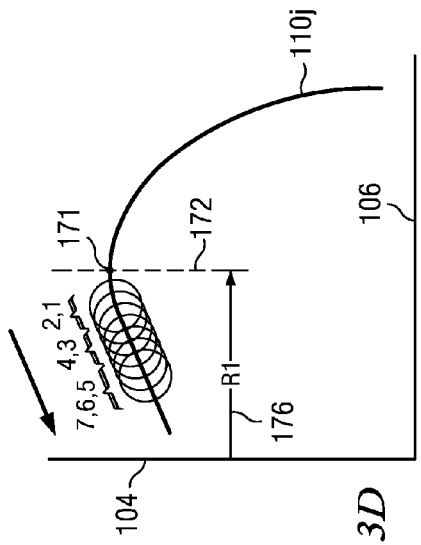

If cutter layout is outwards such as from a nose point to an associated gauge pad, then the outer cutter set is the same as the cutter set defined above. For example, for a seven blade bit using three cutter groups, outer cutter set may be [(1,4,6) (2,5) (3,7)]. FIGS. 13A and 13B show the cutter distributions on bit face 126j and bit face profile 110j for cutters in an outer cutter set. Bit face profile 110j in FIG. 13B indicates that outer cutting elements in each cutter group satisfy the general rule that radial distance from an associated rotational axis to the second cutting element in a cutter group must be greater than the radial distance to the adjacent to the first cutting element. It is noted that the radial location of the cutters within the outer cutter set meets the following rule:

$R_{i+1} > R_i$ i=1,2,3 . . .

Inner Cutter Set

Figure 13C:
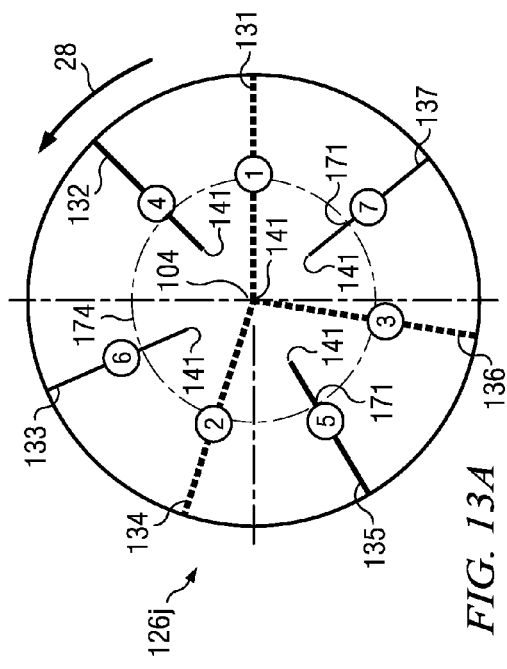
FIGS. 13C and 13D are schematic drawing showing one example of an inner cutter set of multilevel force balanced cutting elements disposed on a fixed cutter rotary drill bit incorporating teachings of the present disclosure.
Figure 13D:
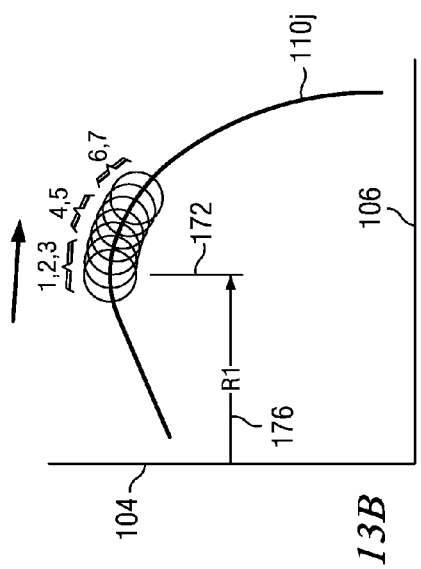

If cutter layout is inwards such as from nose point to bit center, then the blade order in an inner cutter set is reverse of the blade order of the outer cutter set. For example, if the outer cut set is [(1,4,6) (2,5) (3,7)], then the inner cutter set is: [(7,3) (5,2) (6,4,1)]. FIGS. 13C and 13D show the cutter distributions on bit face and on bit profile for cutters in an inner cutter set.

Blade Order for all Outer Cutters

If cutter layout is outward from a nose point on a cutting face profile and more than one outer cutter set is required, the blade order for all outer cutters is a repeat of the first outer cutter set. For an eight blade bit using cutter set [(1,5) (3,7) (2,6) (4,8)], the blade order for all outer cutters is: [1 5 3 7 2 6 4 8, 1 5 3 7 2 6 4 8, 1 5 3 7 2 6 4 8, . . . ]

Blade Order for all Inner Cutters

If cutter layout is inward from a nose point on a cutting face profile and more than one inner cutter set is required, the blade order for all inner cutters is a repeat of the first inner cutter set. For an eight blade bit using cutter set [(1,5) (3,7) (2,6) (4,8)], the blade order for all inner cutter sets is: [8 4 6 2 7 3 5 1, 8 4 6 2 7 3 5 1, 8 4 6 2 7 3 5 1, . . . ]

FIG. 14 is a schematic drawing showing portions of cutting face 126k of a prior art rotary drill bit with six blades 131-136 extending radially from bit rotational axis 104. FIG. 14 shows potential problems with prior techniques to select or layout locations for installing cutting elements on exterior portions of a downhole drilling tool from a location proximate the rotational axis. As shown in FIG. 14, first end 141 of each primary blade 91, 93, 95 may be disposed closely adjacent to bit rotational axis 104. First end 141 of each secondary blade 92, 94 and 96 may be radially spaced from bit rotational axis 104.

Prior procedures for selecting locations for installing respective cutting elements on exterior portions of associated blades generally start with selecting the first location closely adjacent to the associated rotational axis. For the example shown in FIG. 14, the location for installing cutting element 1 was selected closely adjacent to first end 141 of blade 91 and also closely adjacent to rotational axis 104.

The location for installing the second cutting element on exterior portions of an associated blade is generally selected based on desired overlap with the first cutting element in a spiraling direction from the location for the first cutting element in either the direction of rotation or reverse to the direction of rotation. For cutting face 126k in FIG. 14, the location for installing cutting element 2 was selected on blade 93 spaced radially from bit rotational axis 104 in the direction of rotation. See arrow 28. Cutting element 3 may be installed on exterior portions of blade 95 at a greater radial distance as compared with cutting element 2 in the direction of bit rotation. The sequence of installing additional cutting elements may continue generally in the direction of rotation of an associated downhole drill bit.

Potential problems from using the prior procedures include the large distance between locations for installing cutting elements 4 and 8 on blade 91 which result in uneven cutter loading. Also, substantial gaps extend from respective first end 141 of secondary blades 92, 94 and 96. Primary blade 93 may have excessively large gaps between cutting elements 5 and 12.

FIGS. 15A and 15B show two examples of selecting or laying out cutting elements starting at or near a nose point on an associated composite cutting face profile in accordance with teachings of the present disclosure. The resulting cutter groups may be arranged pseudo-symmetrical relative to the nose point on the composite cutting face profile.

Portions of cutting face 126m shown in FIG. 15B may include primary blades 131, 133 and 135. First end 141 of each primary blade may be spaced closely adjacent to associated bit rotational axis 104. The location for installing cutting element 1 on primary blade 131 may be selected to be closely adjacent to nose point 171 and associated nose circle 174. The location for installing second cutting element 2 may be selected on primary blade 135 spaced radially inward relative to cutting element 1 and also in a radial direction opposite from the direction of rotation indicated by arrow 28. Cutting element 3 may also be disposed proximate the associated nose point. As a result, cutting elements 1, 2 and 3 may be disposed generally symmetrical to each other around nose axis 172 on the associated composite cutting face profile 110m as shown in FIG. 15A. A first group of outer cutting elements 4, 5 and 6 may be disposed or at locations on exterior portions of associated blades extending at a greater radial distance from the nose point 171. Cutting elements 4, 5 and 6 may be laid out outwardly from nose point 171 to an associated gage pad or gage cutter. The blade order for installing the outer cutting elements 4, 5 and 6 may follow the predefined order so that transient imbalance forces associated with all outer cutter elements may be balanced. After layout of the location for all outer cutting elements, a first group of inner cutting elements 4, 5 and 6 may then be disposed at locations spaced radially inward relative to dotted circle 174 in FIG. 15B and nose axis 172 in FIG. 15A. The locations for additional inner cutting elements may also be laid out extending from nose point 171 to bit rotational axis 104. As shown in FIG. 15, the resulting gaps may be substantially minimized and desired overlap provided with respect to the inner cutters and the outer cutters.

For some embodiments not expressly shown, the initial location for installing the first cutting element may be selected on a secondary blade such as secondary blade 132, 134 or 136. Since the location for installing the first cutting element is no longer required to be immediately adjacent to the bit rotational axis, the locations for installing the first cutting element may be selected on the secondary blades. The blade order for secondary locations for respective cutting elements may proceed in the predefined order to minimize transient imbalance forces. The importance of selecting locations for laying out or installing cutting elements from a nose point or near a nose point are shown in FIGS. 19A, 19B and 20A-20D.

For examples shown in FIG. 15A, cutting elements 1, 2 and 3 may be disposed at locations generally symmetrically or arranged relative to nose point 171 and nose axis 172. The first group of outer cutters (4,5,6) may also be balanced with respect to each other and with respect to nose cutters (1,2,3). The first group of inner cutters (4,5,6) may be balanced with respect to each other and with respect to nose cutters (1,2,3). As a result, contact between downhole drilling tool having a composite cutting face profile such as shown in FIG. 15A may substantially reduce or eliminate imbalance forces resulting in engagement with downhole formations during transition drilling such as shown in FIGS. 7 and 22.

Problems associated with uneven loading of blades such as FIG. 14 and undesired or void spaces or gaps with blades such as 92, 94 and 96 may result in uneven loading of cutting elements 1-17.

One aspect of the present disclosure includes laying out cutting elements starting from the nose or near nose of a composite bit face profile.

The above described problems may be partly overcome by layout cutter from nose or near nose. If cutter layout starts from the nose point, then outwards to bit gauge pad, blade order of all outer cutters can follow exactly the pre-defined order so that transient imbalance forces associated with all outer cutters can be balanced. After layout outer cutters, inner cutters are layout from nose point inwards to bit center. In this way, some naked portion shown in FIG. 14 may be covered by cutters because cutters are usually first considered to be located close to nose point.

Cutter layout may also start near the nose point. For example, the start layout point may be the start point of the secondary blade and the first cutter may be located on the secondary blade. In this way, blade order of cutters outside of the start point can follow exactly the pre-defined order so that transient imbalance force can be balanced for these outside cutters.

The importance of starting layout cutters from a nose point or near a nose point on an associated composite cutting face profile may be further demonstrated by comparing FIGS. 19A, 19B and 20A-20G with FIGS. 21A, 21B and 22A-22J. If cutter layout starts from the nose point, then cutter groups on left and right sides of nose point may be first placed so imbalance forces associated with these cutters may be balanced.

Cutter Arrangement within Nose Zone

FIG. 15A shows the benefits of placing at least three cutter groups proximate an associated nose zone. The first cutter group, cutters (1,2,3), is located around the nose point, the second cutter group, cutters (4,5,6), is on the outside of the first group and the third cutter group, inner cutters (4,5,6), is on the inner side of the first cutter group. The cutter groups should be arranged so that imbalanced forces associated with each cutter group are balanced and imbalance forces associated with the three groups are also balanced. This type of cutter arrangement may be called pseudo-symmetrical cutter groups around nose point.

Usually if bit hydraulics is allowed, at least three cutter sets should be placed around nose zone. The first cutter set is located around the nose point, the second cutter set is on the outside of the first cuter set and the third cutter set is on the inner side of the first cutter set. These cutter sets should be arranged so that imbalance forces associated with each cutter set are balanced and imbalance forces associated with these three cutter sets are also balanced.

Generally, placing more pseudo-symmetrical cutter sets around a nose point will improve force balancing of a downhole drilling tool. Carefully selecting the location of the first end of secondary blades may be important to ensure that a resulting cutter layout includes pseudo-symmetrical arrangement of cutting elements relative to a nose axis. This usually requires at least the first end of secondary blades associated with the third cutter group or cutter set is within the nose radius.

Figure 24A:
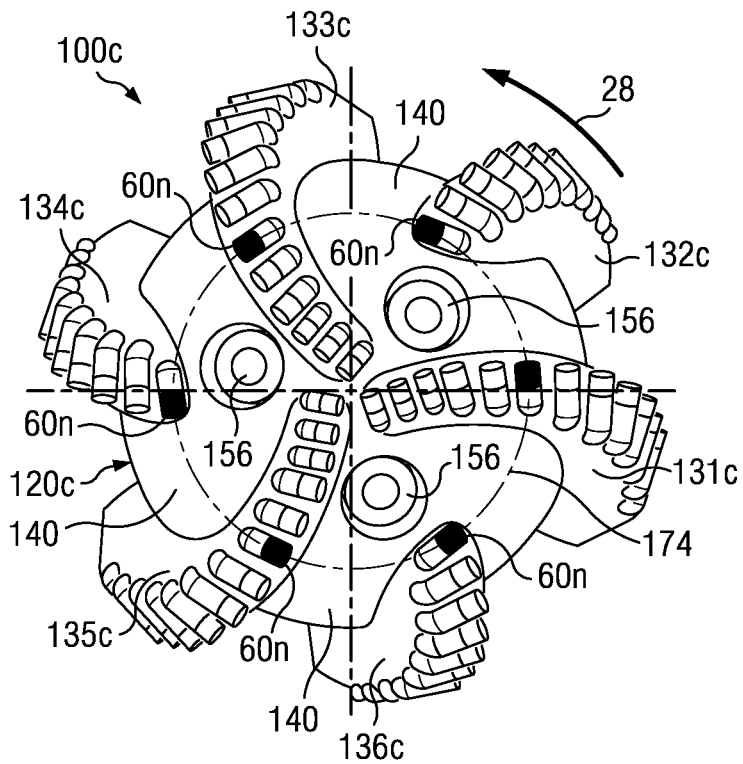
FIG. 24A is a schematic drawing showing an end view of a fixed cutter rotary drill bit incorporating teachings of the present disclosure.
Figure 24B:
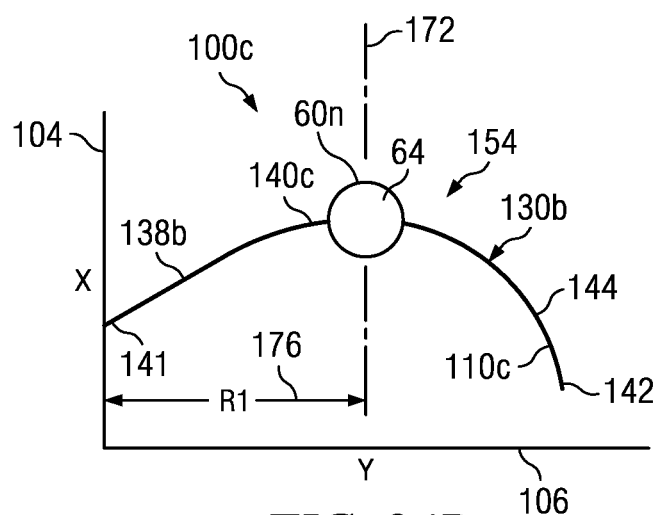
FIG. 24B is a schematic drawing showing portions of a bit profile resulting from placing cutting elements proximate the nose portions of the drill bit in FIG. 24A in accordance with teachings of the present disclosure.

FIG. 24A is a schematic drawing showing an end view of fixed cutter rotary drill bit 100c. Fixed cutter rotary drill bit 100c may have a plurality of blades 131c-136c disposed on exterior portions of associated bit body 120c. Dotted circle 174 may correspond with respective nose point 171 on exterior portions of respective blades 131c-136c. Radius of dotted circle 174 may correspond with the distance between bit rotational axis 104 and nose axis 172 as shown in FIG. 24B. For some applications, respective cutting elements 60n may be disposed closely proximate to nose points 171 on each blade 131c-136c. Resulting bit face profile 110c is shown in FIG. 24B.

For this embodiment, cutting elements 60n have approximately 100% overlap with each other on bit face profile 110c. Therefore, cutting elements 60n do not meet the requirement of "neighbor cutters" for purposes of multiforce level balancing techniques. However, installing a large number of cutting elements proximate the nose point of rotary drill bits and other downhole drilling tools may substantially improve stability during initial contact with a downhole formation or during transition drilling from a first generally hard formation from a first generally soft formation into a second generally harder formation.

For the other applications, nose cutters 60*n* may only be disposed on nose points associated with primary blades 131*c*, 133*c* and 135*c* (not expressly shown) at approximately the same angle relative to each other and relative to bit rotational axis 104. For such applications cutting elements 60*n* may be located at approximately the same radial distance from associated bit rotational axis 104 and at the height from reference line 108 extending generally perpendicular to bit rotational axis 104. For other applications two blades (not expressly shown) may be spaced approximately one hundred eighty degrees (180°) from each other or four blades (not expressly shown) may be spaced approximately ninety degrees (90°) from each other or five blades (not expressly shown) approximately seventy two degrees (72°) from each other or six blades (not expressly shown) may be spaced approximately sixty degrees (60°) from each other or seven blades (not expressly shown) may be spaced approximately 51.42° from each other, etc.

The above descriptions on cutter layout assumed cutter layout spiral generally follows the direction of bit rotation because most of today's PDC bits are designed this way.

However, if the cutter layout spiral direction reverses bit rotation, the cutter layout principle described above may also be used. FIG. 15B depicts an example of a 6 blade bit whose cutter layout reverses bit rotation.

Algorithm 1: Two Blade Groups

Figure 16A:
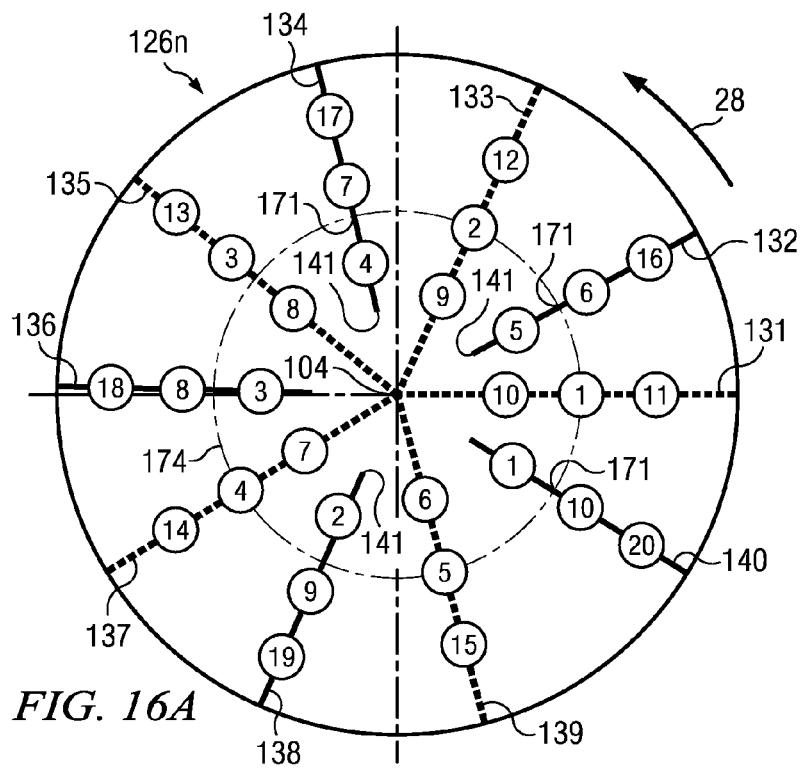
FIGS. 16A-16D are schematic drawings showing various examples for selecting locations to install cutting elements on exterior portions of a downhole drilling tool having ten blades using blade groups and cutter sets in accordance with teachings of the present disclosure.

If the algorithm for two blade groups is used, then the preferred number of blades in each blade group should be as close as possible. For downhole drilling tool with ten (10) blades such as shown in FIG. 16A, the preferred two blade groups may be (1,3,5,7,9) and (2,4,6,8,10). If the primary blades are (1,3,5,7,9) and cutter layout starts from the nose point 171 or near nose point 171, then the preferred cutter set is [(1 3 5 7 9) (2 4 6 8 10)]. FIG. 16A shows cutting face 126*n* with resulting layout for nose cutters 1, 2, 3, 4 and 5 disposed at or near respective nose points 171 corresponding with circle 174 when the two blade groups' algorithm is used.

If the primary blades are (1,3,5,7,9) or 131, 133, 135, 137 and 139 as shown in FIG. 16A and layout cutter starts from a start point of one of the secondary blades 132, 134, 136, 138 or 140, then the preferred cutter set becomes [(2,4,6,8, 10) (1,3,5,7,9)]. Other two blade groups may be used to layout or select locations for installing cutting elements on a downhole drilling with 10 blades. For example, two blade groups may be used because 10=4+6, the first blade group will have four blades and the second blade group will have six blades.

Algorithm 2: Pair Blade Groups

Figure 16B:
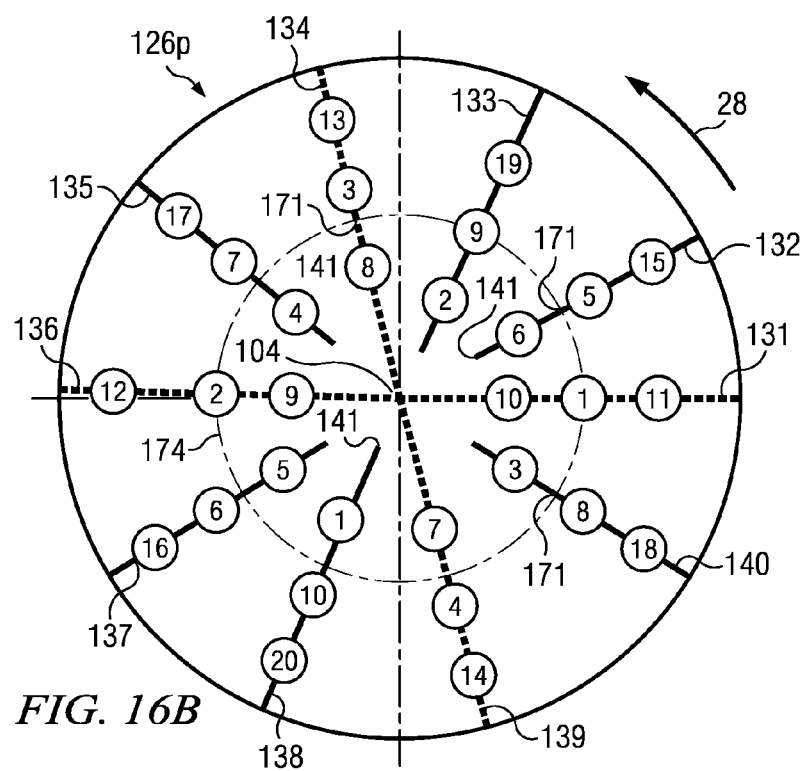

There are five possible pair groups for a downhole drilling tool with ten blades: (1,6), (2,7), (3,8), (4,9), (5,10). If the primary blades are (1,4,6,9) as shown in FIG. 16B, then the preferred cutter set is [(1,6) (4,9) (2,7) (5,10) (3,8)].

As listed in Table 301 of FIG. 25A, there may be other types of cutter sets for a ten blade downhole drilling tool by reordering the blade groups, for example, cutter set [(1,6) (2,7) (3,8) (4,9) (5,10)] may be used for cutter layout. However, cutter set [(1,6) (2,7) (3,8) (4,9) (5,10)] may only be level three force balanced. The preferred cutter set [(1,6) (4,9) (2,7) (5,10) (3,8)] may be level four force balanced. Therefore, using the preferred cutter set for cutter layout ten blade downhole drilling tool may provide better lateral stability.

Algorithm 3: Three Blade Groups

Figure 16C:
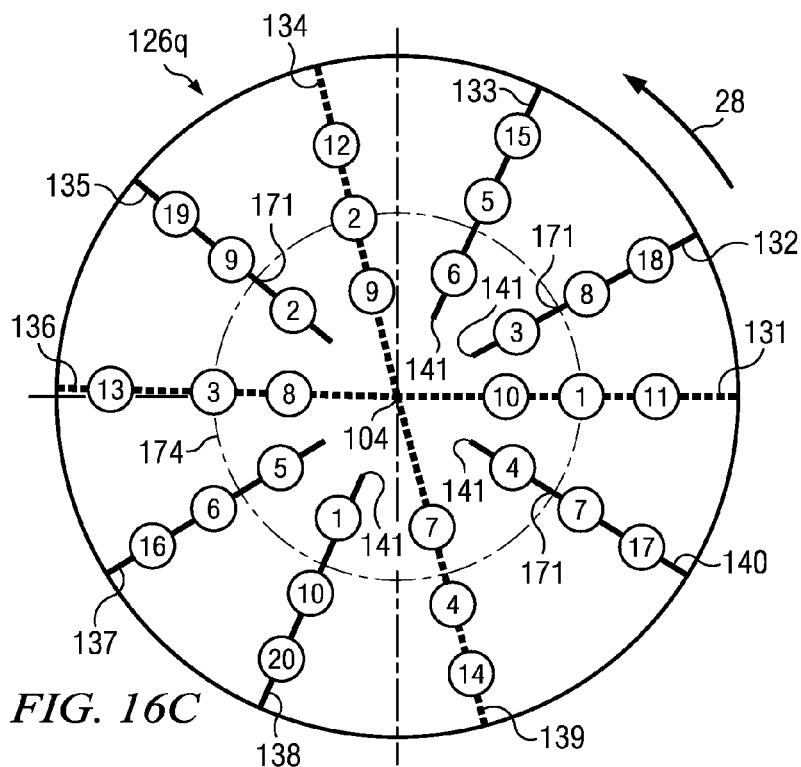

Cutting face 126*q* as shown in FIG. 16C four primary blades 131, 134, 136 and 139. The blades may be divided into three blade groups [(1,4,6,9) (2,5,8) (3,7,10)]. The preferred cutter set is [(1,4,6,9), (3,7,10), (2,5,8)] which is level four force balanced. FIG. 16C depicts the cutters layout when three groups algorithm is used.

As listed in Table 301 of FIG. 25B, there may be other types of cutter set for a ten blade downhole drilling tool using three blade groups. For example, cutter set [(1,3,6,8) (2,5,9) (4,7,10)] may be used to layout cutters but it may be only level three force balanced.

Algorithm 4: Four Blade Groups

Figure 16D:
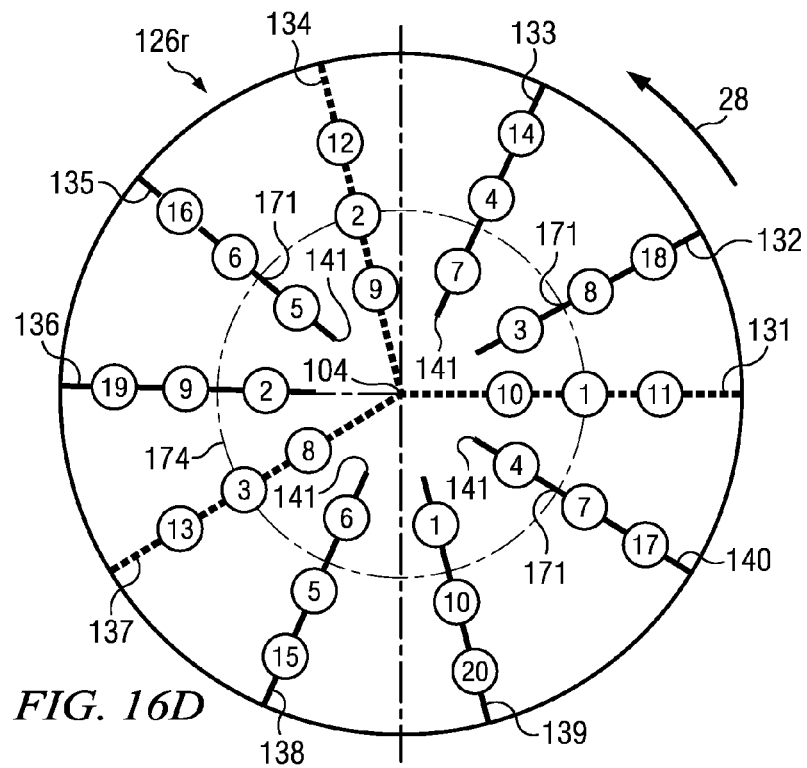

Cutting face in FIG. 16D has only three primary blades 131, 134 and 137. Four cutter groups and cutter set [(1,4,7) (3,8) (5,10) (2,6,9)] may be used to select or layout locations for installing cutting elements on exterior portions of blades 131-140. This cutter set may only be level three force balanced. Examples of other cutter sets which may also be used are shown in Table 301 of FIG. 25B.

Other Algorithms: Five Blade Groups, Six Blade Groups and Seven Blade Groups

If the number of blades on a downhole drilling tool is M, then the maximum number of blade groups may be estimated by the integer part of M/2. For example, for a downhole drilling tool has fifteen (15) blades, the blades may be divided into a maximum of 7 groups. Therefore, for a downhole drilling tool with 15 blades, at least six algorithms may be used:

Two blade groups: 15=7+8;
Three blade groups: 15=5+5+5;
Four blade groups: 15=3+4+4+4;
Five blade groups: 15=3+3+3+3+3;
Six blade groups: 15=3+3+3+2+2+2;
Seven blade groups: 15=3+2+2+2+2+2+2;

Selected cutter sets for some of algorithms are listed in Table 301 in FIGS. 25A, 25B and 26.

Blade Order Violations & Algorithm

There are two cases in which the above pre-defined blade orders, especially blade orders for inner cutter sets, may violate multiforce level balancing requirements.

Case 1: Minimal and Maximal Distance Between Two Neighbor Cutters on the Same Blade The distance between any two adjacent cutters (not on the same blade) on an associated composite cutting face profile is determined by a given design overlap ratio of neighbor cutting surface. Overlap ratio of two cutters is defined by the shared area divided by the sum of areas of two cutters. For example, 100% overlap of neighbor cutting surfaces results in zero distance between the two cutters on the composite cutting face profile. The desired overlap between any two neighbor cutters on an associated cutting face profile is usually less than 100% and most often between 20% to 90% in accordance with teachings of the present disclosure.

The pre-defined overlap and pre-defined blade orders may lead to the distance between two neighbor cutters on the same blade being either too small or too large. If this distance is too small, there may be not enough space on a blade to install a cutting element. If this distance is too large, then at least one of the cutters may remove too much rock and may subject to increased forces as compared to cutters with proper overlap.

Satisfaction of distance requirement between two neighbor cutters on the same blade may lead to violation of blade orders, especially blade order for inner cutters. Iteration is usually needed to avoid this situation by carefully adjusting overlap ratio, cutter size, side rake angle and other design parameters.

Case 2: Incomplete Cutter Group or Incomplete Cutter Set

The pre-defined blade orders, either for inner cutters or for outer cutters, are repeated by cutter set. The number of cutters on a downhole drilling tool divided by the number of cutters in a cutter set may be not equal an integer. Several last cutters may not belong to any pre-defined cutter groups or cutter sets.

For example, for an eight blade on a downhole drilling tool using cutter set [(1,5) (3,7) (2,6) (4,8)], and starting layout cutters from the nose point, then the predefined blade orders for all inner cutters are: [8 4 6 2 7 3 5 1, 8 4 6 2 7 3 5 1]

However, if only 9 cutters may be put on inner blades and the resulted blade order for the 9 cutters becomes: [8 4 6 2 7 3 5 1, 8]

The last cutter (or the cutter closet to bit center), cutter 9 is on blade 8 and does not belong to any cutter group. The imbalance forces created by cutter 9 may not be balanced.

If the start radii of the secondary blades 2 and 6 are outside of the nose point, then the blade orders for inner cutters may become: [8 4 7 3 5 1, 7 3 5 1].

The first cutter set becomes incomplete. The imbalance forces associated with an incomplete cutter set may not be balanced.

A downhole drilling tool of method 700 shown in FIGS. 23A and 23B may be needed to avoid this situation by adjusting the starting point of cutter layout, overlap ratio for inner cutters, cutter size, side rake angle, phase angle and other design features.

Choice of Cutter Layout Algorithms

Many algorithms may be used for a downhole drilling tool with a given number of blades. For each cutter layout algorithm, there may be many cutter sets to chose from. A downhole drilling tool designer should first choose which algorithm to use and then choose which cutter set to use. Selected cutter sets for a given number of blades are listed if FIGS. 25A, 25B and 26.

Three rules should generally be followed for choosing a cutter layout algorithm and choosing a force balanced cutter set.

First Rule: Preferred number of cutters in a blade group is either 2 or 3. If the number of blades is even, then pair blade group algorithm should be used. For example, for an eight blade bit, the preferred cutter layout algorithm should be pair blade group algorithm. If the number of blades is odd, then number of blade in each blade group should be either 2 or 3. For a downhole drilling tool with seven blades, the preferred number of blade groups should be three, namely, 7=3+2+2. Therefore, the three blade group algorithm should be used.

Second Rule: The number of cutters in each cutter group should be as close as possible.

For the two blade group algorithm, if the number of blades is even, then the first and second blade groups will have the same number of blades. If the number of blades is odd, then one blade group has K blades and another blade group has K+1 blades where 2K+1 equals the number of blades.

A downhole drilling tool with nine blades may be used to further demonstrate this rule. Two algorithms may be used as listed in FIGS. 25A and 25B:

Three blade groups: 9=3+3+3; and
Four blade groups: 9=3+2+2+2.

The three blade group algorithm may be better than the four blade group algorithm because the three blade group algorithm may create more symmetrical cutting structure than the four blade group algorithm.

Third Rule: Level four force balanced cutter sets should be as preferred over level three force balanced cutter sets. This rule was demonstrated for a downhole drilling tool with eight blades in FIG. 12D. The preferred cutter set [(1,5) (3,7) (2,6) (4,8)] may be level four force balanced which should be used in cutter layout.

Figure 17:
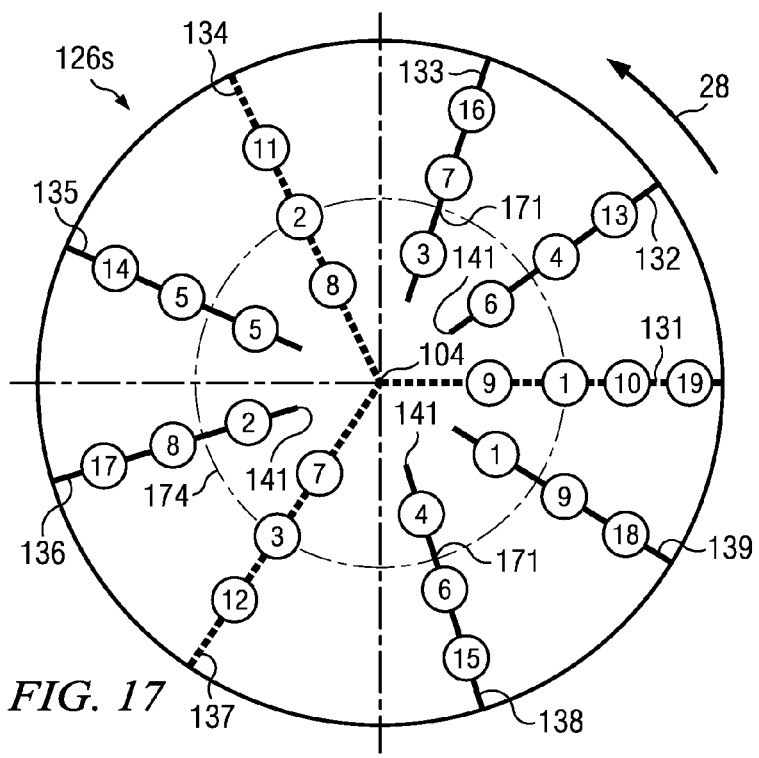
FIG. 17 is a schematic drawing showing one example of techniques to select locations for installing cutting elements on exterior portions of a downhole drilling tool having nine blades using three blade groups in accordance with teachings of the present disclosure.

Rule three may be further demonstrated for a downhole drilling tool with nine blades and imbalance forces created by any three neighbor cutter group: [(1,2,3) (2,3,4) (3,4,5) (4,5,6) (5,6,7) (6,7,8) (7,8,9)]. If the three cutter group algorithm and the preferred cutter set [(1,4,7) (2,5,8) (3,6,9)] are used, the cutter layout is shown in FIG. 17. Imbalance forces associated with any three neighbor cutters [1,2,3) (2,3,4) (3,4,5) (4,5,6) (5,6,7) (6,7,8), (7,8,9)] may be balanced or minimized because the degrees of separation between any these cutters relative to rotational axis 104 is over one hundred eighty (180°) degrees.

Figure 18:
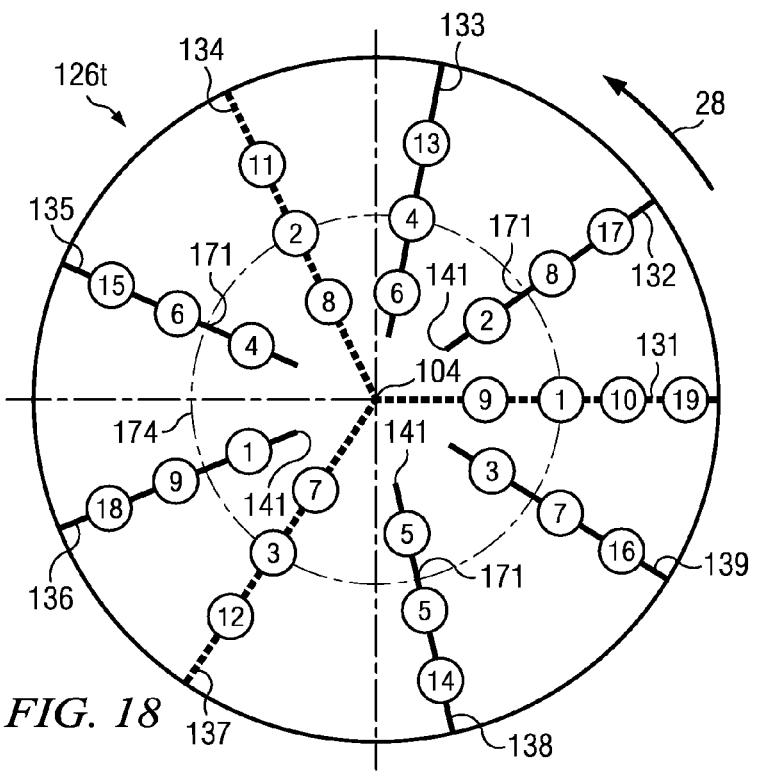
FIG. 18 is a schematic drawing showing one example of techniques to select locations for installing cutting elements on exterior portions of a downhole drilling tool having nine blades using four blade groups in accordance with teachings of the present disclosure.

On the other hand, FIG. 18 shows cutter layout where four group algorithm is used with cutter set [(1,4,7) (3,8) (5,9) (2,6)]. Among any three neighbor cutters (1,2,3) (2,3,4) (3,4,5) (4,5,6) (5,6,7) (6,7,8) (7,8,9) imbalance force associated with (2,3,4), (5,6,7) and (7,8,9) may not be balanced or minimized because three cutters are located on the same side of cutting face 110A.

Therefore, a nine blade bit designed by three group algorithm using cutter set [(1,4,7) (2,5,8) (3,6,9)] should be more stable than that designed by four group algorithm using cutter set [(1,4,7) (3,8) (5,9) (2,6)] using multilevel force balancing procedures.

Design Procedure of Multilevel Force Balanced Downhole Drilling Tool

Figure 19A:
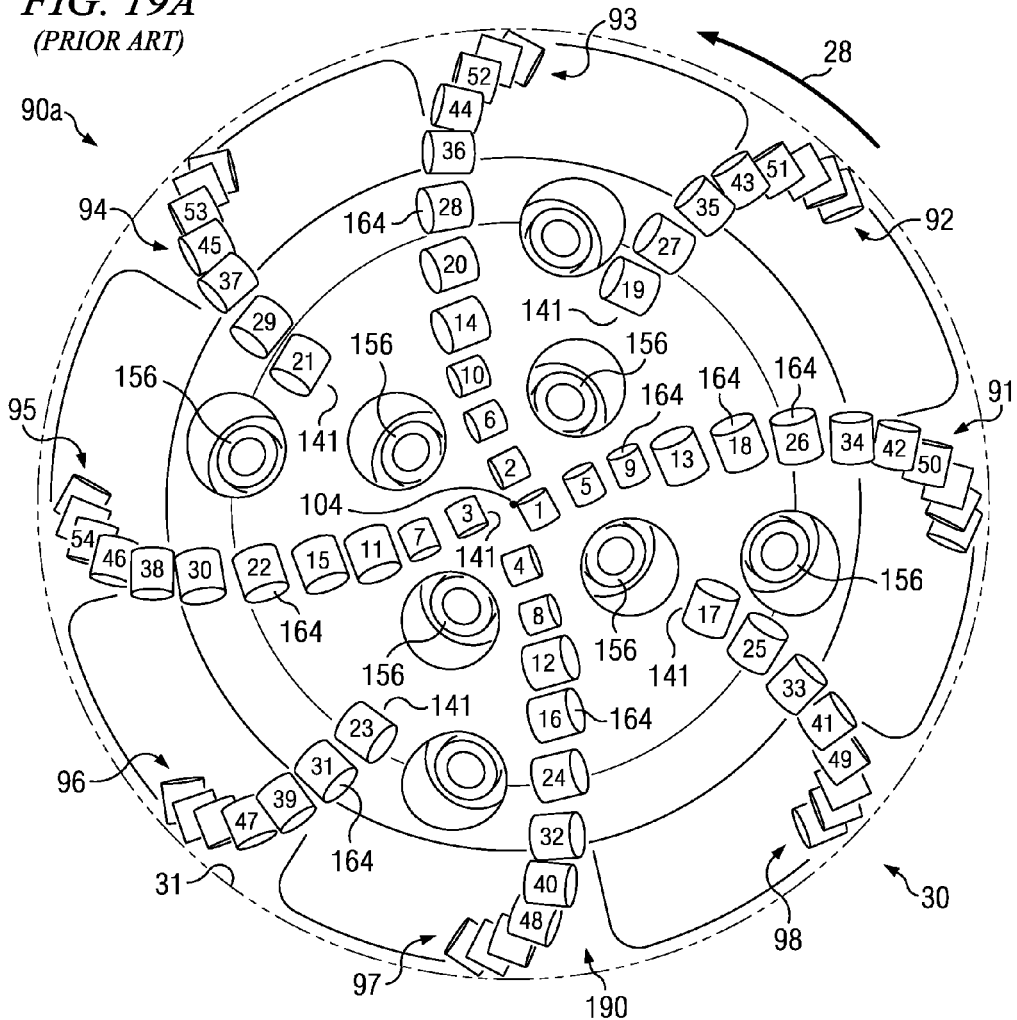
FIGS. 19A and 19B are schematic drawings showing one example of prior techniques for selecting locations for installing cutting element on a fixed cutter rotary drill bit relative to an associated bit rotational axis.
Figure 19B:
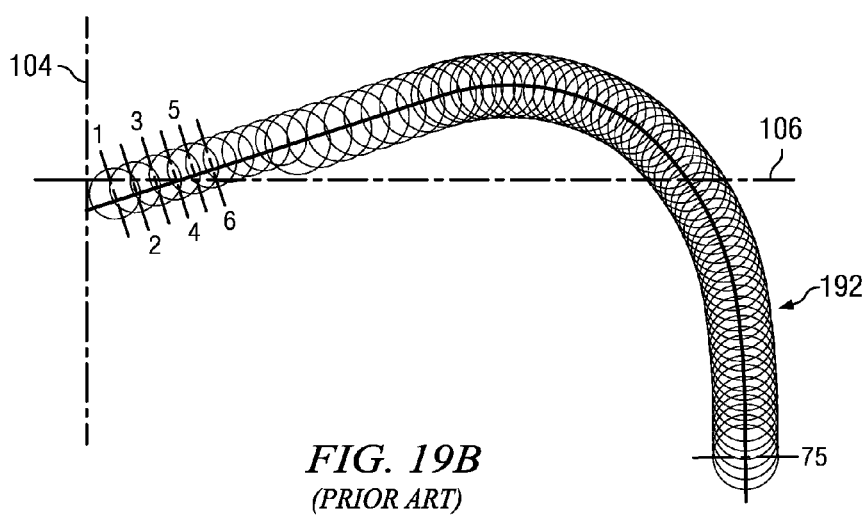

FIGS. 19A and 19B show various features associated with rotary drill bit 90*a* which may be force balanced using traditional one level force balancing techniques and traditional cutter layout procedures starting from bit rotational axis 104. FIGS. 20A-20D show examples of transient imbalance forces which have not been satisfactorily balanced based on simulations of rotary drill bit 90 while forming a wellbore through non-uniform downhole drilling conditions.

Figure 21A:
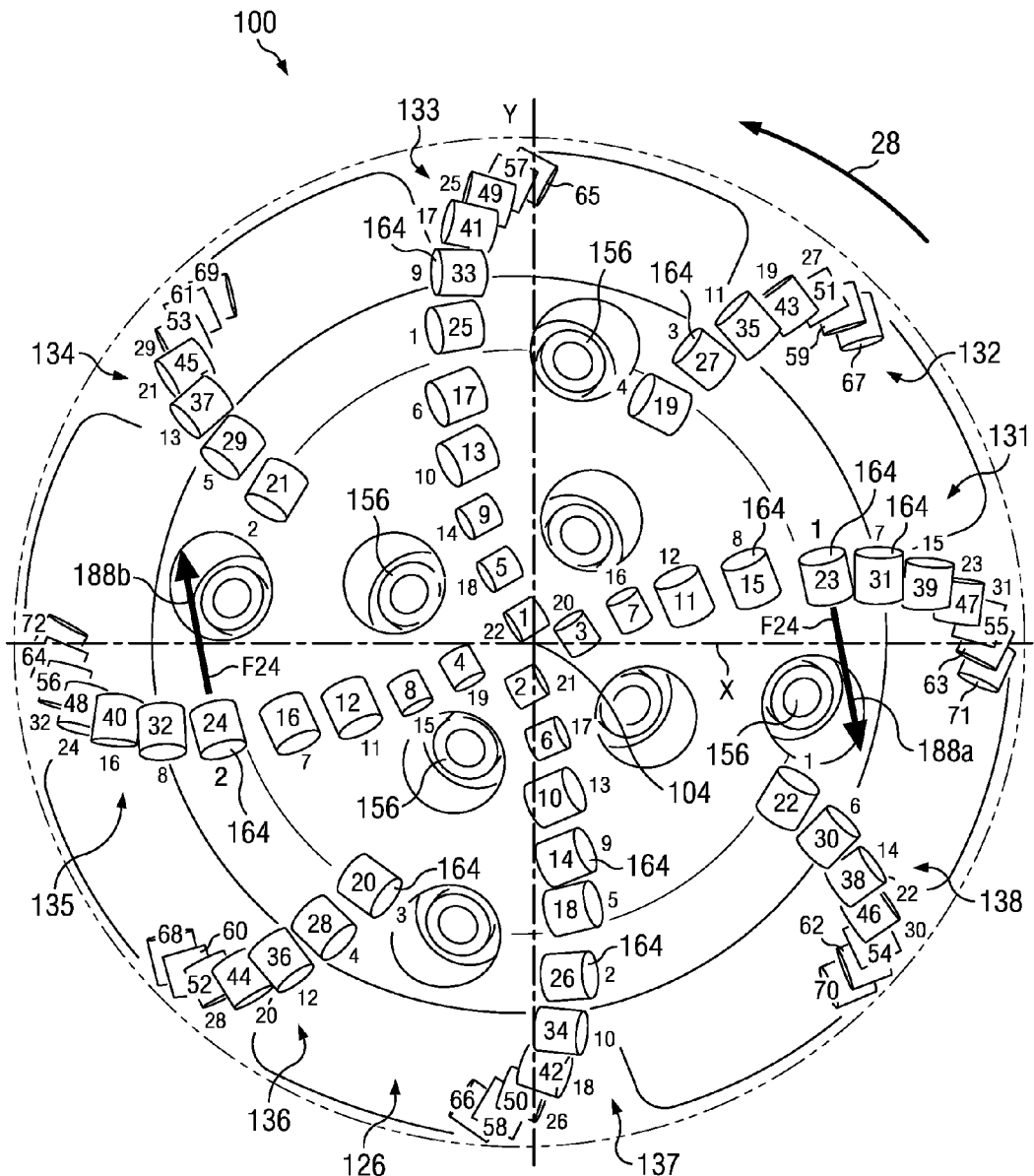
FIGS. 21A and 21B are schematic drawings showing one example of a fixed cutter rotary drill bit with cutting element disposed thereon in accordance with teachings of the present disclosure.
Figure 21B:
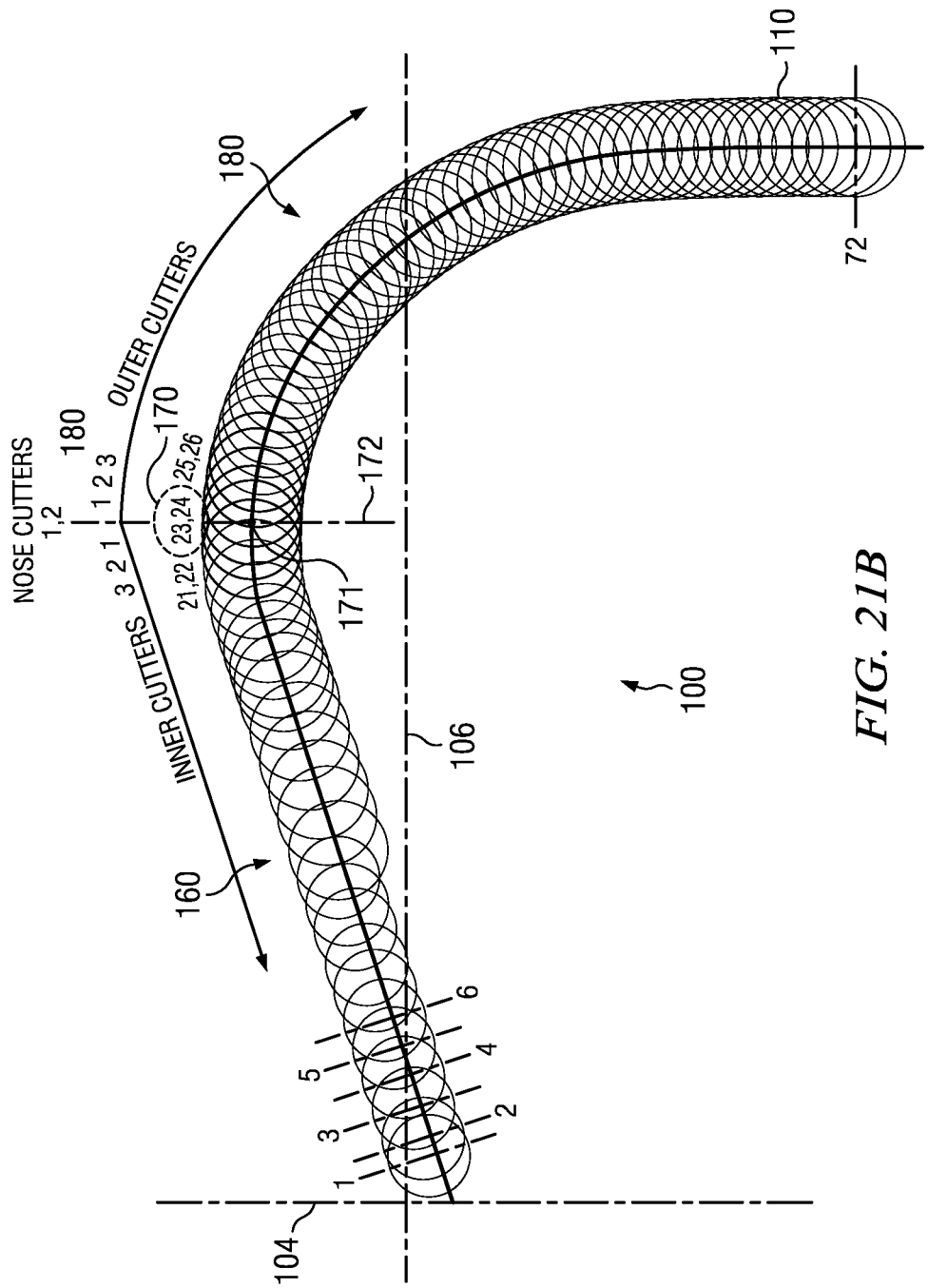

FIGS. 21A and 21B show various features associated with rotary drill bit 100 which may be multilevel force balanced in accordance with teachings of the present disclosure. FIGS. 22A-22J show various examples of imbalance forces acting on rotary drill bit 100 which may be substantially reduced or eliminated (balanced) by designing and manufacturing fixed cutter rotary drill bit 100 based at least in part on multilevel force balancing techniques and cutter layout procedures incorporating teachings of the present disclosure.

Rotary drills bits 90*a* and 100 may be generally described as eight blade fixed cutter rotary drill bits. Respective blades 91-98 on rotary drill bit 90*a* and blades 131-138 on rotary drill bit 100 may have the same configuration and dimensions relative to respective bit rotational axis 104. Rotary drill bit 90*a* and 100 may have the same number, size and type of cutting elements.

Figure 22B:
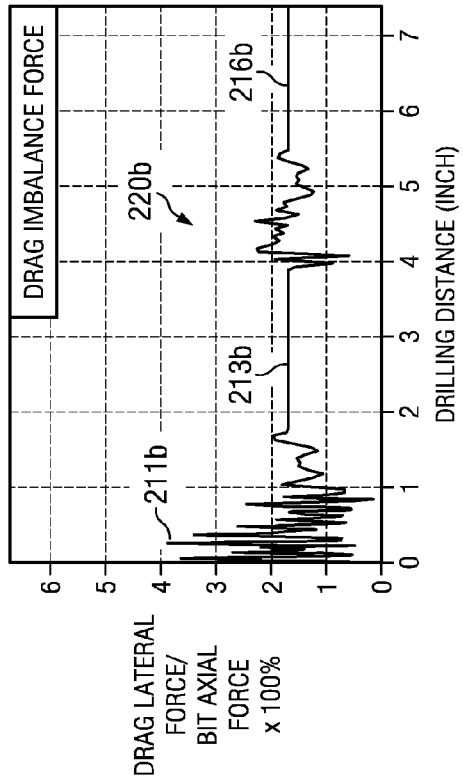
FIGS. 22A-22D are graphs showing reduced imbalance forces during transition drilling resulting from multilevel force balancing and installing cutting elements on the drill bit shown in FIGS. 21A and 21B in accordance with teachings of the present disclosure.
Figure 22D:
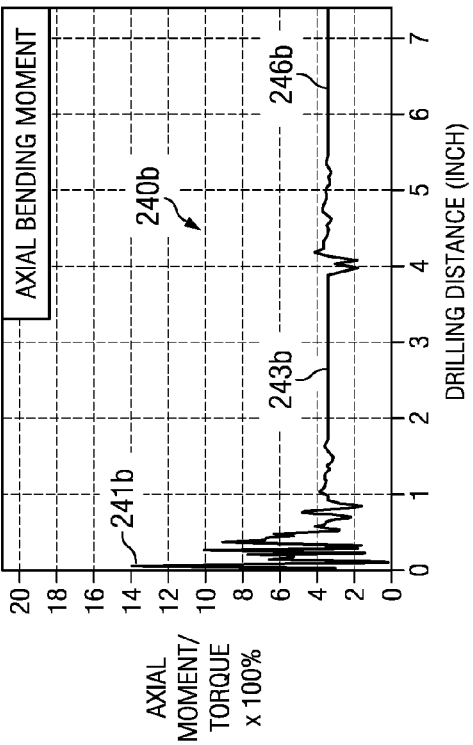

FIG. 19B shows composite bit face profile 192 associated with rotary drill bit 90*a* resulting from installing cutting elements 1-75 on blades 91-98 using traditional one level force balancing techniques and laying out cutter locations relative to bit rotational axis 104. FIG. 22B shows composite bit face profile 110 resulting from installing cutting elements 1-72 on blades 131-138 based on multilevel force balancing techniques and laying out cutter locations relative to nose segment 170, nose point 171 and nose axis 172 in accordance with teachings of the present disclosure.

In FIGS. 19A and 19B, the cutting elements on rotary drill bit 90a have been numbered from 1 through 75 on cutting face 190 and composite bit face profile 192. Cutting elements disposed on blades 91-98 have been numbered sequentially 1-75 in a spiraling order from bit rotational axis 104 in the direction of bit rotation.

The locations for installing cutting elements 1-75 for rotary drill bit 90a were selected starting from associated bit rotational axis 104 in a direction corresponding generally with the direction of rotation starting with cutting element 1 disposed immediately adjacent to bit rotational axis 104 at the first end of blade 91. Exterior portions of the blades 91-98 on which cutting elements 1-75 are disposed are not expressly shown in FIG. 19A.

As shown in FIG. 19A the location for installing cutting element 1 was selected on blade 91 proximate bit rotational axis 104. The location selected for installing cutting element number 2 is on blade 93 at a greater radial distance from bit rotational axis 104 than cutting element 1. The location for installing cutting element 3 is on blade 95 a greater radial distance from bit rotation axis 104 as compared with cutting element 2. The remaining cutting elements 4-75 may be installed on blades 91-98 at locations selected in the same direction of bit rotation as represented by arrow 28. The orientation, size, etc. of cutting elements 1-75 on cutting face 190 of rotary drill bit 90a may be adjusted to satisfy the requirement of traditional one level of force balancing.

Figure 20A:
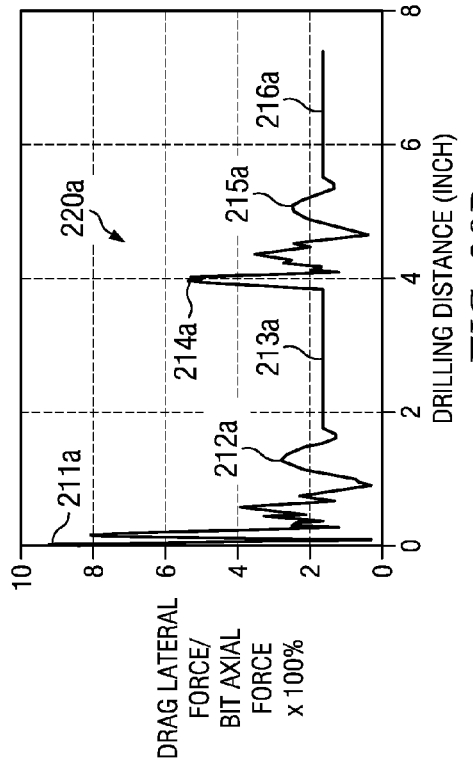
FIGS. 20A-20G are graphs showing imbalanced force levels during transition drilling which may result from installing cutting element on the drill bit shown in FIGS. 19A and 19B and using prior art techniques to force balance such cutting elements.
Figure 20B:
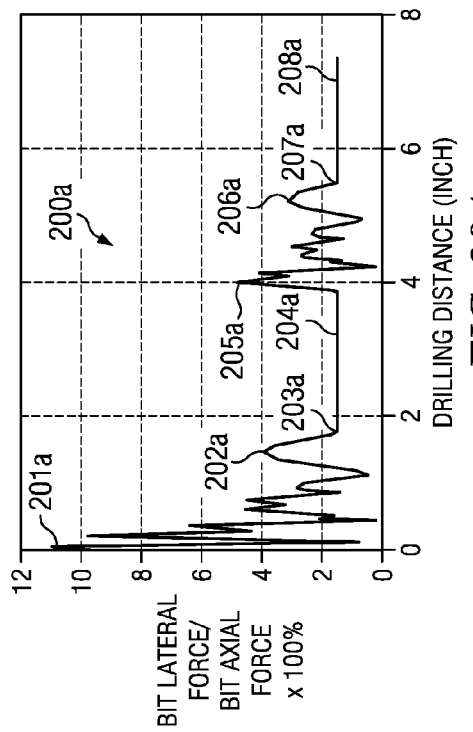
Figure 20C:
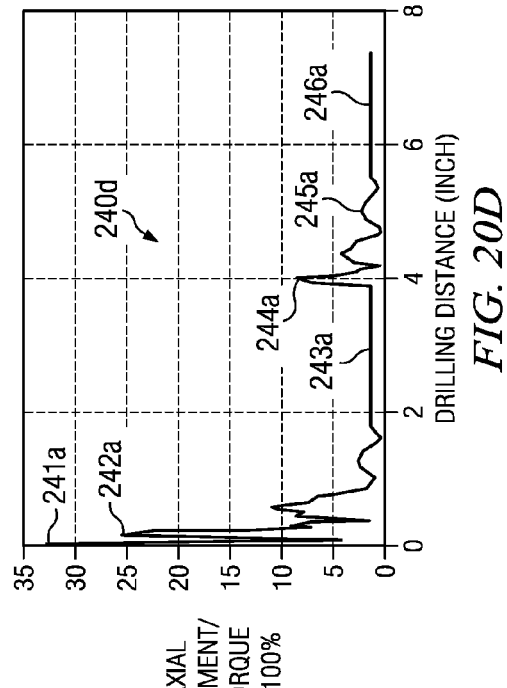
Figure 20D:
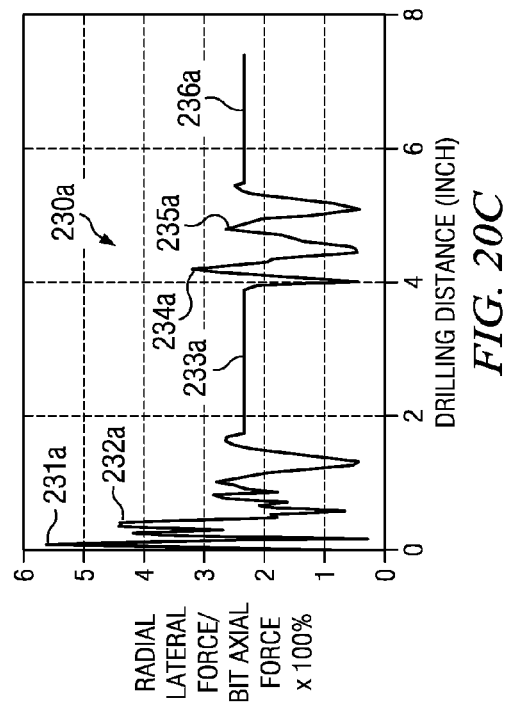
Figure 20E:
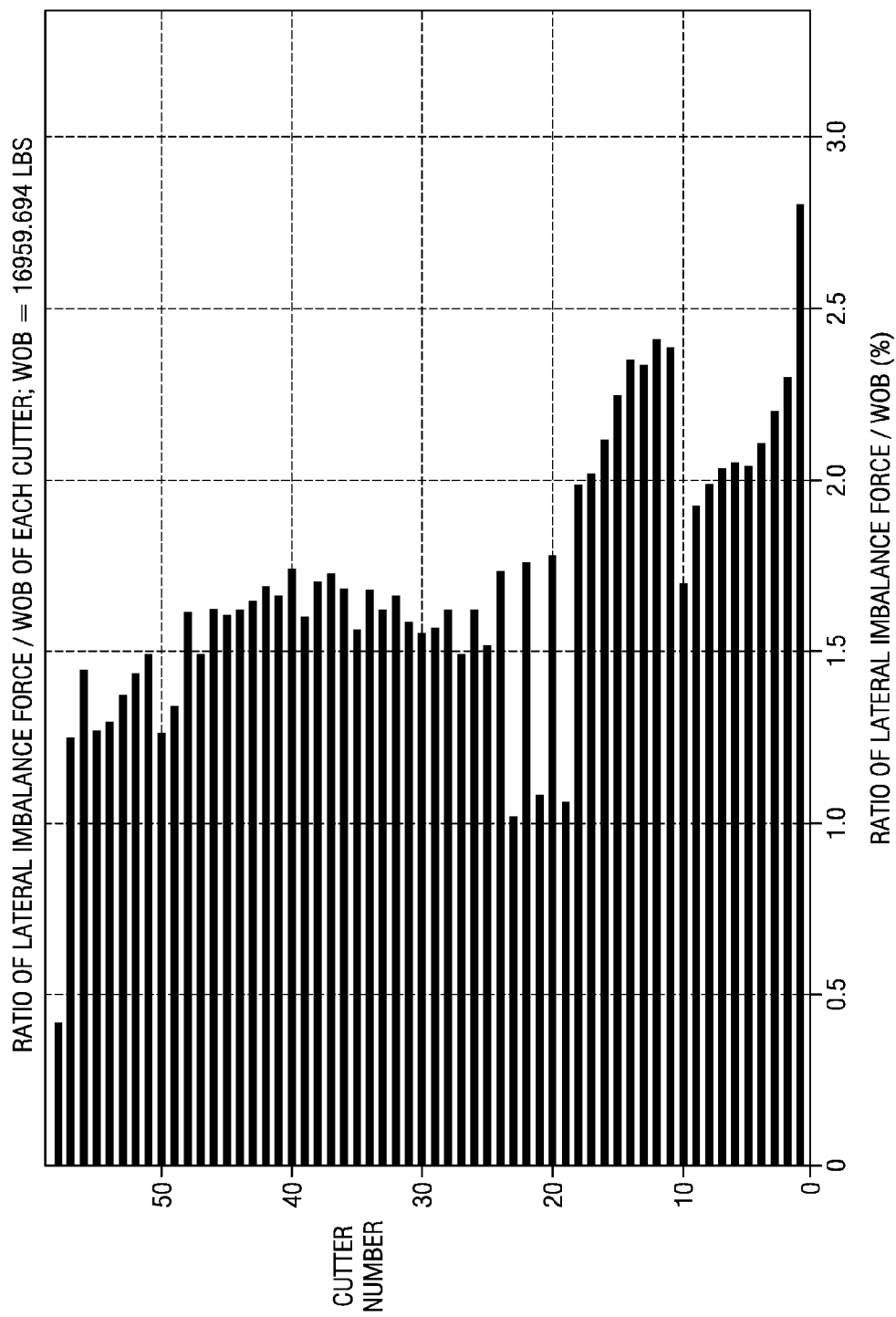
Figure 20F:
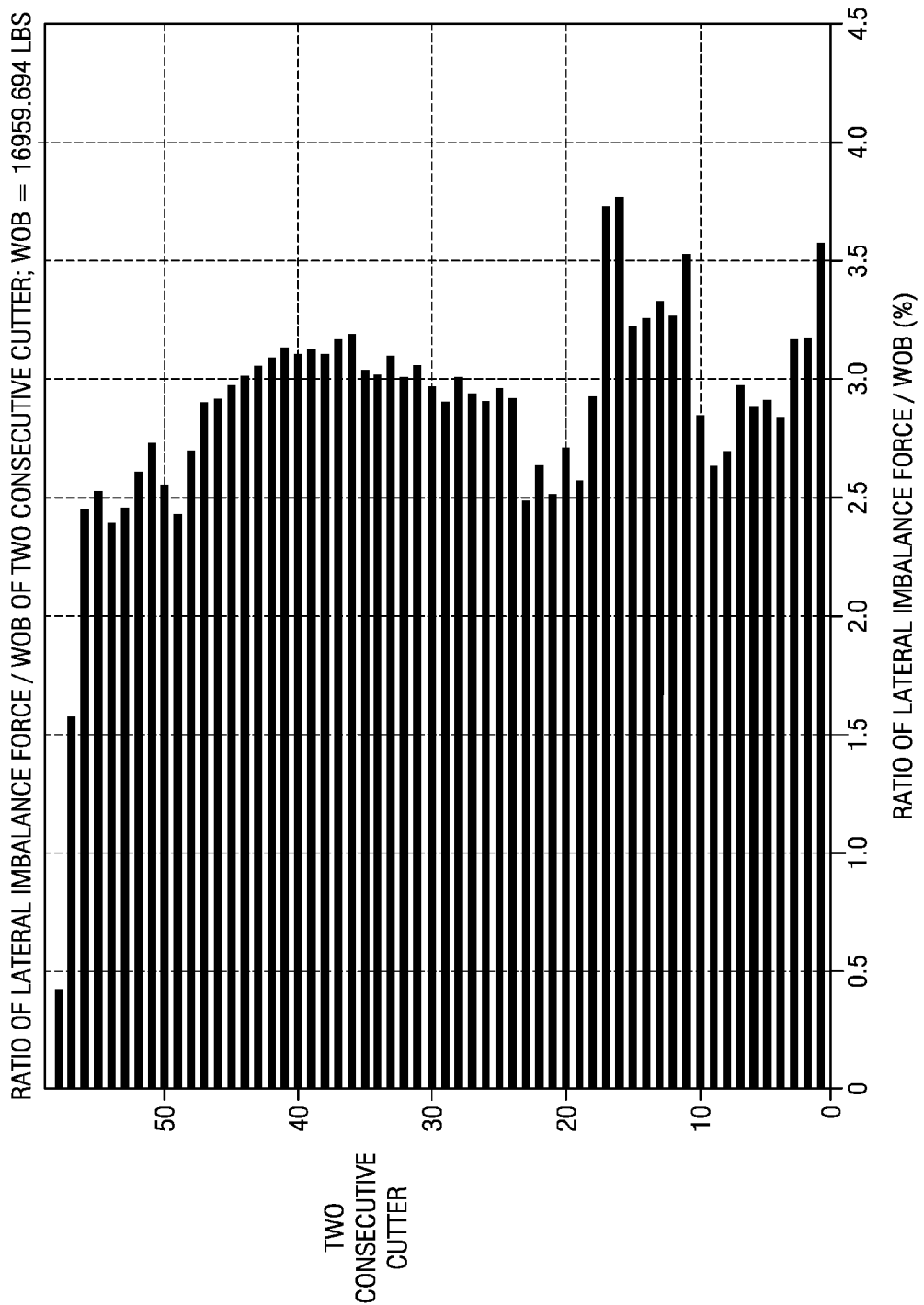
Figure 20G:
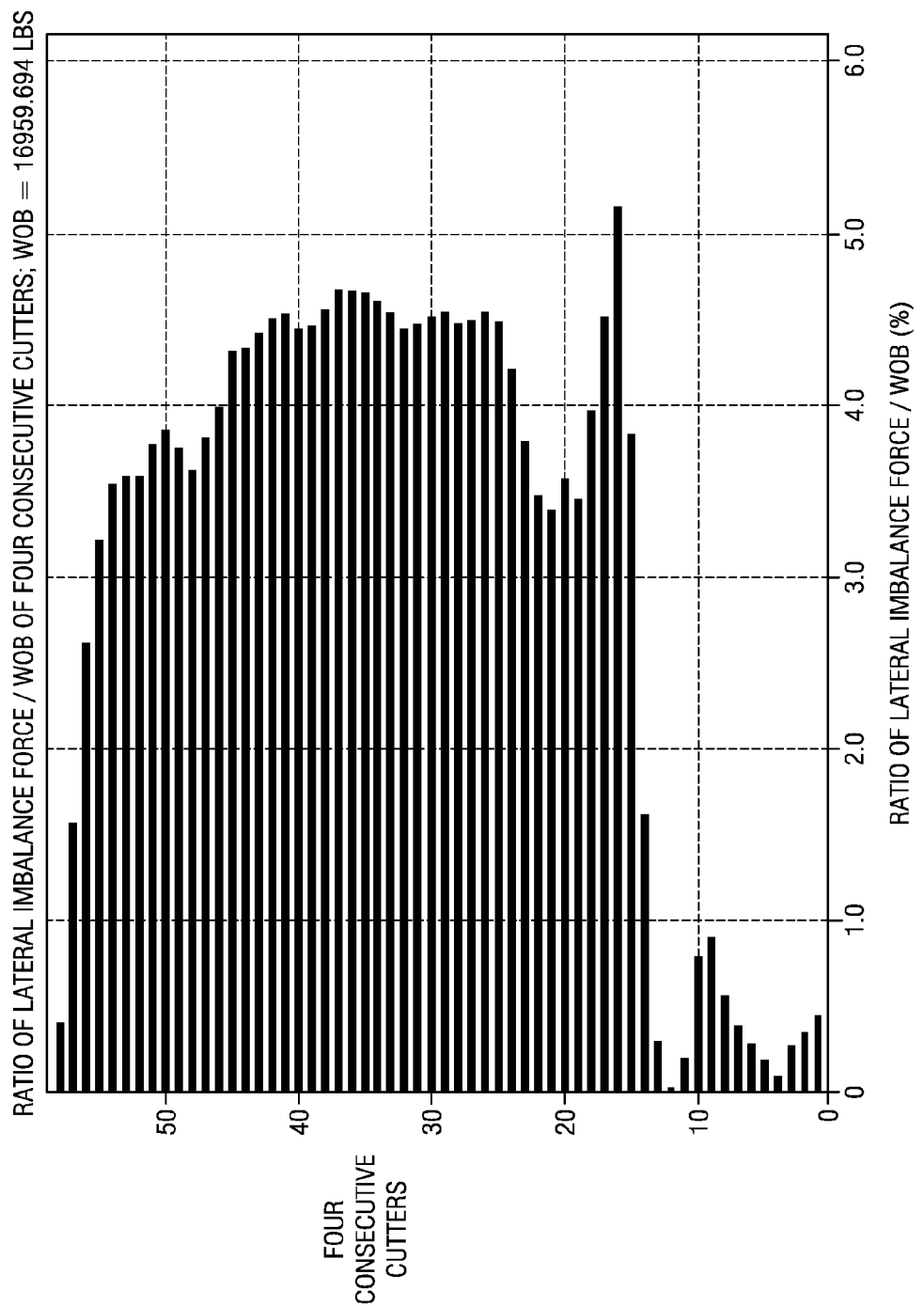

FIGS. 20A-20D show the bit imbalance forces during transition drilling of a generally non-uniform formation such as shown in FIG. 7. FIG. 20E shows the magnitude of the lateral force ratio of each individual cutter when all of the cutters on composite bit face profile 192 drill into a uniform formation. FIG. 20F shows the magnitude of the lateral force ratio of any two consecutive neighbor groups of cutters when all of the cutters drill into a uniform formation. FIG. 20G shows the magnitude of the lateral force ratio of any four consecutive neighbor groups of cutters when all of the cutters drill into a uniform formation.

Except for some inner cutters (1-12), lateral imbalance forces associated with the four neighbor cutter groups are greater than lateral imbalances forces with each individual cutting element 1-75. The maximum lateral imbalance force shown in FIG. 20A may be as high as approximately 11% of the total axial force applied to rotary drill bit 90a. The maximum bending moment applied to rotary drill bit 90a may be as high as 35% of bit torque during initial engagement with the end of a wellbore. See FIG. 20D. During transition drilling from one downhole formation with a compressive strength of approximately 5,000 psi to a second downhole formation with a compressive strength of approximately 18,000 psi transient bit lateral imbalance forces may be as high as 5% of the bit axial force. The axial bending moment applied to fixed cutter rotary drill bit 90a during transit drilling from formation layer 41 to formation layer 42 may be approximately 7.5% of the associated bit torque. Bit imbalance forces only return to a satisfactory level when all cutting elements disposed on exterior portions of rotary drill bit 90a are engaged with a generally uniform downhole formation either formation layer 41 or 42.

FIGS. 21A and 21B show various features of rotary drill bit 100 which may be multi force level balanced using methods and procedures such as shown in FIG. 1D and FIGS. 23A and 23B. Locations for installing cutting elements 1-72 on cutting face 126 of rotary drill bit 100 may be selected starting from nose point 171 or nose axis 172 in accordance with teachings of the present disclosure. See for example FIG. 25B.

In FIG. 21A two numbers are provided for each cutting element. The numbers written in front of cutting face 164 of each cutting element corresponds with the sequence in which locations were selected or laid out for installing each cutting element on respective blades 131-138. A second number is written on top of each cutting element corresponding with the sequence in which each cutting element may be installed on exterior portions of associated blade 131-138. Cutting elements are often installed in pockets or sockets disposed (not expressly shown) on exterior portions of a blade.

Fixed cutter rotary drill bit 100 may be generally described as rotary drill bit 90a with locations for installing cutting elements 1-72 redesigned using the pair group algorithm for an eight blade downhole drill tool shown on table 302 in FIG. 26. The preferred level four force balanced cutter set is [(1,5,) (3,7) (2,6) (4,8)] on table 302. The starting point for installing cutting elements on the exterior portions of fixed cutter rotary drill bit 100 is preferably nose point 171 or nose axis 172 on composite bit face profile 110 as indicated in FIG. 21B. Nose cutters 1 and 2 as shown in FIG. 21B may correspond generally with nose cutters 60n as shown in FIG. 1B. In FIG. 21A respective phase angles represented as arrows 188a and 188b are shown extending from nose cutters 1 and 2 as shown in FIG. 21B. As previously noted, the pair group algorithm for an eight bladed bit was used to select locations for installing cutting elements 1-72 on exterior portions of blades 131-138. Nose cutters 1 and 2 as shown in FIGS. 21A and 21B may also be described as the pair cutter group proximate nose point 171.

The location for installing cutting elements in outer segment 180 may be selected starting from nose cutter 2 on blade 135. Phase angle arrow 188b extends from nose cutter 2. For the embodiment shown in FIG. 21A, the location for installing the first outer cutter is selected on primary blade 133. The location for installing the second outer cutter is shown on blade 137.

Large bold numbers 1 and 2 in FIG. 21A correspond with nose cutters 1 and 2 in FIG. 21B.

The location for installing additional cutting element for additional outer cutters may be selected in a direction corresponding with the direction of rotary drill bit 100 as indicated by arrow 28.

Inner cutters disposed on exterior portions of fixed cutter rotary drill bit 100 may be selected or laid out as shown in FIG. 21B extending from nose axis 172 to bit rotational axis 104.

FIGS. 22A-22D indicate that bit imbalance forces during transition drilling such as shown in FIG. 7 may be substantially reduced or eliminated (e.g., balanced). The cutter numbers listed in FIGS. 22E-22J correspond with the sequence in which the cutting elements are installed on rotary drill bit 100 starting from a location 1 proximate bit rotational axis 104.

Figure 22A:
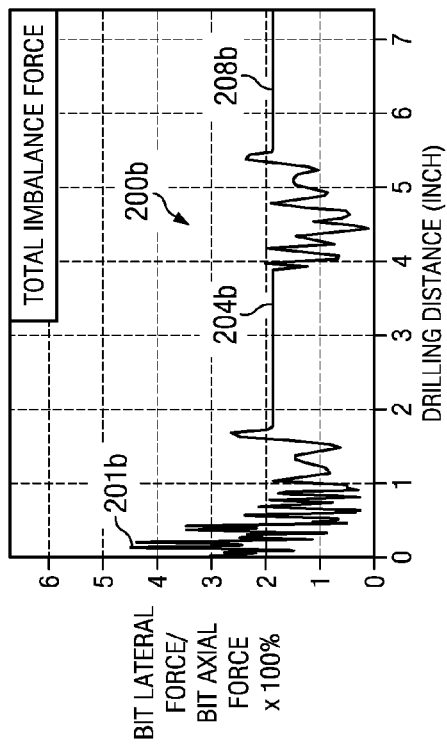
Figure 22C:
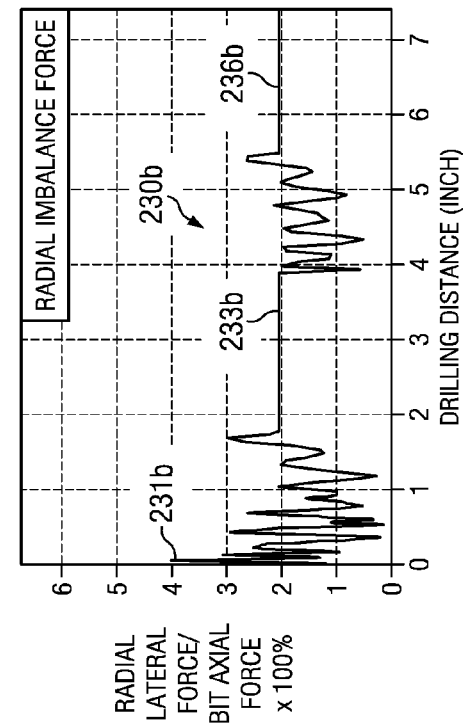
Figure 22E:
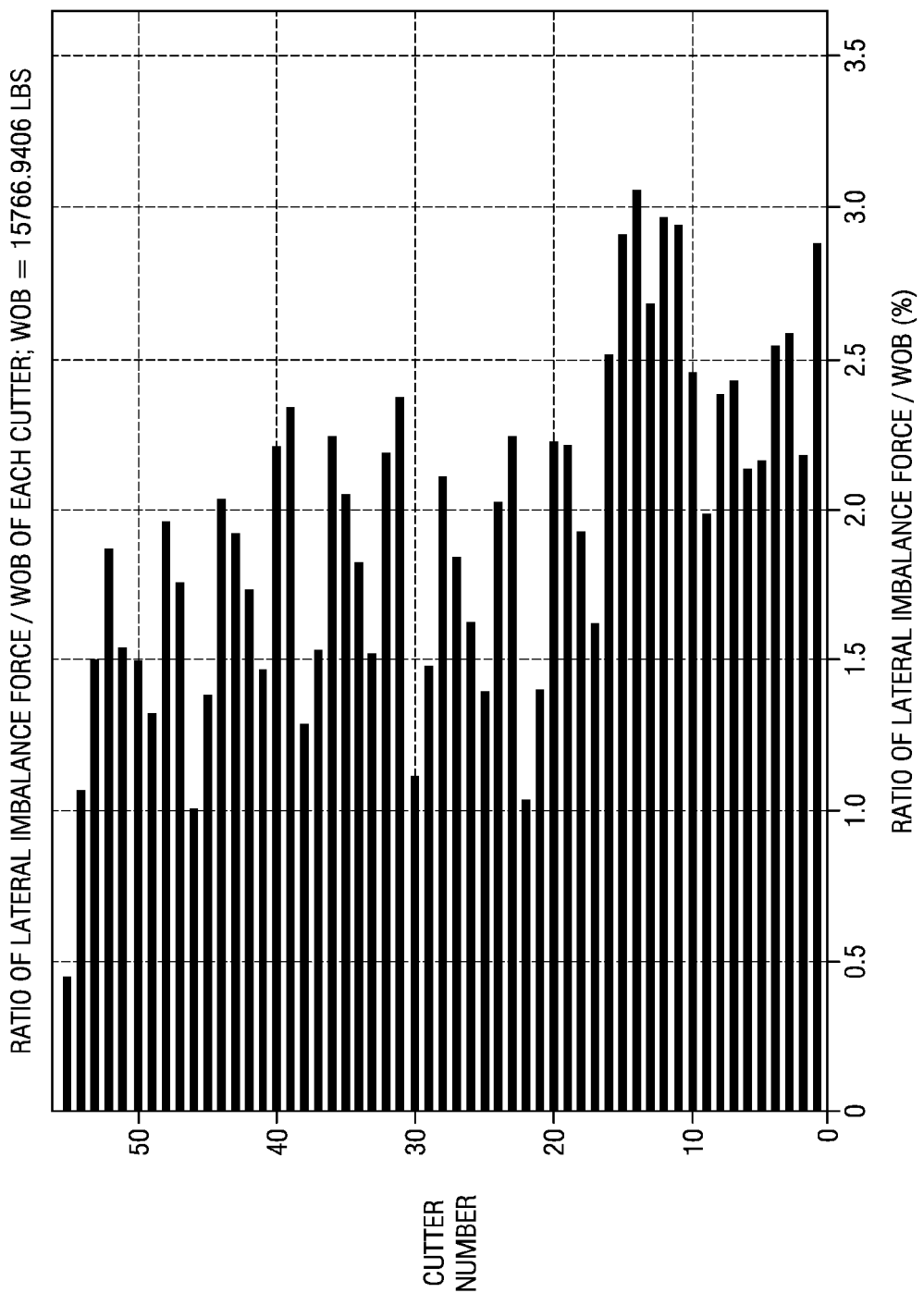
FIGS. 22E and 22F are graphs showing lateral forces and phase angles of each individual cutter of the drill bit shown in FIGS. 21A and 21B in accordance with teachings of the present disclosure.
Figure 22F:
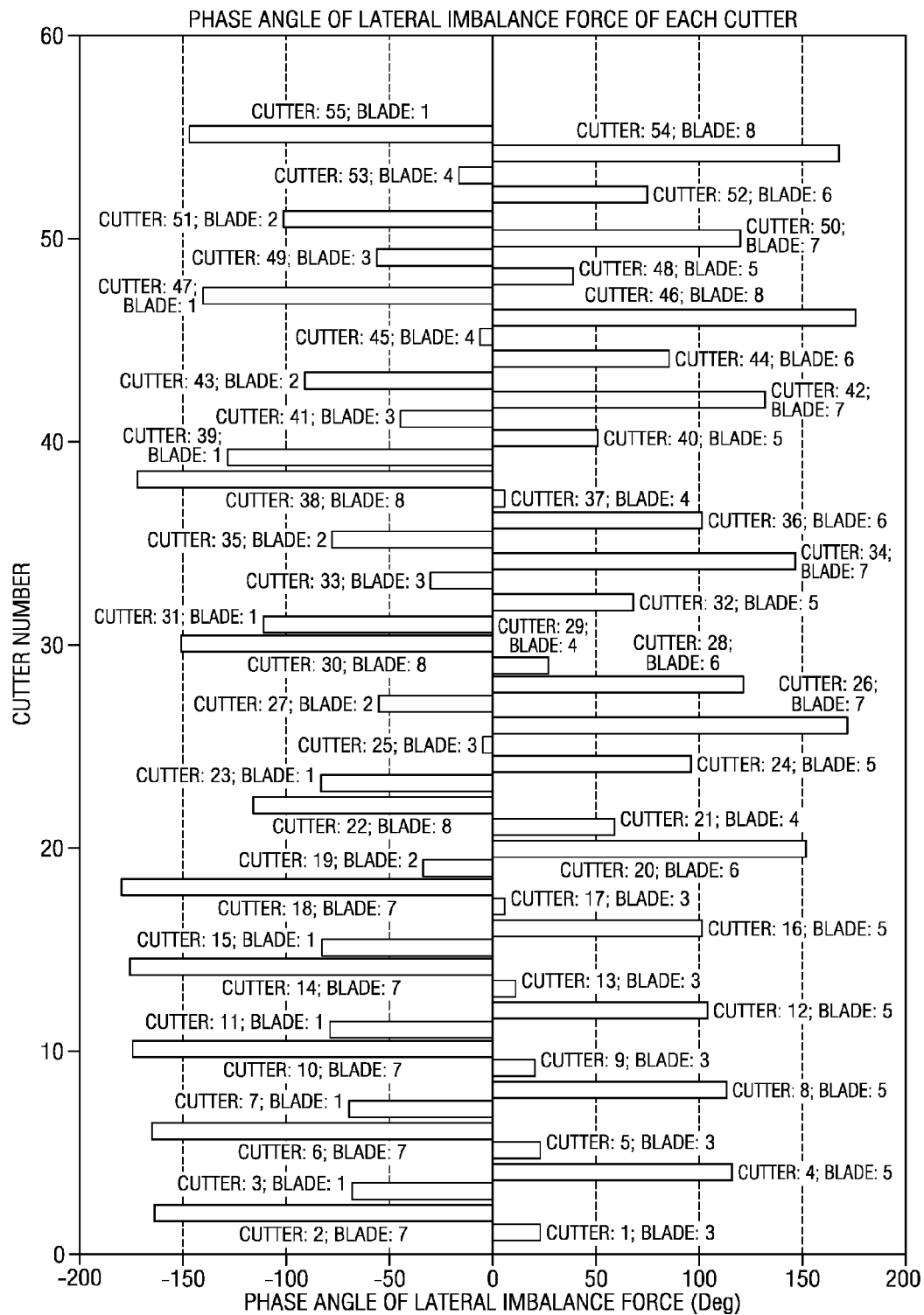

FIG. 22E shows the magnitude of the lateral force ratio of each individual cutter when all of the cutters drill into a uniform formation. The magnitude of the lateral force of each cutter is between approximately 1% and approximately 3% of the bit axial force. FIG. 22F shows the phase angle of the lateral force of each individual cutter.

Figure 22G:
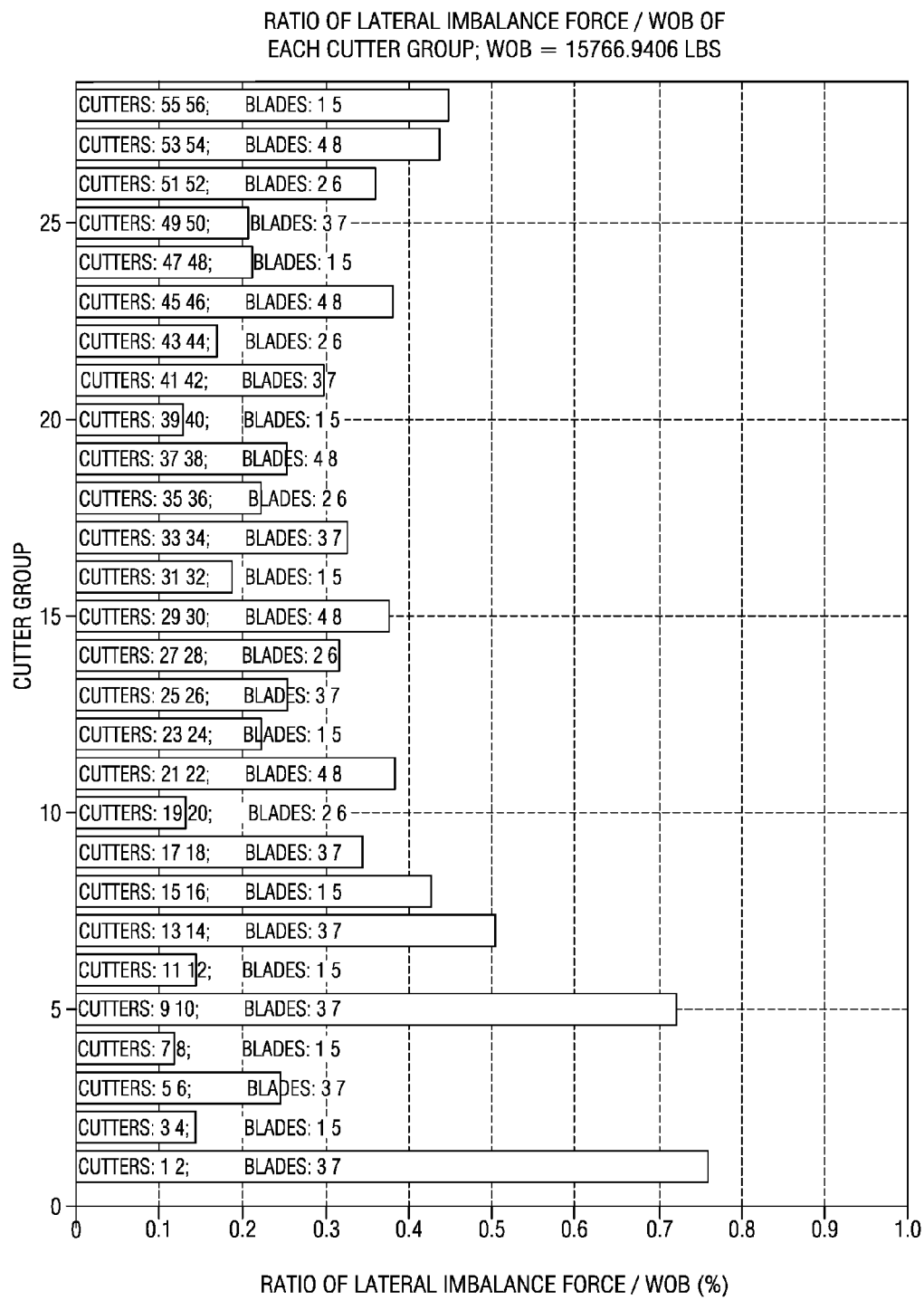
FIG. 22G is a graph showing level one force balancing of the drill bit shown in FIGS. 21A and 21B in accordance with teachings of the present disclosure.

FIG. 22G shows the magnitude of the lateral force ratio of each cutter group when all of the cutters drill into a uniform formation. The lateral force of each cutter group is less than that of an individual cutter in the same group. The magnitude of the lateral force for most cutter groups is between approximately 0.3% and approximately 0.77% of the bit axial force. Therefore, drill bit 100 is level one force balanced.

Figure 22H:
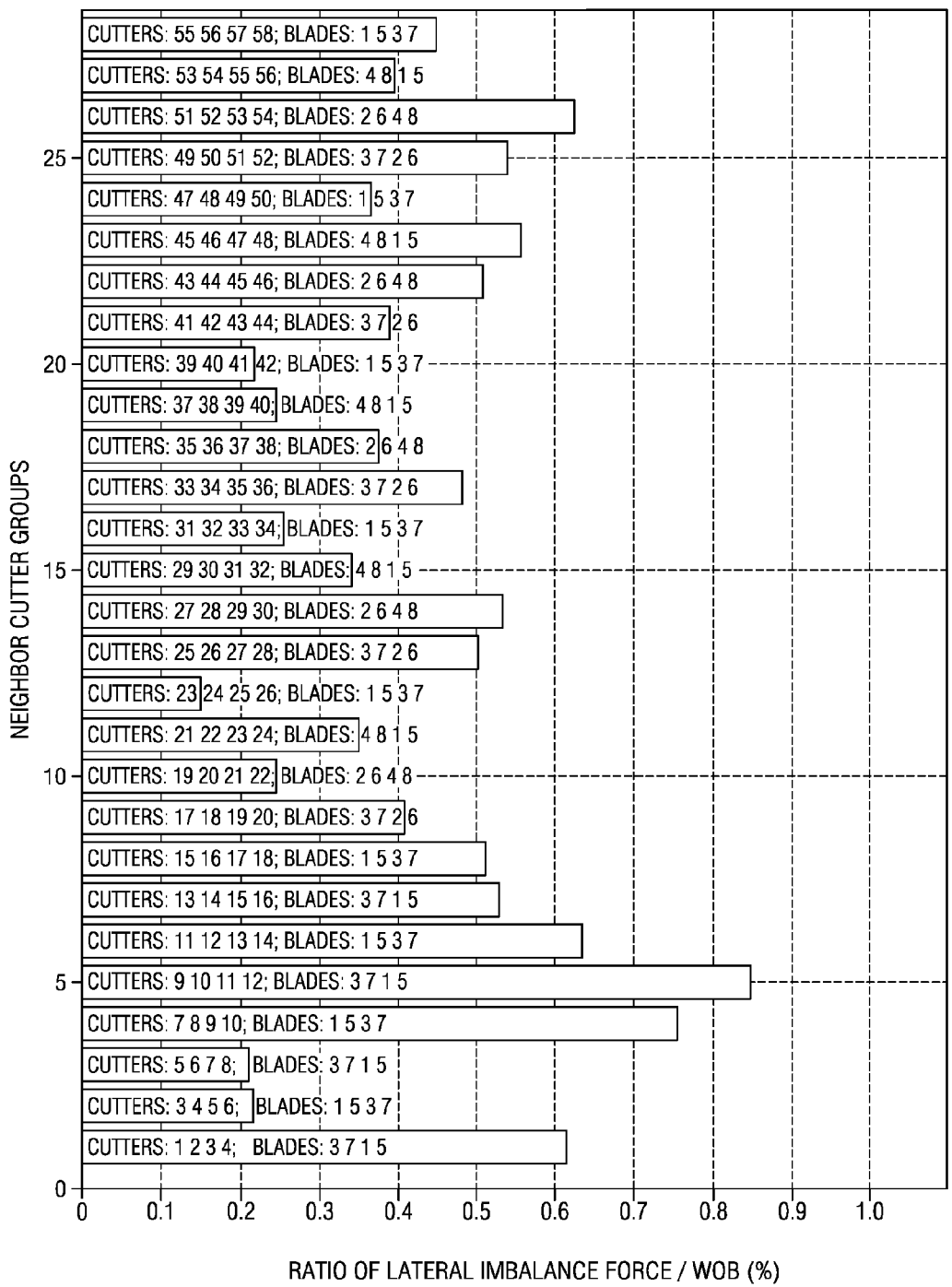
FIG. 22H is a graph showing level two force balancing of the drill bit shown in FIGS. 21A and 21B in accordance with teachings of the present disclosure.

FIG. 22H shows the magnitude of the lateral force ratio of any two consecutive neighbor groups of cutters when all of the cutters drill into a uniform formation. The lateral force of each of the two consecutive neighbor groups is less than that of an individual cutter in the same two neighbor groups. The magnitude of the lateral force for most two neighbor cutter groups is between approximately 0.45% and approximately 0.85% of the bit axial force. Therefore, drill bit 100 is level two force balanced.

Figure 22I:
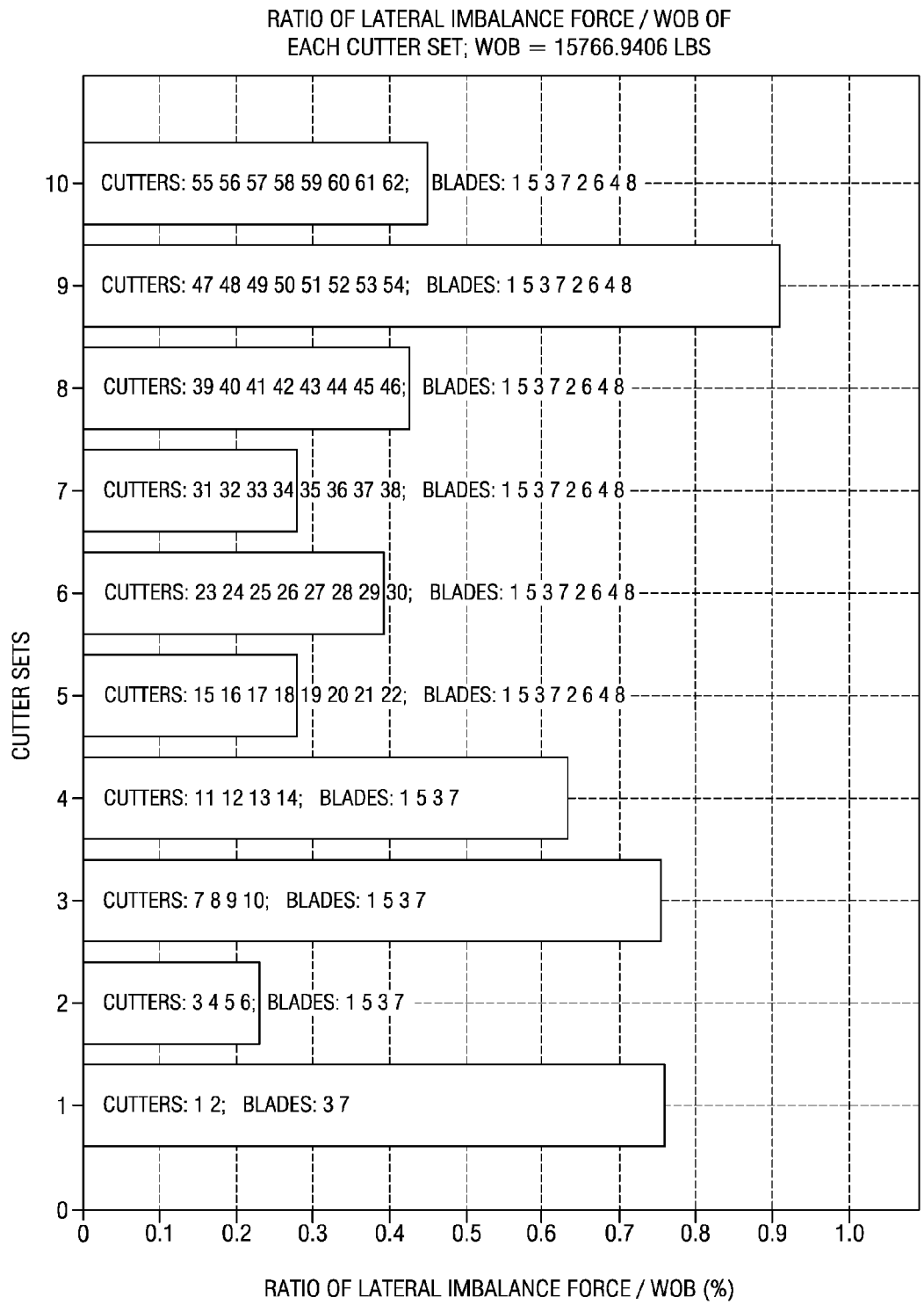
FIG. 22I is a graph showing level three force balancing of the drill bit shown in FIGS. 21A and 21B in accordance with teachings of the present disclosure.

FIG. 22I shows the magnitude of the lateral force ratio of each cutter set when all the cutters drill into a uniform formation. The lateral force of each cutter set is less than that of an individual cutter in the same set. The maximum magnitude of the lateral force for all cutter sets is less than approximately 0.91% of the bit axial force. Therefore, drill bit 100 is level three force balanced.

Figures 1, 22J:
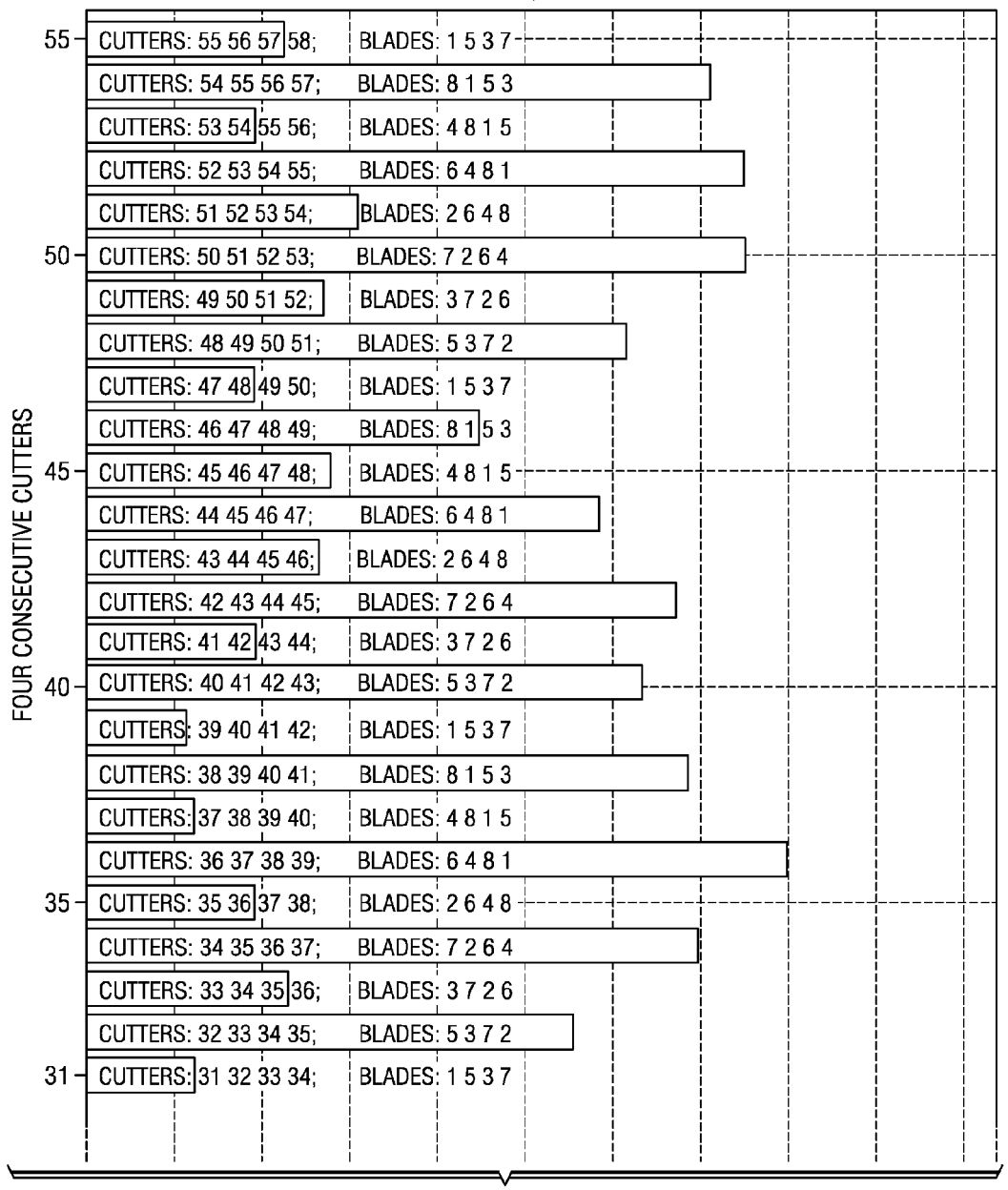
FIGS. 22J-1 and 22J-2 are graphs showing level four force balancing of the drill bit shown in FIGS. 21A and 21B in accordance with teachings of the present disclosure.
Figures 2, 22J:
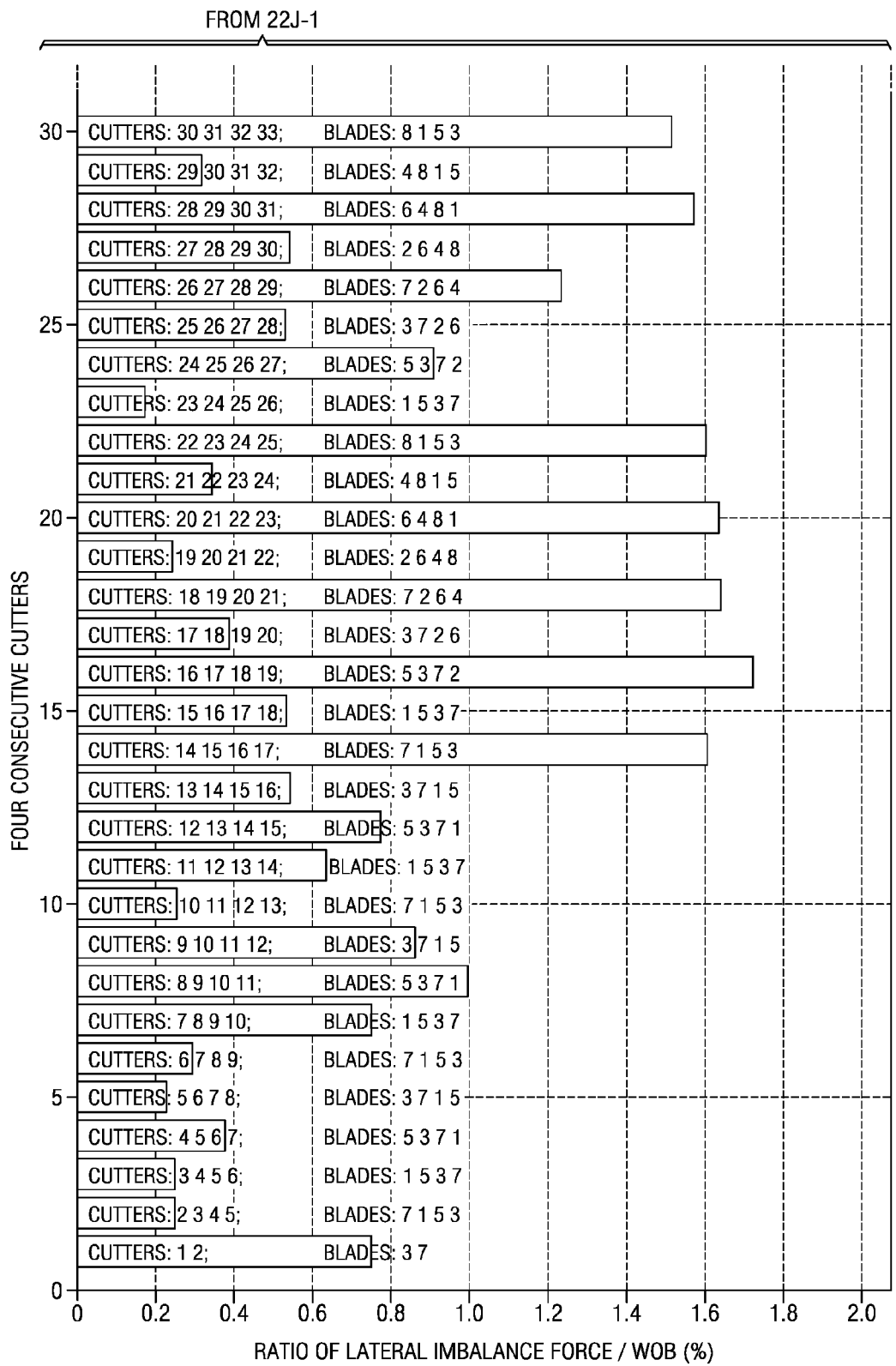

FIGS. 22J-1 and 22J-2 show the magnitude of the lateral force ratio of any four consecutive neighbor groups of cutters when all of the cutters drill into a uniform formation. The lateral force of each of the four consecutive neighbor cutters is less than the maximum lateral force of each individual cutter in the same four consecutive neighbor groups of cutters. The maximum magnitude of the lateral force for any four consecutive neighbor groups of cutters is less than approximately 1.72%, where most magnitudes of the lateral force are less than approximately 0.6% of the bit axial force. Therefore, drill bit 100 is level four force balanced.

Graph 200b of FIG. 22A shows the results of simulating drilling wellbores 30a and 30b as shown in FIG. 7 using fixed cutter rotary drill bit 100. The maximum bit lateral imbalance force represented by peak 201b is approximately 4.5%. The remaining peaks associated with graph 200b are generally less than 3% which corresponds favorably with generally flat segments 204b and 208b when cutting elements 1-72 are engaged with generally uniform downhole formation layers 41 and 42 respectively. In graph 220b of FIG. 22B, the maximum drag lateral imbalance force at peak 21b is approximately only 4% of total bit axial force. FIG. 22B also shows that drag lateral imbalance force during generally flat segments 213b and 216b is less than 2% of total bit axial force. The same comments apply with respect to graphs 230b and 240b respectively shown in FIGS. 22C and 22D. The peak radial imbalance force is approximately 4% OF the bit axial force at peak 231b. Transient axial bending moment at peak 241b is approximately 14%.

FIGS. 22A-22D also show that when all cutters are engaged with a uniform formation, either formation layer (see sections 204b, 213b, 233b, 243b) or formation layer 42 (see sections 208b, 216b, 236b, 246b), the lateral imbalance force, the radial imbalance force, the drag imbalance force and the axial bending moment are all well balanced showing that drill bit 100 is level five force balanced. This type of "level five" force balancing is the same as traditional "one level" force balancing used in the design of prior downhole drill tools.

FIGS. 22A-22D also show that when all cutters are engaged with a non-uniform formation, from formation layer 41 to formation layer 42 where some of the cutting elements are in formation layer 42 and some of the cutting elements are in formation layer 41, the lateral imbalance force, the radial imbalance force, the drag imbalance force and the axial bending moment are all well balanced showing that drill bit 100 is level five force balanced. For example, between section 213b and section 216b of FIG. 22B, some of the cutting elements are in formation layer 42 and some of the cutting elements are in formation layer 41, the drag imbalance force of bit 100 is about 2.2% of the bit axial force. This type of "level five" force balancing is different from traditional "one level" force balancing used in the design of prior downhole drill tools.

For some applications, calculating the phase angle represented by arrows 188a and 188b in FIG. 21A of lateral imbalance forces acting on each cutting element may provide substantial benefits during multilevel force balancing. FIG. 22E indicates that the magnitude of lateral force acting on cutter 23 (nose cutter 1 in FIG. 21B) is equal to approximately 2.4% of total bit axial force. As previously noted, bit axial force may often be considered approximately equal to weight on bit (WOB). The value of bit axial force is approximately 15,767 pounds. Therefore, the lateral force acting on cutter 23 is approximately three hundred and forty five pounds (345 lbs). FIG. 22E shows that the magnitude of lateral force acting on cutter 24 (nose cutter 2 in FIG. 21A) is approximately 2.28% of total bit axial force or approximately 320 pounds. From FIG. 22F, the phase angle of lateral force represented by arrow 188b acting on cutting element 23 is approximately −83.5°. The phase angle of lateral force represented by arrow 188a acting on cutter 24 is approximately 5.1°. Resulting lateral imbalance force associated with cutters 23 and 24 may be calculated as follows:

$F23$ on $x$ axis=$F23$ times cos (−83.5°)=40

$F23$ on $y$ axis=$F23$ times sin (−83.5°)=351.7

$F24$ on $x$ axis=$F24$ times cos (95.1°)=−28.4

$F24$ on $y$ axis=$F24$ times sin (95.1°)=318.7

Resulting force or total imbalance force=square root of $(F23\text{-}x+F24\text{-}x)^2+(F23\text{-}y+F24\text{-}Y)^2$=35 lbs or 0.22% of WOB (15767 lbs).

A comparison of FIGS. 20G and 22J provides an even greater example of the improvement of lateral imbalance forces of greater reduction in the lateral imbalance forces associated with the four neighbor cutter groups on composite bit face profile 192 of rotary drill bit 90a as compared with the substantially reduced lateral imbalance forces associated with each four neighbor cutter group on composite bit profile 110 of rotary drill bit 100. The information shown in FIGS. 22F-22J further demonstrate the benefits of multilevel force balancing techniques to select or layout locations for installing cutting elements on a downhole drilling tool using multilevel force balancing techniques and selecting the first location for each cutting element proximate a nose point or nose axis of an associated composite cutting face profile.

Various cutter layout algorithms have been developed for the design of multilevel force balanced downhole drilling tools. One common feature of these algorithms is starting cutter layout from a nose point or near a nose point to provide cutters in an associated nose zone arranged pseudo-symmetrical about the nose point and most pre-defined force balanced cutter sets follow from the nose zone cutter layout. Pseudo-symmetrical cutter layout around a nose point or nose axis may significantly enhance bit lateral stability during transit formation drilling.

A multilevel force balanced downhole drilling tool may have at least one of the following four levels: (a) at cutter group level where imbalance forces associated with cutters in each cutter group are balanced or minimized; (b) at two neighbor groups of cutter level where imbalance forces associated with any two neighbor groups of cutters on composite bit face profile are balanced or minimized (level two force balanced); (c) at cutter set level where imbalance force associated with cutters in a cutter set are balanced or minimized; and (d) at all cutters level where imbalance forces associated with all cutters are balanced or minimized (level five force balanced).

For some downhole drilling tools an additional level of force balancing may exist (level four force balanced). For example, for a bit with 8 blades using pair cutter groups, imbalance forces associated with any four neighbor cutters may be balanced or minimized. Another example is a bit with 9 blades using three cutter groups, imbalance forces associated with any three neighbor cutters may be balanced or minimized. FIG. 26 lists level four force balanced cutter set for given number of blades. Downhole drilling tools with level four force balanced are expected to be more stable even if one or more cutters are damaged during drilling.

FIGS. 23A and 23B show examples of techniques or procedures which may be used to design fixed cutter rotary drill bits and other downhole drilling tools in accordance with teachings of the present disclosure to substantially reduce or eliminate undesired bit imbalance forces during non-uniform downhole drilling conditions. Method 700 may begin at step 702 by inputting into a general purpose computer or special purpose computer (not expressly shown) various characteristics of a downhole drilling tool such as rotary drill bits 90, 100, 100a and 100b, core bit 500 and/or reamer 600 and drilling conditions. Examples of such downhole drilling tool characteristics and drilling conditions are shown in Appendix A at the end of this Written Description.

At step 704 various design parameters concerning associated cutting structures may be inputted into the general purpose computer or special purpose computer. Examples of such drilling tool design parameters are shown in Appendix A.

At step 706 specific details concerning an associated bit face profile or cutting face profile may be determined including location of the nose point, starting radii of secondary blades from an associated rotational axis, location of major blades and angular position of major blades and secondary blades relative to each other, initial layout for installing cutting elements on exterior portions of associated blades based on the nose point of the composite bit face profile or composite cutting face profile.

At step 708 select blade group algorithm as shown in FIGS. 25A, 25B and 26. Cutter sets for use in multilevel force balancing are chosen FIGS. 25A, 25B and 26 along with defining blade order for selecting locations to installing outer cutters and inner cutters relative to an associated nose segment. At step 710 layout locations for inner cutters starting from the nose point based on initial composite cutting face profile and initial blade design. At step 712 select or layout outer cutters using predefined cutter groups beginning with group $K_0$ (the initial group). At step 714 layout additional cutter groups ($K_0$+1). At step 716 use appropriate cutting face overlapping rule for neighbor cutters within each cutter group and calculate position to install each cutter on the associated blade.

At step 718 determine if a cutter was previously installed on the blade. If yes, evaluate overlap between cutters being considered (cutter K) and the cutter previously installed on the blade. At step 720 compare cutter overlaps or gaps and determine if the overlap meets design criteria for the downhole drilling tool. If the answer is no, return to step 716. If the answer is yes, go to step 722.

At step 722 determine if the last cutter in each cutter group reaches an associate last gage cutter location on the associate gage pad. If the answer is yes, proceed to step 724. If the answer is no, return to step 714.

At step 724 layout the inner cutters using predefined cutter groups beginning with group $K_1$. At step 726 continue laying out the inner cutters until the cutting elements in each inner cutter group have been disposed on exterior portions of the associated blades. Step 728 apply the overlap rule to each cutter in the inner group. Calculate each cutter position on the associated blade. If sufficient space is not available on the blade to install the desired cutter, go to the next blade in rotation relative to the associate bit rotational axis.

At step 730 determine if the previous cutter is already on the blade. If yes, calculate the gap between the cutter being added and the previous cutter. At step 732 determine if the gap between the cutter being added and the previous cutter on the blade meets the required design criteria. If the answer if no, return to step 728. If the answer is yes, proceed to step 734.

At step 734 determine if the edge of the last cutter in the cutter group being considered reaches the bit rotational axis. If the answer is no, return to step 726. If the answer is yes, proceed to step 736.

At step 736 prepare a 3D visualization of the cutters disposed on exterior portions of all blades. See for example FIGS. 21A and 21B. At step 738 conduct a drilling simulation to estimate imbalance forces created by each cutter group, each neighbor cutter groups, each cutter set and each three or four neighbor cutter group on the associated composite cutting face profile and all cutters. Imbalance forces may be evaluated as a function of drilling distance. See FIGS. 22A-22J. Evaluate downhole drilling performance with other criteria such as wear curve and diamond curve. At step 740 determine if the downhole drilling tool meets desired design requirements. If the answer is no, return to step 704. If the answer is yes, stop and use the design data that was input in step 702, 704 and 706 to manufacture an associated downhole drilling tool.

Table 301 in FIGS. 25A and 25B lists selected cutter sets for fixed cutter rotary drill bits and other downhole drilling tools having between four blades and fifteen blades. Table 302 as shown in FIG. 26 lists the preferred level four forced balance cutter sets for downhole drilling tools with five blades to fifteen blades. For a downhole drilling tool with between five blades and fifteen blades there may be many satisfactory ways to lay out cutting elements or cutters on an associated bit face or cutting face in accordance with teachings of the present disclosure.

Force Balance Procedure

In most cases, downhole drilling tools designed using procedures such as shown in FIGS. 1D and 23A-23B will satisfy requirements for multilevel force balancing. However, if blade order is violated due to, for example, the start radii of secondary blades, then multilevel force balancing may be also violated. If this situation occurs, it may become necessary to modify the geometry and orientation of individual cutters or individual cutter groups. The following steps may be used:

(1) Evaluate imbalance forces contributed by each individual cutter and each cutter group, respectively;

(2) Identify which cutter or cutter group contributes most to bit imbalance forces;

(3) Modify back rake, or side rake, or cutter size of the cutter or cutters in the cutter group;

(4) Re-run drilling simulation to see if design requirements are met or not. If not, go back to step 1 and repeat the procedure.

If the above procedure could not balance the downhole drilling tool, then it may be necessary to re-run the computer cutter layout procedure of FIGS. 23A and 23B by changing some of the parameters used for cutter layout, such as start radii of secondary blades, cutter layout starting point, cutter overlap, cutter size, back rake and side rake.

Although the present disclosure and its advantages have been described in detail, it should be understood that various changes, substitutions and alternations can be made herein without departing from the spirit and scope of the disclosure as defined by the following claims.

APPENDIX A

| DOWNHOLE DRILLING TOOL CHARACTERISTICS DESIGN PARAMETERS | | | |
|---|---|---|---|
| bit face profile | cutting depth | cutting face profile | cutter phase angle |
| bit geometry | cutting structure | bit face geometry | gap between cutters |
| cutter diameter | cutter groups | cutting face geometry | cutter overlap ratio |
| cutter radial position | force balanced cutter groups | worn (dull) bit data | nose point |
| blade (length, number, spiral, width) | neighbor cutters | cutter length | start radii of secondary blades |
| bottom hole assembly | neighbor cutter groups | cutter type | bit size |
| cutter (type, size, number) | level three force balanced | cutter length | hydraulic flow areas |
| cutter density | level four force balances | back rake angle | hydraulic flow rate |
| cutter location (cone, nose, shoulder, gage pad) | cutter sets | side rake angle | |
| cutter orientation (back rake, side rake) | force balanced cutter sets | IADC Bit Model | |
| cutting face surface area | blade groups | impact arrestor (type, .size, number) | |

| DRILLING CONDITIONS | | | |
|---|---|---|---|
| OPERATING PARAMETERS | | | |
| axial penetration rate | weight on bit (WOB) | torque on bit (TOB) | tilt rate |
| rate of penetration (ROP) | revolutions per minute (RPM) | lateral or side penetration rate | |
| rotational speed (ROM) | straight hole drilling | | |

| DRILLING CONDITIONS | | | |
|---|---|---|---|
| WELLBORE PROPERTIES | | | |
| bottom hole configuration | inside diameter | straight hole | |
| FORMATION PROPERTIES | | | |
| compressive strength | formation strength | porosity | shale plasticity |
| down dip angle | inclination | rock pressure | up dip angle |
| layer thickness | lithology | rock strength | hard stringers |
| formation plasticity | number of layers | first layer second layer | |

EXAMPLE OF COMPUTER MODELS TO EVALUATE CUTTER FORCES AND DRILL BIT IMBALANCE FORCES

1. Glowka D.A., "Use of Single-Cutter Data in the Analysis of PDC Bit Designs: Part 1-Development of a PDC Cutting Force Model," SPE Journal of Petroleum Technology, 41(1969) pp. 797-649.

2. Behr S.M., Warren T.M., Sinor L.A., Brett, J.F", "3D PDC Bit Model Predicts Higher Cutter Loads", SPE Drilling & Completion, No. 4, Vol. 8, March 1993.

3. Clayton R., Chen S. and Lefort G., "New Bit Design, Cutter Technology Extend PDC Applications to Hard Bock Drilling", SPE/IADC 91640, Feb., 2005

4. Chen S., Arfele R., GLass K., "Modeling of the Effects of Cutting Structure, Impact Arrestor, and Gage Geometry on PDC Bit Steerability", paper AADE-07-NTCE-10 presented at 2007 AADE Technical Conference held in Houston, TX, Apr. 10-12, 2007.

5. Chen S., Collins G.J.. Thomas M.B., "Reexamination of PDC Bit Walk in Directional and Horizontal Wells", IADC/SPE 112641, March 2008.

What is claimed is:

1. A method of designing a downhole drilling tool, comprising:
 simulating drilling a wellbore using a downhole drilling tool including a rotational axis extending through a bit body and a plurality of cutting elements disposed on a plurality of blades on the bit body, the plurality of blades and the plurality of cutting elements cooperating with each other to form a cutting face profile including a plurality of neighbor cutting elements having groups of three or four neighbor cutting elements;
 evaluating imbalance forces acting on each group of three or four neighbor cutting elements on the cutting face profile; and
 determining locations for installing the plurality of cutting elements on the plurality of blades based on the imbalance forces such that each group of three or four neighbor cutting elements are level four force balanced with respect to each other.

2. The method of claim 1, further comprising numbering each of the plurality of neighbor cutting element in a cutting element set on the cutting face profile staring with a cutting element closest to the rotational axis as number one and a last cutting element located the greatest distance from the rotational axis as number (n), the cutting element set equal to a number of blades on the downhole drilling tool.

3. The method of claim 2, wherein evaluating the imbalance forces acting on each group of four neighbor cutting elements comprises:
    evaluating imbalance forces acting on a first group of cutting elements numbered (1, 2, 3, 4);
    evaluating imbalance forces acting on a second group of cutting elements numbered (2, 3, 4, 5); and
    continuing to evaluate imbalance forces acting on the consecutive groups of cutting elements until the last group (n−3, n−2, n−1, n) has been evaluated.

4. The method of claim 2, wherein evaluating the imbalance forces acting on each group of three neighbor cutting elements comprises:
    evaluating imbalance forces acting on a first group of cutting elements numbered (1, 2, 3);
    evaluating imbalance forces acting on a second group of cutting elements numbered (2, 3, 4); and
    continuing to evaluate imbalance forces acting on the consecutive groups of cutting elements until the last group (n−2, n−1, n) has been evaluated.

5. The method of claim 1, further comprising:
    determining a nose zone and an inner zone defined by respective portions of the plurality of blades; and
    sequentially selecting a location for each cutting element in the inner zone at decreasing radial distances from the rotational axis starting from adjacent to the nose zone and ending adjacent to the rotational axis.

6. The method of claim 1, further comprising:
    determining a nose zone and an outer zone defined by respective portions of the plurality of blades; and
    sequentially selecting a location for each cutting element in the outer zone at increasing radial distances from the rotational axis starting from adjacent to the nose zone and ending adjacent to a gage pad.

7. The method of claim 1, wherein:
    each group of four neighbor cutting elements on the cutting face profile includes a first cutting element, a second cutting element, a third cutting element and a fourth cutting element; and
    an angle of separation between the first and second cutting elements is approximately equal to an angle of separation between the third and fourth cutting elements.

8. The method of claim 1, wherein:
    each group of three neighbor cutting elements on the cutting face profile includes a first cutting element, a second cutting element and a third cutting element; and
    an angle of separation between each of the first, second and third cutting elements is approximately equal to 120 degrees.

9. The method of claim 1, wherein at least two of the plurality of neighbor cutting elements on the cutting face profile overlap each other by less than 100%.

10. The method of claim 1, wherein determining locations for installing the plurality of cutting elements on the plurality of blades comprises determining if a magnitude of the imbalance forces associated with each group of three or four neighbor cutting elements is less than a maximum imbalance force associated with each cutting element in the respective groups of three or four neighbor cutting elements.

11. The method of claim 1, further comprising selecting the locations for the plurality of cutting elements on the plurality of blades to limit transient imbalance forces during non-uniform downhole drilling conditions.

* * * * *